United States Patent
Finn et al.

(10) Patent No.: US 9,112,272 B2
(45) Date of Patent: Aug. 18, 2015

(54) ANTENNA MODULES FOR DUAL INTERFACE SMART CARDS, BOOSTER ANTENNA CONFIGURATIONS, AND METHODS

(71) Applicants: David Finn, Tourmakeady (IE); Jan Thomas Czornack, Apfeldorf (DE); Mustafa Lotya, Celbridge (IE); Theodor Fendt, Marktoberdorf (DE); Klaus Ummenhofer, Kaufbeuren (DE)

(72) Inventors: David Finn, Tourmakeady (IE); Jan Thomas Czornack, Apfeldorf (DE); Mustafa Lotya, Celbridge (IE); Theodor Fendt, Marktoberdorf (DE); Klaus Ummenhofer, Kaufbeuren (DE)

(73) Assignee: Feinics Amatech Teoranta, Lower Churchfield, Tourmakeady, Co. Mayo (IE)

( * ) Notice: Subject to any disclaimer, the term of this patent is extended or adjusted under 35 U.S.C. 154(b) by 0 days.

(21) Appl. No.: 14/078,527

(22) Filed: Nov. 13, 2013

(65) Prior Publication Data

US 2014/0104133 A1 Apr. 17, 2014

Related U.S. Application Data

(63) Continuation-in-part of application No. 14/020,884, filed on Sep. 8, 2013, now Pat. No. 9,033,250, and a (Continued)

(51) Int. Cl.
*H01Q 1/38* (2006.01)
*G06K 19/077* (2006.01)
(Continued)

(52) U.S. Cl.
CPC ............ *H01Q 1/38* (2013.01); *G06K 19/07769* (2013.01); *G06K 19/07794* (2013.01); *H01Q 1/2225* (2013.01); *H01Q 1/2283* (2013.01); *H01Q 7/00* (2013.01); *H05K 3/103* (2013.01);
(Continued)

(58) Field of Classification Search
CPC ..... H01Q 1/38; H01Q 1/2225; H01Q 1/2283; H01Q 7/00; G06K 19/07794; G06K 19/07769; H05K 2201/086; H05K 2201/1003; H05K 2201/10098; H05K 3/103; G05K 1/0239; H01F 38/14; H01L 2224/16225; H01L 2224/48091; H01L 2224/48228; H01L 2224/49109; H01L 2224/45144

See application file for complete search history.

(56) References Cited

U.S. PATENT DOCUMENTS 5,012,236 A 4/1991 Troyk et al.
5,084,699 A 1/1992 DeMichele (Continued)

FOREIGN PATENT DOCUMENTS

CA 2279176 7/1998
DE 39 35 364 8/1990

(Continued)

*Primary Examiner* — Kristy A Haupt
(74) *Attorney, Agent, or Firm* — Gerald E. Linden

(57) ABSTRACT

Winding a module antenna (MA) for an antenna module (AM) on a tubular support structure (SS) having have a lid structure (LD) or a planar tool (PT) disposed at its free end to constrain the windings. Alternatively, winding wire coils for module antennas (MA) on coil winding forms (CWF, FIG. 26) and transferring them to a module tape (MT). Double-sided and single-sided module tapes (MT) having vias and openings (h) are disclosed. Connection bridges (CBR) formed within, between or surrounding the contact pads (CP) are disclosed. Various configurations for components (CA, CC, EA) of booster antenna (BA) are disclosed. A coupler coil (CC) has an inner winding (iw) and an outer winding (ow). Techniques for embedding wire and for bonding wire are disclosed.

4 Claims, 48 Drawing Sheets winding core WC with a lid LD in the form of a ring

Related U.S. Application Data continuation-in-part of application No. 13/600,140, filed on Aug. 30, 2012, now Pat. No. 8,991,712, and a continuation-in-part of application No. 13/931,828, filed on Jun. 29, 2013, now Pat. No. 8,708,240, which is a continuation of application No. 13/205,600, filed on Aug. 8, 2011, now Pat. No. 8,474,726, application No. 14/078,527, which is a continuation-in-part of application No. 13/744,686, filed on Jan. 18, 2013, now abandoned, application No. 14/078,527, which is a continuation-in-part of application No. 13/730,811, filed on Dec. 28, 2012, which is a continuation-in-part of application No. 13/310,718, filed on Dec. 3, 2011, now Pat. No. 8,366,009, and a continuation-in-part of application No. 13/294,578, filed on Nov. 11, 2011, now abandoned, said application No. 14/078,527 is a continuation-in-part of application No. 14/061,864, filed on Oct. 24, 2013, now Pat. No. 9,027,227, which is a continuation of application No. 13/027,415, filed on Feb. 15, 2011, now Pat. No. 8,613,132.

(60) Provisional application No. 61/875,046, filed on Sep. 8, 2013, provisional application No. 61/868,089, filed on Aug. 21, 2013, provisional application No. 61/860,354, filed on Jul. 31, 2013, provisional application No. 61/841,286, filed on Jun. 29, 2013, provisional application No. 61/827,754, filed on May 28, 2013, provisional application No. 61/373,269, filed on Aug. 12, 2010, provisional application No. 61/384,219, filed on Sep. 17, 2010, provisional application No. 61/493,448, filed on Jun. 4, 2011, provisional application No. 61/493,611, filed on Jun. 6, 2011, provisional application No. 61/589,434, filed on Jan. 23, 2012, provisional application No. 61/619,951, filed on Apr. 4, 2012, provisional application No. 61/693,262, filed on Aug. 25, 2012, provisional application No. 61/521,741, filed on Aug. 9, 2011, provisional application No. 61/533,228, filed on Sep. 11, 2011, provisional application No. 61/536,153, filed on Sep. 19, 2011, provisional application No. 61/493,448, filed on Jun. 4, 2011, provisional application No. 61/493,611, filed on Jun. 6, 2011.

(51) Int. Cl.

| | | |
|---|---|---|
| *H01Q 1/22* | (2006.01) | |
| *H01Q 7/00* | (2006.01) | |
| *H05K 3/10* | (2006.01) | |
| *H01F 38/14* | (2006.01) | |
| *H05K 1/02* | (2006.01) | |

(52) U.S. Cl.
CPC ....... *H01F 38/14* (2013.01); *H01L 2224/16225* (2013.01); *H01L 2224/45144* (2013.01); *H01L 2224/48091* (2013.01); *H01L 2224/48227* (2013.01); *H01L 2224/48228* (2013.01); *H01L 2224/49109* (2013.01); *H05K 1/0239* (2013.01); *H05K 2201/086* (2013.01); *H05K 2201/1003* (2013.01); *H05K 2201/10098* (2013.01)

(56) References Cited

U.S. PATENT DOCUMENTS

| 5,261,615 | A | 11/1993 | Cuttelod |
|---|---|---|---|
| 5,270,717 | A | 12/1993 | Schuermann |
| 5,572,410 | A | 11/1996 | Gustafson |
| 5,773,812 | A | 6/1998 | Kreft |
| 5,955,723 | A | 9/1999 | Reiner |
| 6,008,993 | A | 12/1999 | Kreft |
| 6,095,423 | A | 8/2000 | Houdeau et al. |
| 6,142,381 | A | 11/2000 | Finn et al. |
| 6,190,942 | B1 | 2/2001 | Wilm et al. |
| 6,233,818 | B1 | 5/2001 | Finn et al. |
| 6,295,720 | B1 | 10/2001 | Finn et al. |
| 6,310,778 | B1 | 10/2001 | Finn et al. |
| 6,375,083 | B2 | 4/2002 | Fries |
| 6,378,774 | B1 | 4/2002 | Emori et al. |
| 6,406,935 | B2 | 6/2002 | Kayanakis et al. |
| 6,424,301 | B1 | 7/2002 | Johnson et al. |
| 6,698,089 | B2 | 3/2004 | Finn et al. |
| 6,719,206 | B1 | 4/2004 | Bashan et al. |
| 7,320,738 | B2 | 1/2008 | Radenne et al. |
| 7,928,918 | B2 | 4/2011 | Caruana et al. |
| 7,980,477 | B2 | 7/2011 | Finn |
| 8,100,337 | B2 | 1/2012 | Artigue et al. |
| 8,130,166 | B2 | 3/2012 | Ayala et al. |
| 8,261,997 | B2 | 9/2012 | Gebhart |
| 8,474,726 | B2 | 7/2013 | Finn |
| 8,789,762 | B2 * | 7/2014 | Finn et al. ............... 235/492 |
| 8,870,080 | B2 * | 10/2014 | Finn ........................ 235/492 |
| 2001/0011012 | A1 | 8/2001 | Hino et al. |
| 2002/0020903 | A1 | 2/2002 | Kreft et al. |
| 2002/0105232 | A1 | 8/2002 | Parrault |
| 2007/0171074 | A1 | 7/2007 | Camp et al. |
| 2008/0245879 | A1 | 10/2008 | Artigue |
| 2008/0246614 | A1 | 10/2008 | Paananen |
| 2008/0283615 | A1 | 11/2008 | Finn |
| 2008/0308641 | A1 | 12/2008 | Finn |
| 2008/0314990 | A1 | 12/2008 | Rietzler |
| 2009/0057414 | A1 | 3/2009 | Brunet et al. |
| 2009/0152362 | A1 | 6/2009 | Ayala et al. |
| 2009/0169776 | A1 | 7/2009 | Herslfow |
| 2010/0176205 | A1 | 7/2010 | Patrice |
| 2010/0283690 | A1 | 11/2010 | Artigue et al. |
| 2011/0155811 | A1 | 6/2011 | Rietzler |
| 2011/0163167 | A1 | 7/2011 | Artigue et al. |
| 2011/0189620 | A1 | 8/2011 | Herslow |
| 2012/0038445 | A1 | 2/2012 | Finn |
| 2012/0055013 | A1 | 3/2012 | Finn |
| 2012/0061473 | A1 | 3/2012 | Forster et al. |
| 2012/0064307 | A1 | 3/2012 | Forster et al. |
| 2012/0074233 | A1 | 3/2012 | Finn |
| 2013/0075477 | A1 | 3/2013 | Finn et al. |
| 2013/0146670 | A1 | 6/2013 | Grieshofer et al. |
| 2013/0146671 | A1 | 6/2013 | Grieshofer et al. |

FOREIGN PATENT DOCUMENTS

| DE | 196 32 115 | 12/1997 |
|---|---|---|
| DE | 43 11 493 | 4/2000 |
| DE | 69706577 | 9/2001 |
| DE | 102006024247 | 11/2007 |
| EP | 0782214 | 7/1997 |
| EP | 0 875 039 | 11/1998 |
| EP | 0 931 295 | 7/1999 |
| EP | 0 977 145 | 2/2000 |
| EP | 1031939 | 8/2000 |
| EP | 1 325 468 | 7/2003 |
| EP | 2 120 190 | 11/2009 |
| NL | 9100347 | 3/1992 |
| WO | WO 2006/125916 | 11/2006 |
| WO | WO 2007/025934 | 3/2007 |
| WO | WO 2007/026077 | 3/2007 |
| WO | WO 2013 034426 | 3/2013 |

* cited by examiner

Dual Interface (DI) Smart Card, and Readers

ISO 7816

Booster Antenna BA with Coupler Coil CC first antenna component    second antenna component cross-over    cross-over conventional coupler coil (CC) configuration coupler coil (CC) with inner and outer windings coupler coil (CC) with magnetic conductive patch BA with CC and EA EA reverse laid CC "around" AM CC reverse "around" CM CC "around" CM with loop CC reverse "around" CM with loop turns of wire embedded in Card Body CB

DS as WC for a MA

DS slotted to accommodate wire(s) extending inwardly single-flange WC for MA affix WC to MT ready for winding MA MA is wound on WC install CM in WC
wire-bonding glob-top interior of WC MM over CM and MA install AM in CB wire ends of MA
extend inward of WC wire ends of MA
extend outward from WC chip module with wire bonded IC chip module with flip chip on substrate (FCOS)

chip module with IC and etched antenna
(8 contact pads)

8-pad contact pattern 6-pad contact pattern etched antenna on separate layer antenna substrate AS joined to module substrate MT winding core WC with a lid LD in the form of a disc winding core WC with a lid LD in the form of a ring using a tool PT instead of a lid LD chip CM wire-bonded to module tape MT chip CM flip-chip mounted/connected to module tape MT

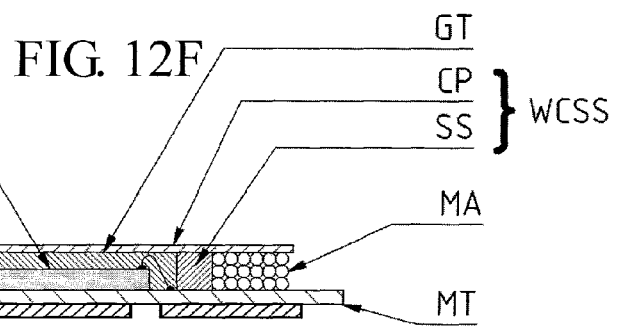
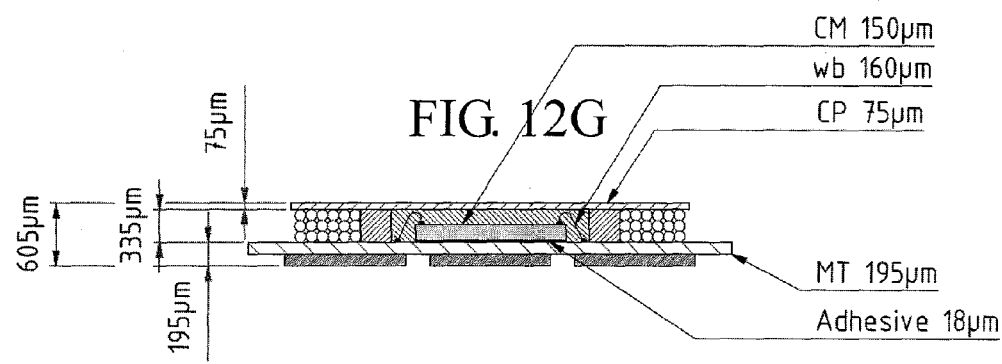
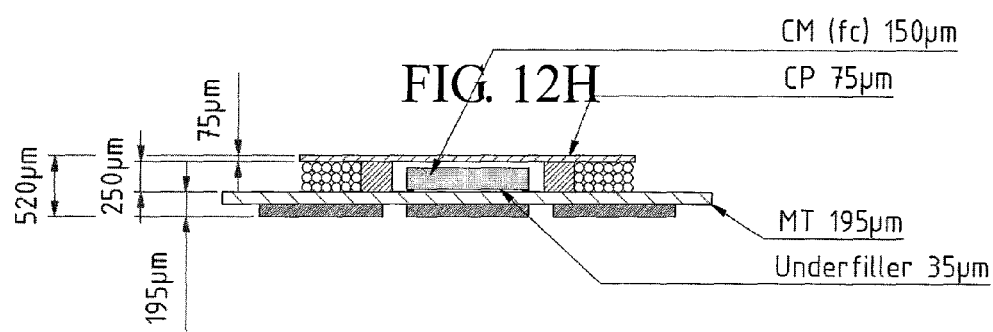

MA with one coil

MA with two coils two module antenna segments (MA1, MA2)

two antenna segments (OS, IS) connected as quasi-dipole etched antenna on separate layer antenna substrate AS joined to module substrate MT two antenna coils (MA1,MA2),
on two layers of module tape (MT1,MT2)

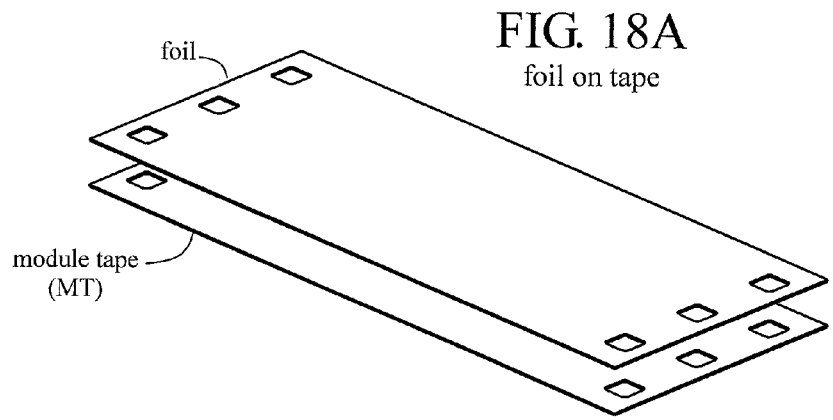
FIG. 18A
foil on tape
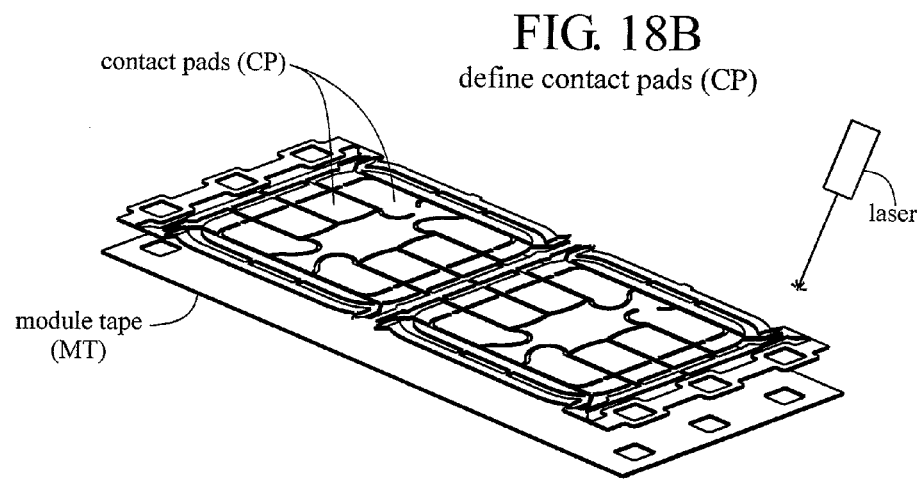
FIG. 18B
define contact pads (CP)
FIG. 18C
Perforated CPs
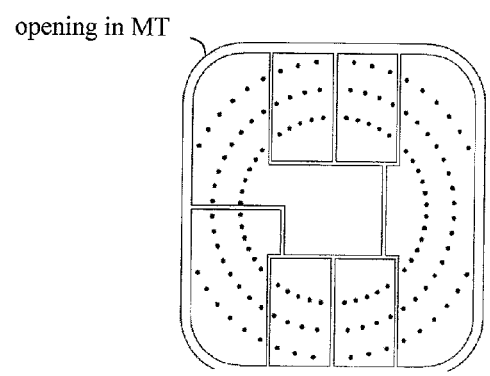

double-sided module tape MT with vias double-sided module tape MT with openings double-sided module tape MT with vias and openings CP layout/assignments AM — single-sided module tape MT with openings AM — single-sided module tape MT with vias Contact Pad Layout/Assignments

FIG. 3 of Infineon

FIG. 4B of Infineon

FIG. 4C of Infineon connection bridge (CBR)

connection bridges
in a contact pad (C6)

CBR extending external to and between contact pads insertion direction connection bridges / branding areas insertion direction 6-contact, inner connections insertion direction rotate the CM ferrite in card body Stackup of a Metallized Card Compensating Loop (CL), with gap Compensating Loop (CL), no gap Metal Foil (MF) in Card Body (CB)

MF with opening at location of CC / AM

Metal Foil (MF) in Card Body (CB)

MF with opening at location of CC / AM

SC → Ferrite in Antenna Module (AM)

DI Smart Card

Ferrite Layer in AM

DIF Module one row of AM sites on a 35mm tape a single AM site on a module tape MT remote coil winding

ANTENNA MODULES FOR DUAL INTERFACE SMART CARDS, BOOSTER ANTENNA CONFIGURATIONS, AND METHODS

CROSS-REFERENCE(S) TO RELATED APPLICATIONS

Priority is claimed from the following US provisional and non-provisional applications:

This is a nonprovisional of U.S. 61/875,046 filed 8 Sep. 2013

This is a nonprovisional of U.S. 61/868,089 filed 21 Aug. 2013

This is a nonprovisional of U.S. 61/860,354 filed 31 Jul. 2013

This is a nonprovisional of U.S. 61/841,286 filed 29 Jun. 2013

This is a nonprovisional of U.S. 61/827,754 filed 28 May 2013

This is a continuation-in-part of U.S. Ser. No. 14/020,884 filed 8 Sep. 2013

This is a continuation-in-part of U.S. Ser. No. 13/600,140 filed 30 Aug. 2012 (US 20130075477, 28 Mar. 2013)

This is a continuation-in-part of U.S. Ser. No. 13/931,828 filed 29 Jun. 2013) which is a continuation of U.S. Ser. No. 13/205,600 filed 8 Aug. 2011 (published US 20120038445, 16 Feb. 2012; issued U.S. Pat. No. 8,474,726, 12 Jul. 2013) which claims priority from . . .
  U.S. 61/373,269 filed 12 Aug. 2010
  U.S. 61/384,219 filed 17 Sep. 2010
  U.S. 61/493,448 filed 4 Jun. 2011
  U.S. 61/493,611 filed 6 Jun. 2011

This is a continuation-in-part of U.S. Ser. No. 13/744,686 filed 18 Jan. 2013 (published US 20130126622, 22 May 2013) which claims priority from . . .
  U.S. 61/589,434 filed 22 Jan. 2012
  U.S. 61/619,951 filed 4 Apr. 2012
  U.S. 61/693,262 filed 25 Aug. 2012

This is a continuation-in-part of U.S. Ser. No. 13/730,811 filed 28 Dec. 2012, which is a continuation-in-part of U.S. Ser. No. 13/310,718 filed 3 Dec. 2011 (published US 20120074233, 29 Mar. 2012; issued U.S. Pat. No. 8,366,009 5 Feb. 2013) which claims priority from . . .
  U.S. 61/521,741 filed 9 Aug. 2011
  U.S. 61/533,228 filed 11 Sep. 2011
  U.S. 61/536,153 filed 19 Sep. 2011
  U.S. Ser. No. 13/294,578 filed 11 Nov. 2011
  U.S. 61/493,448 filed 4 Jun. 2011
  U.S. 61/493,611 filed 6 Jun. 2011

This is a continuation-in-part of U.S. Ser. No. 14/061,864 filed 24 Oct. 2013 which is a continuation of U.S. Ser. No. 13/027,415 filed 15 Feb. 2011 (US 20120080527, 5 Apr. 2012).

TECHNICAL FIELD

The disclosure relates to "secure documents" such as electronic passports, electronic ID cards and smartcards (or smart cards, data carriers, chip cards, payment cards, and the like) having RFID (radio frequency identification) chips or chip modules (CM) capable of operating in a "contactless" mode (ISO 14443) including dual interface (DI) smartcards and secure documents which can also operate in contact mode (ISO 7816-2) and, more particularly, to antenna modules (AMs) for the secure documents, particularly smartcards. The disclosure also relates to how a module antenna (MA) coils for the antenna modules (AMs) may be wound. The disclosure further relates to techniques for embedding wire in a substrate which may, for example, be a module tape (MT) of an antenna module (AM). The disclosure also relates to controlling bonding of wires, such as ends of module antennas (MAs) to RFID chips (CMs).

BACKGROUND

Dual interface (DI, or DIF) smartcards (more generally, secure documents) may comprise an antenna module (AM) with a number of (typically 6 or 8) contact pads (CP) connected with an RFID chip (CM) via wire bonds or flip chip assembly, and a booster antenna (BA) in the card body (CB) consisting of a card body antenna (CA) and coupling coil (CC) which inductively couples with the module antenna (MA) of the antenna module (AM).

The antenna module "AM" may generally comprise a "DI" RFID chip (bare, unpackaged silicon die) or chip module (a die with leadframe, carrier or the like)—either of which may be referred to as "CM"—mounted to a module tape "MT". A module antenna MA may be disposed on the module tape MT for implementing a contactless interface. Contact pads "CP" may be disposed on the module tape MT for implementing the contact interface. The module tape MT may comprise a pattern of interconnects (conductive traces and pads) to which the chip CM and contact pads CP may be connected.

The module antenna MA may be connected, indirectly, via some of the interconnects to the chip CM, or may be directly connected to bond pads BP on the chip CM. The module antenna MA may comprise several turns of wire, such as 112 micron diameter insulated wire. Reference may be made to U.S. Pat. No. 6,378,774 (2002, Toppan), for example FIGS. 12A, B thereof.

SUMMARY

It is a general object of the invention to provide improvements in antenna modules (AMs), including but not limited to, how the module antenna (MA) is mounted on the antenna module (AM), improvements in the module antenna (MA) itself, techniques for winding the module antenna (MA), techniques for embedding wire in a substrate such as the module tape (MT) of an antenna module (AM), and techniques for bonding wire such as ends of the module antenna (MA) to terminals of an RFID chip (CM), and the like. These and other objects may be achieved individually or collectively by various embodiments of the invention disclosed herein.

A support structure (SS, DS, WC) may be mounted to or formed upon a module tape (MT), and a module antenna (MA) may be wound on the support structure. A planar element in the form of a flange (F) a lid structure (LD) or a cap (CP), or a tool (PT) may be disposed at the free end of a tubular body portion (B) of the support structure to constrain wire as it is wound on the support structure. The planar element may be in the form of a ring having an opening to allow encapsulant (GT) to be dispensed in the interior of the support structure. The support structure may additionally serve as a dam for containing encapsulant (GT) covering the chip (CM) and its connections. The module antenna (MA), winding core (WC) and chip (CM) may subsequently be overmolded with a mold mass (MM). Wire coils for the module antennas may be wound, using any suitable technique, such as flyer winding or radial winding.

According to some embodiments (examples) of the invention, generally, methods of winding wire coils for module antennas (MA) of antenna modules (AM) may include remotely winding the coils (on coil winding forms (CWF)), and transferring them to the module tape (MT).

Double-sided and single-sided module tapes (MT) having vias and openings are disclosed. Connection bridges (CBRs) formed within, between or surrounding the contact pads (CPs) are disclosed. Techniques for embedding wire and for connecting wire are also disclosed.

According to some embodiments (examples) of the invention, generally, contact pads (CP) and connection bridges (CBR) may be formed from metallization on a surface of a module tape (MT), which may be a single-sided tape. Holes through the module tape (MT) permit components on the other side of the module tape to be wire bonded to the underside of the contact pads and/or connection bridges.

According to some embodiments (examples) of the invention, generally, a smart card (SC) may comprise a metallized layer, a compensating loop, or ferrite in the card body (CB).

According to some embodiments (examples) of the invention, generally, booster antenna (BA) components such as card antenna (CA), coupler coil (CC) and extension antenna (EA) may be laid with senses (clockwise, counter clockwise) which are opposite from one another. When being laid, these components may be laid from an innermost turn to an outermost turn, or vice-versa.

According to some embodiments (examples) of the invention, generally, some techniques are disclosed for winding module antenna (MA) coils, such as winding on coil winding forms (CWF) and transferring the coils to the module tape (MT).

Other embodiments may be disclosed, and may be claimed. Some interim products are disclosed, and may be claimed.

The invention(s) described herein may relate to industrial and commercial industries, such RFID devices and applications, smartcards, electronic passports and the like.

Other objects, features and advantages of the invention(s) disclosed herein may become apparent in light of the following illustrations and descriptions thereof.

BRIEF DESCRIPTION OF THE DRAWINGS

Reference will be made in detail to embodiments of the disclosure, non-limiting examples of which may be illustrated in the accompanying drawing figures (FIGS). The figures may generally be in the form of diagrams. Some elements in the figures may be exaggerated or drawn not-to-scale, others may be omitted, for illustrative clarity. Some figures may be in the form of diagrams.

When terms such as "left" and "right", "top" and "bottom", "upper" and "lower", "inner" and "outer", or similar terms are used in the description, they may be used to guide the reader to orientations of elements in the figures, but should be understood not to limit the apparatus being described to any particular configuration or orientation, unless otherwise specified or evident from context.

Figure 1:
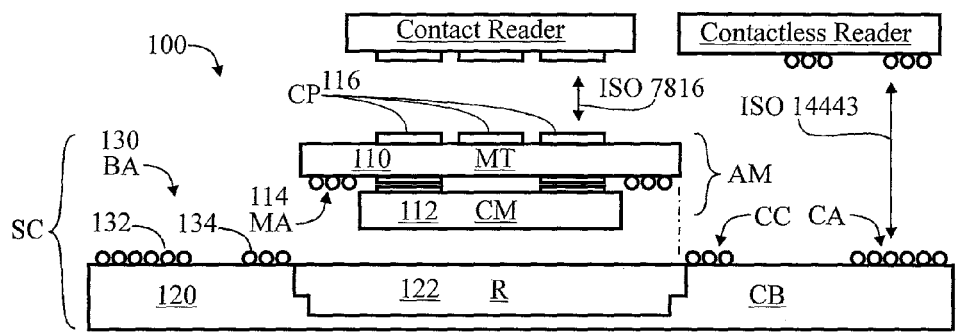

Different "versions" or iterations of elements may be referenced by reference numerals having the same numbers (###) followed by a different letter suffix (such as "A", "B", "C", or the like), in which case the similar elements may be inclusively referred to by the numeric portion (###) only of the reference numeral. Similar elements in different drawings may be referred to by similar numbers, differing in their most significant (typically hundreds) digit. Some elements may be referred to with letters (e.g., "BA", "CA", "CC", "EA" and the like), rather than (or in addition to) numerals (e.g., "12").

Any text (legends, notes, reference numerals and the like) appearing on the drawings are incorporated by reference herein.

Although the invention may be illustrated in the context of various exemplary embodiments, it should be understood that it is not intended to limit the invention to these particular embodiments, and individual features of various embodiments may be combined with one another.

FIG. 1 is a cross-section of a dual-interface (DI) smartcard and readers.

Figure 1A:
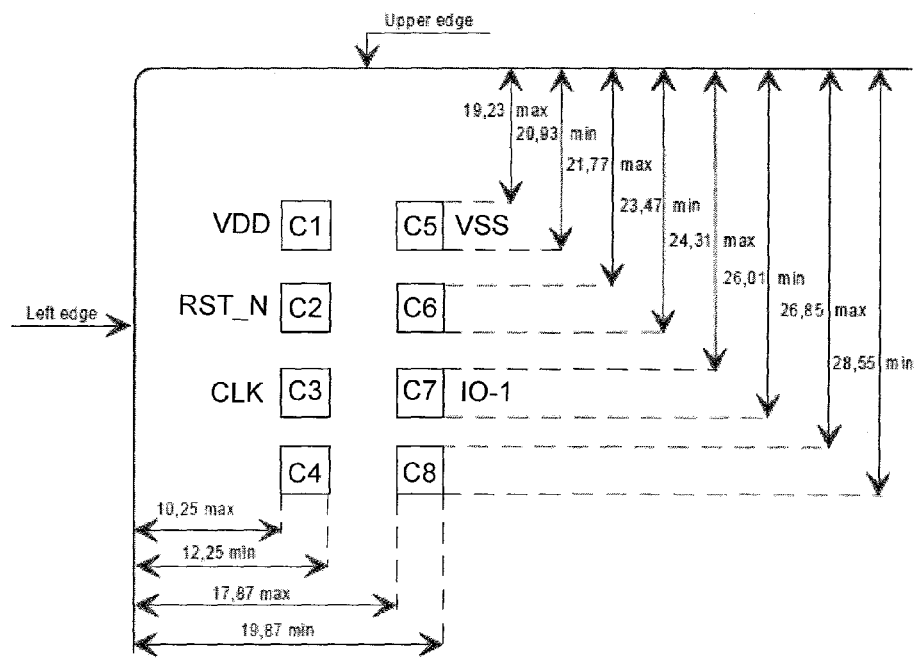

FIG. 1A is a diagram showing some characteristics of the ISO-7816 specification for contact pad layout.

Figure 1B:
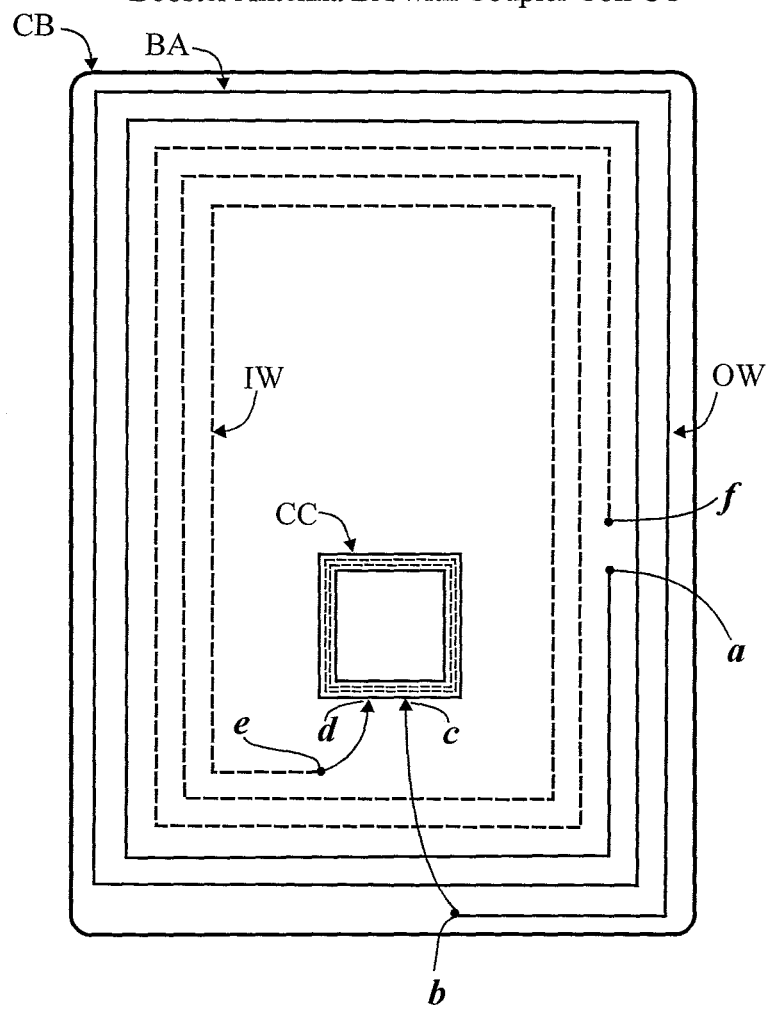

FIG. 1B is a diagram (plan view) of a configuration of a quasi-dipole booster antenna (BA), showing a coupler coil (CC) incorporated therewith.

Figure 1C:
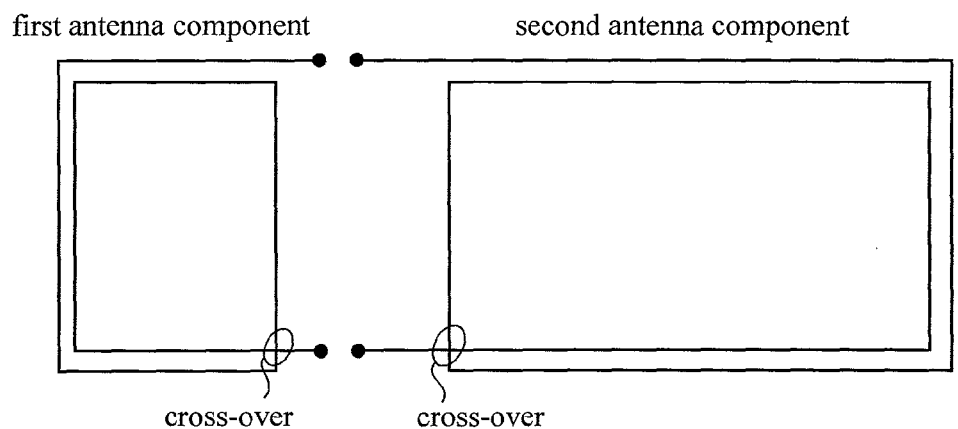

FIG. 1C is a diagram illustrating some antenna components, at least one of which is a "true" coil having a cross-over.

Figure 1D:
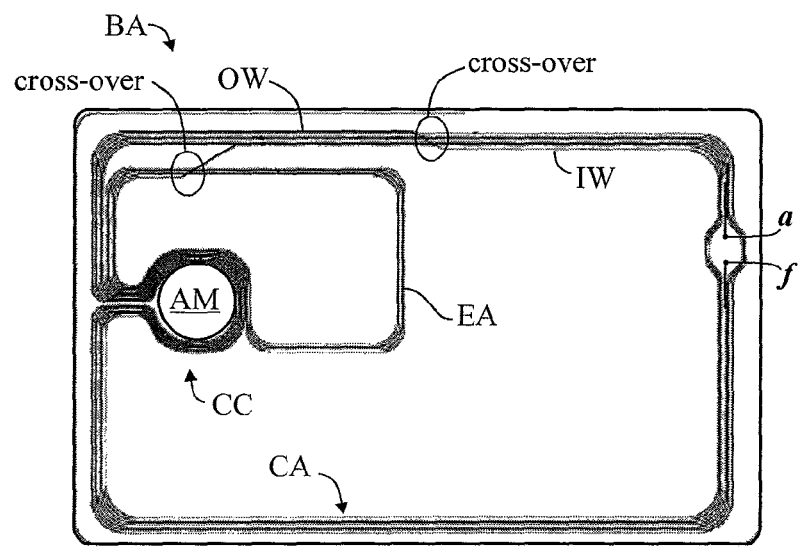

FIG. 1D is a diagram illustrating a booster antenna (BA) with card antenna CA, a coupler antenna (CC) and extension antenna (EA) components.

Figure 1E:
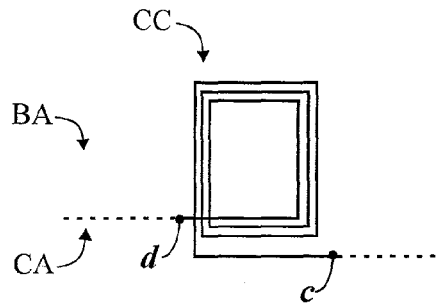
Figure 1F:
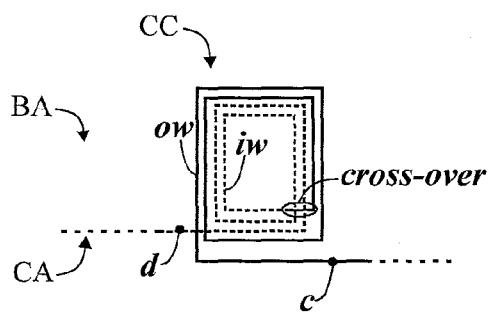
Figure 1G:
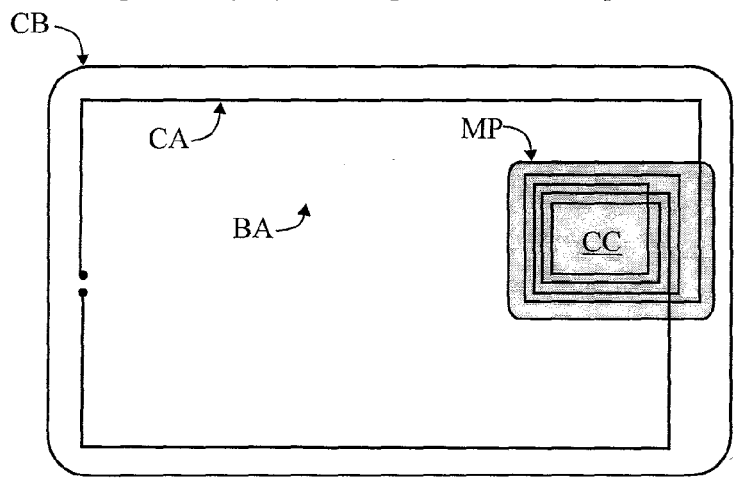

FIG. 1E, 1F, 1G are diagrams (plan views), each showing a configuration of a coupler coil (CC).

FIGS. 1H, 1I, 1J, 1K, 1L, 1M are diagrams (plan views), each showing a configuration of booster antenna (BA), and various arrangements of its components (CA, CC, EA).

Figure 2:
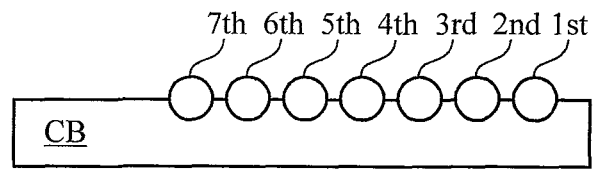

FIG. 2 is a cross-sectional illustration of wire coil comprising 7 windings embedded on a substrate of a card body (CB).

Figure 2A:
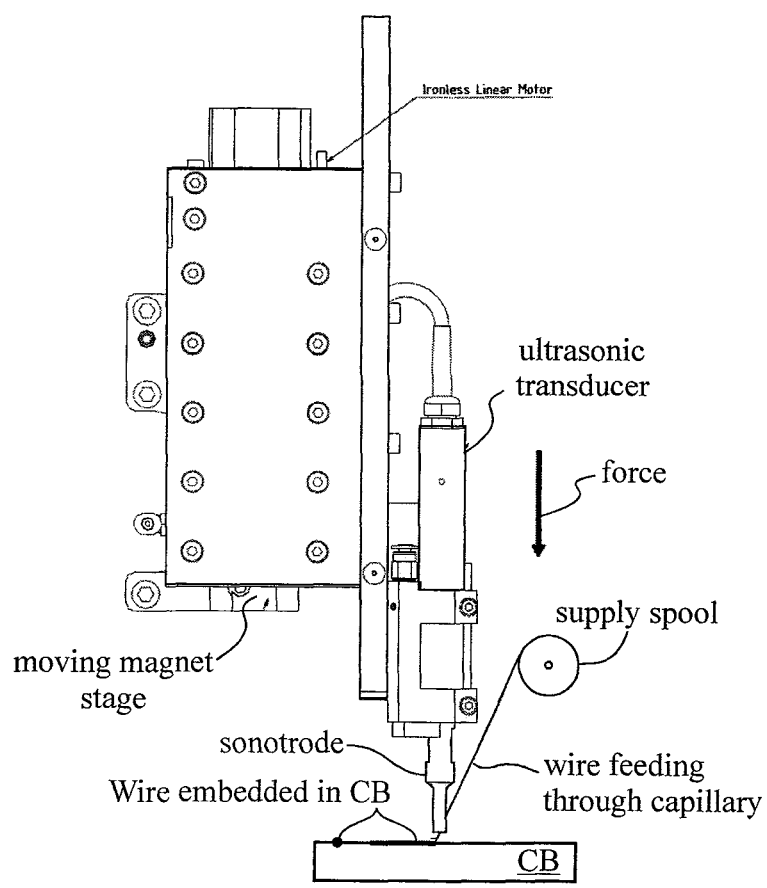

FIG. 2A is a diagram illustrating an embedding device based on a controlled sonotrode.

Figure 2B:
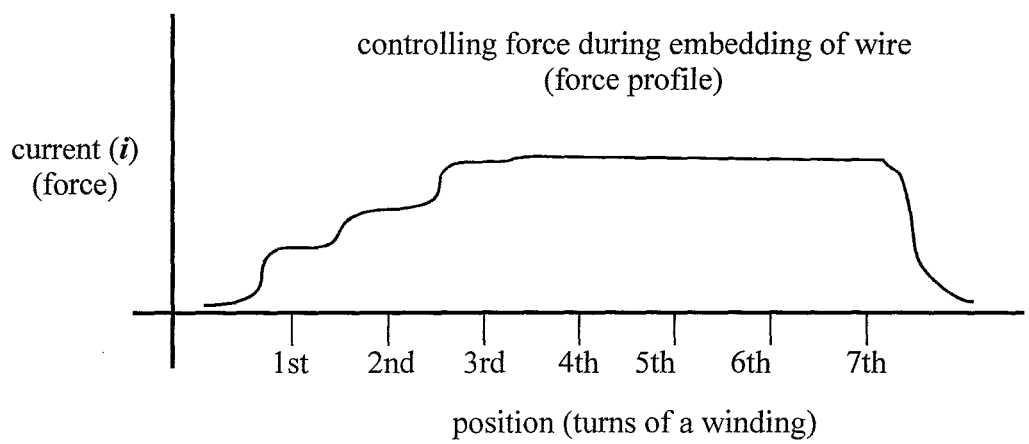

FIG. 2B is a graph illustrating an example of force profile for embedding a series of consecutive turns of a booster antenna (BA) into the substrate of a card body (CB).

Figure 2C:
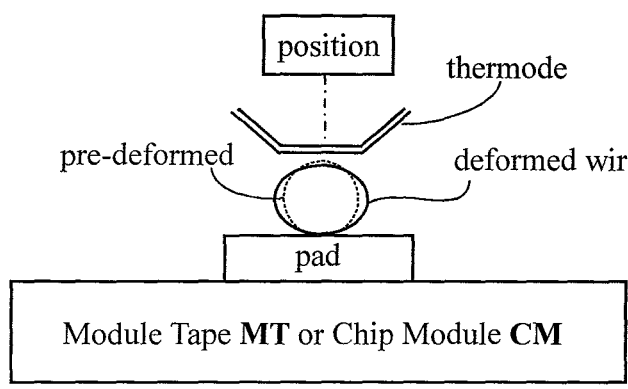

FIG. 2C is a diagram illustrating a technique for bonding a wire to a pad.

Figure 3:
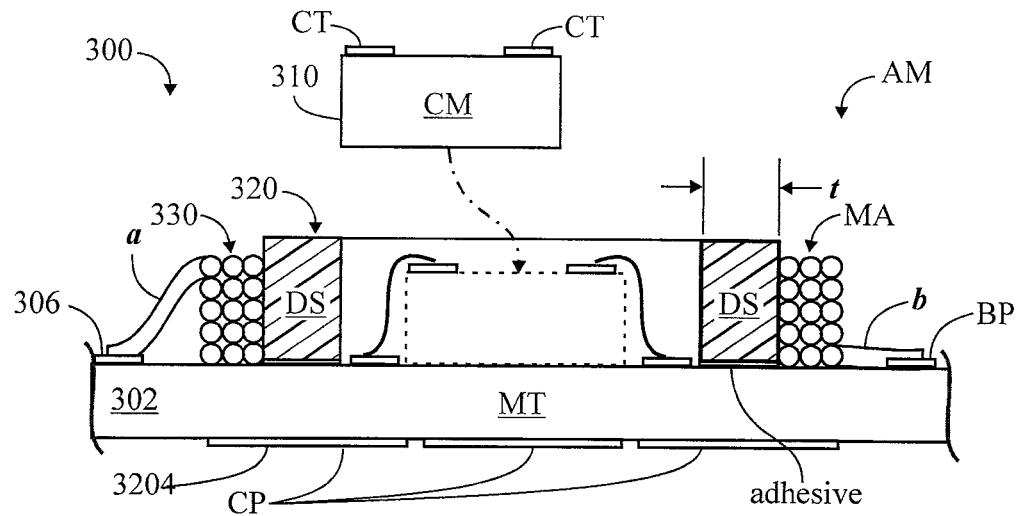

FIG. 3 is a cross-sectional view of an antenna module (AM).

Figure 3A:
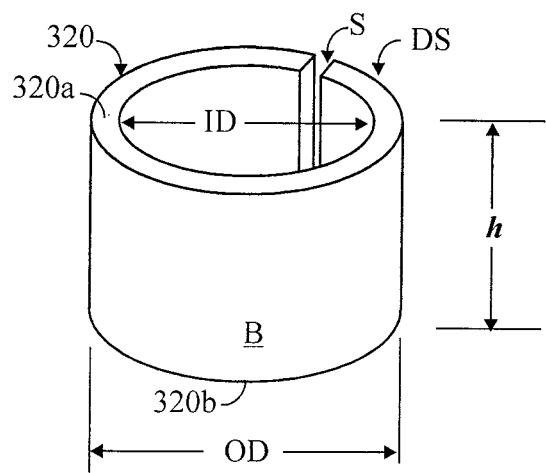

FIG. 3A is a perspective view of a dam structure (DS) component for the antenna module (AM) of FIG. 3.

Figure 4:
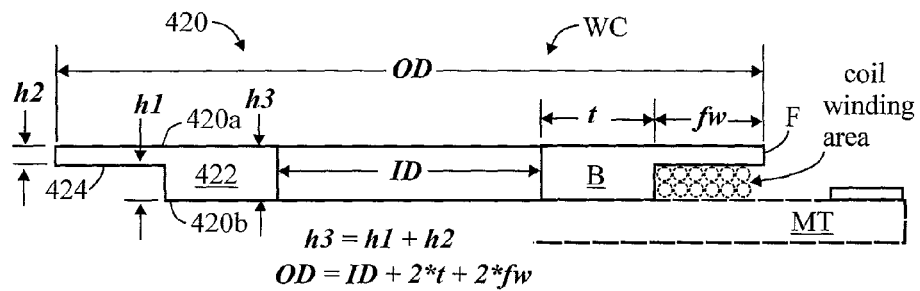

FIG. 4 is a cross-sectional view of a winding core (WC) upon which a module antenna may be wound.

FIGS. 4A-4F are cross-sectional views of a technique for forming antenna modules (AMs).

Figure 5:
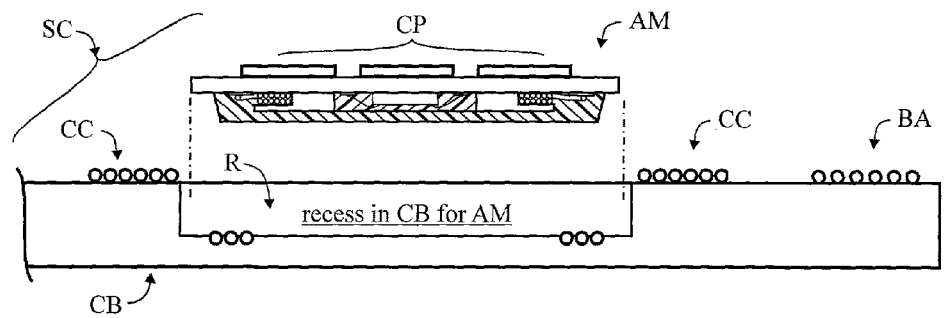

FIG. 5 is an exploded cross-sectional view showing an antenna module (AM) being installed in a card body (CB) of a smartcard (SC).

Figure 6A:
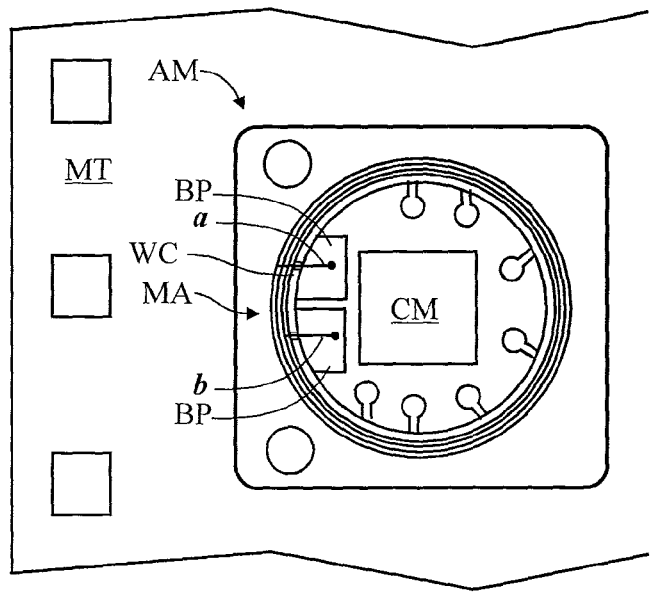
Figure 6B:
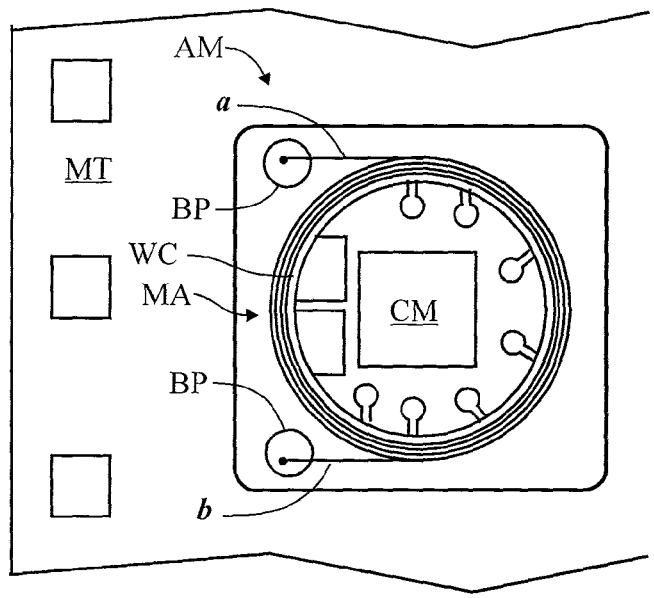

FIGS. 6A and 6B are plan views of the underside of a module tape (MT) for an antenna module (AM).

Figure 7A:
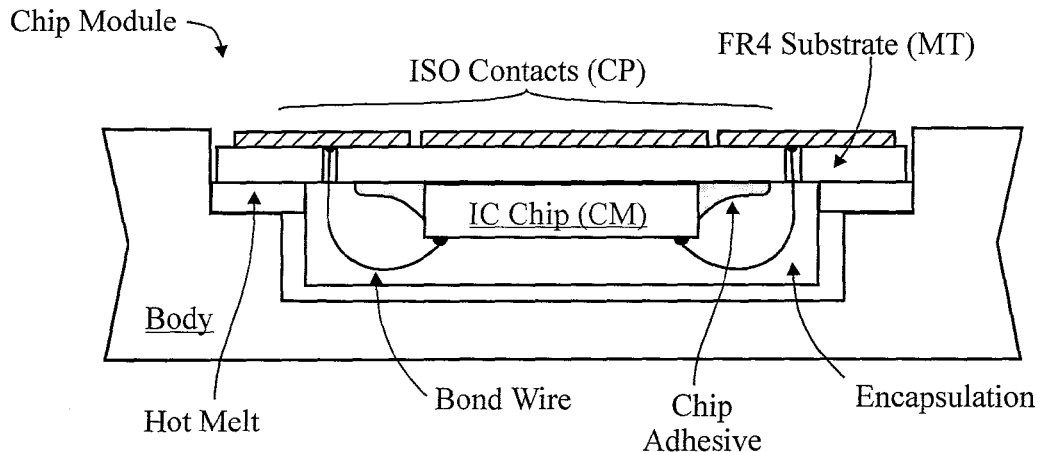

FIG. 7A is a side view diagram of a chip module with wire-bonded IC.

Figure 7B:
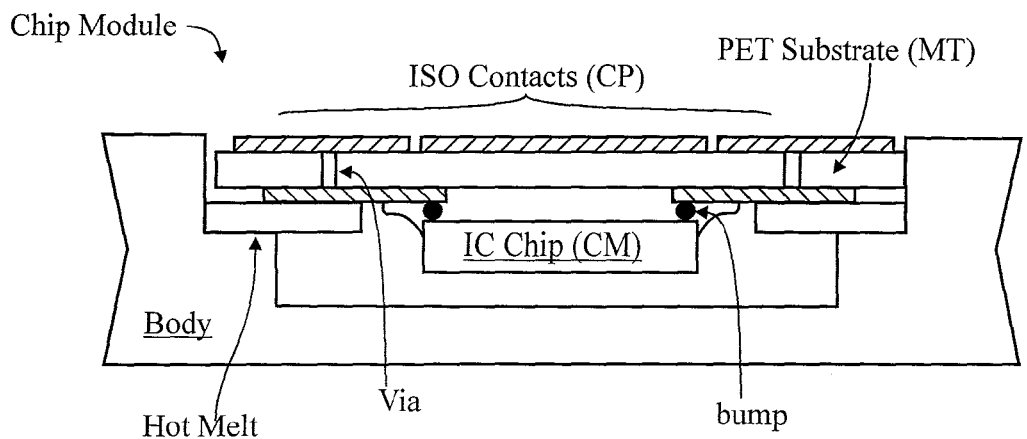

FIG. 7B is a side view diagram of a chip module with flip chip on substrate.

Figure 7C:
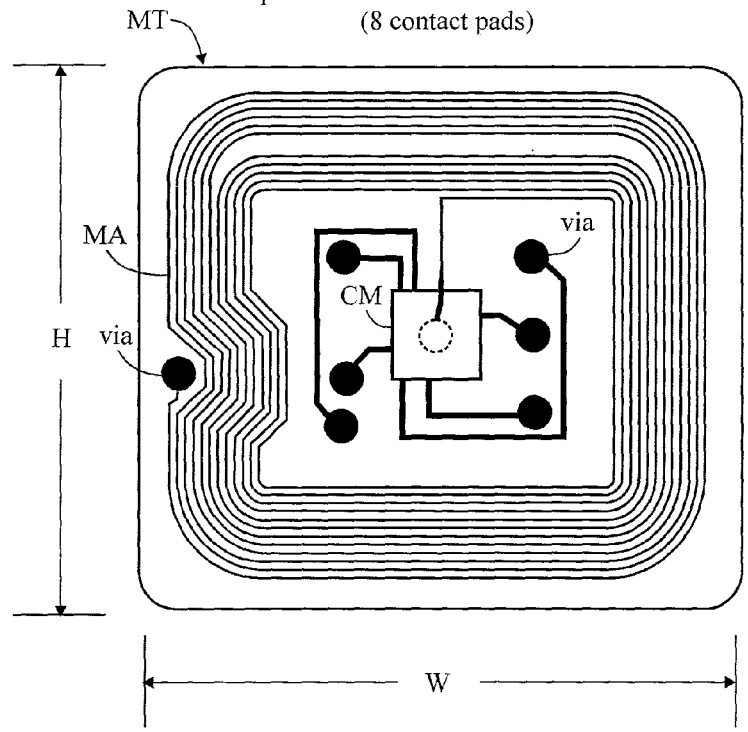

FIG. 7C is a plan view of a substrate with an antenna, such as for use with the chip module of FIG. 7B.

Figure 7D:
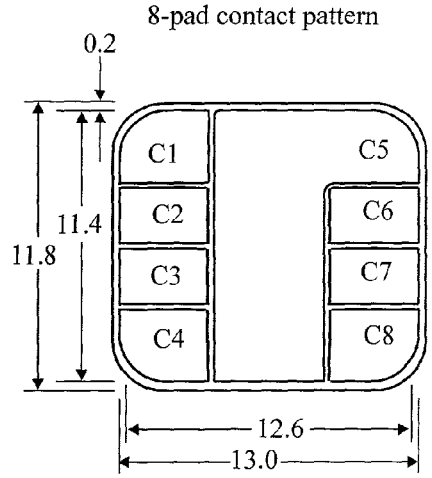

FIG. 7D is a diagram of an 8-pad pattern for ISO 7816 contacts.

Figure 7E:
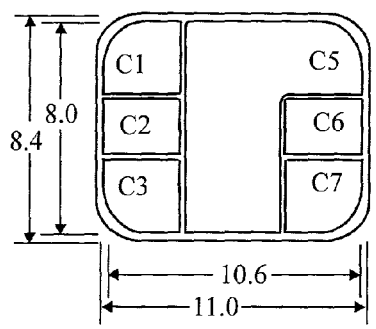

FIG. 7E is a diagram of a 6-pad pattern for ISO 7816 contacts.

Figure 8:
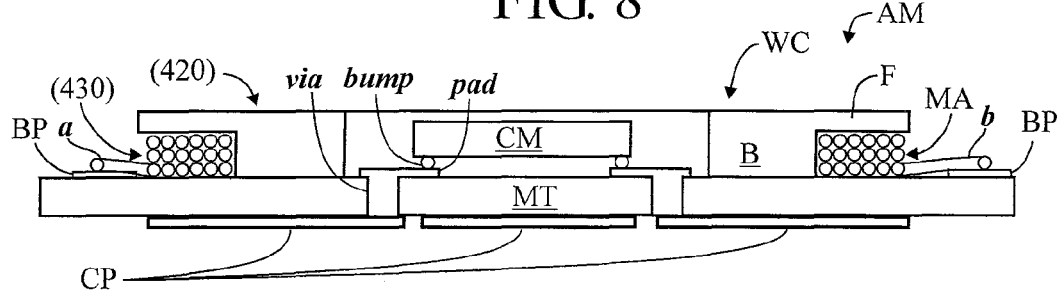

FIG. 8 is a cross-sectional view of a flip-chip antenna module (FCAM).

Figure 9:
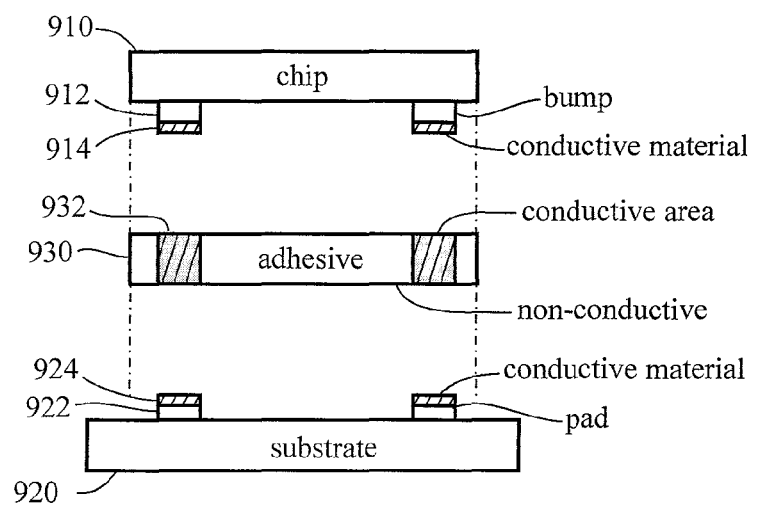

FIG. 9 is an exploded cross-sectional view of a technique for flip-chip mounting a chip to a substrate.

Figure 10:
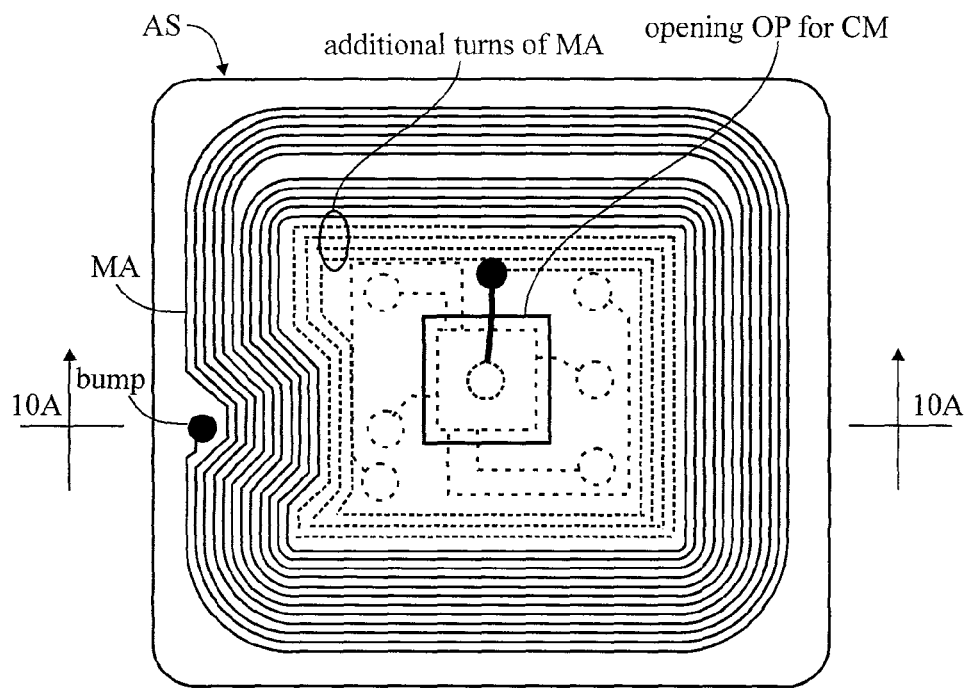
Figure 10A:
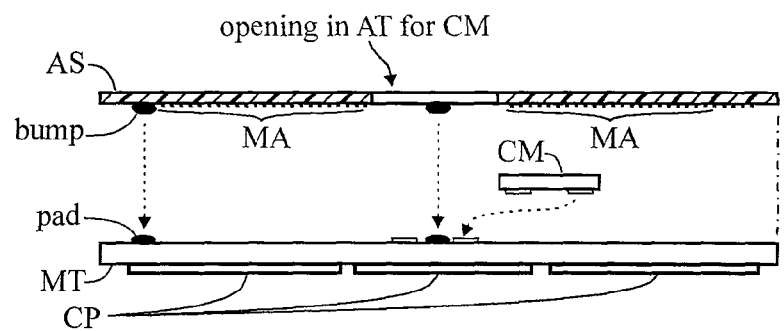

FIG. 10 is a plan view of an antenna substrate (AS), and FIG. 10A is a cross-sectional view taken on a line 10A-10A through FIG. 10.

Figure 11A:
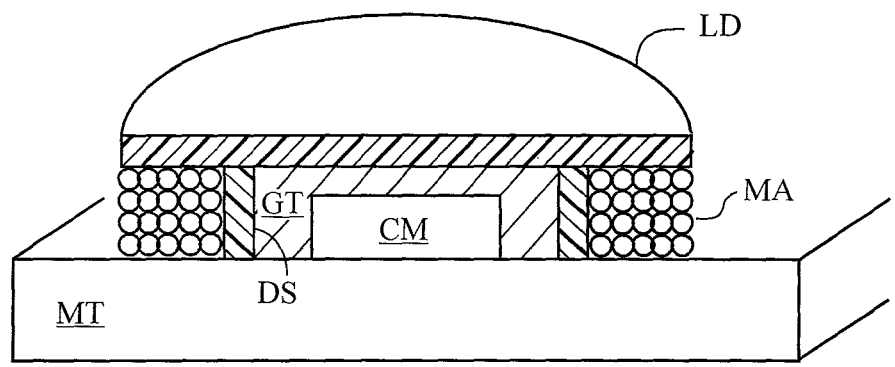

FIG. 11A is a view, partially in cross-section and partially in perspective, of an antenna module AM having a module antenna MA wound on a dam structure DS, with a lid (LD) in the form of a disc.

Figure 11B:
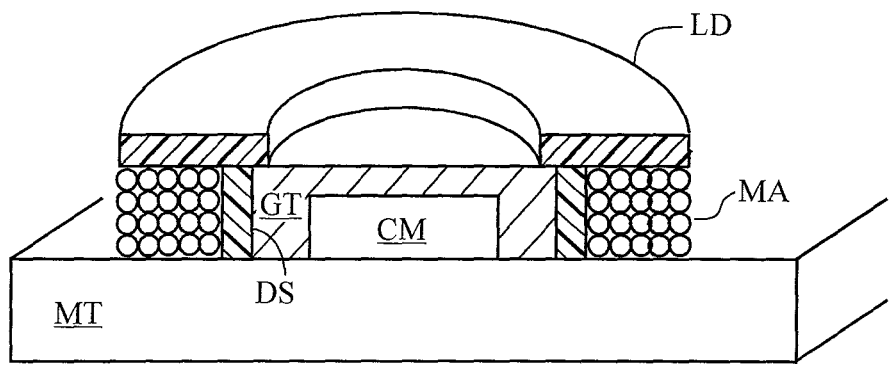

FIG. 11B is a cross-sectional view of an antenna module AM having a module antenna MA wound on a dam structure DS, with a lid (LD) in the form of a ring.

Figure 11C:
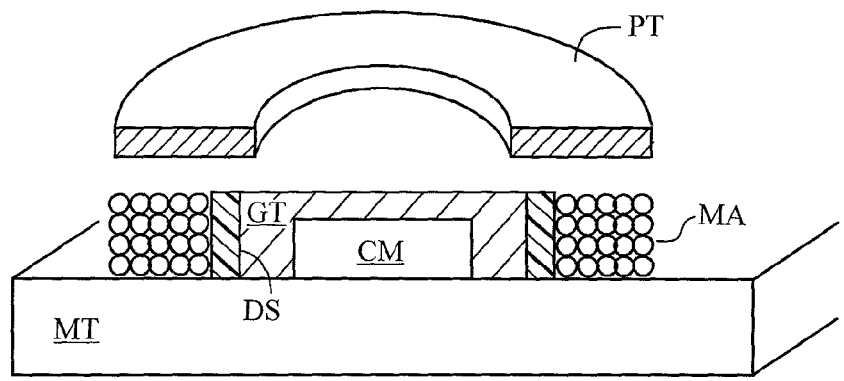

FIG. 11C is a cross-sectional view of an antenna module AM having a module antenna MA wound on a dam structure DS, with a tool (PT) for constraining the windings of the module antenna MA.

Figure 11D:
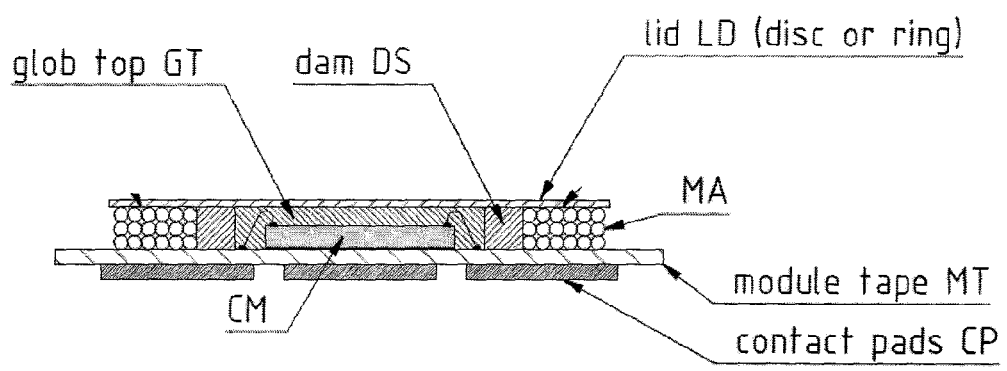

FIG. 11D is a cross-sectional view of an antenna module AM.

Figure 12A:
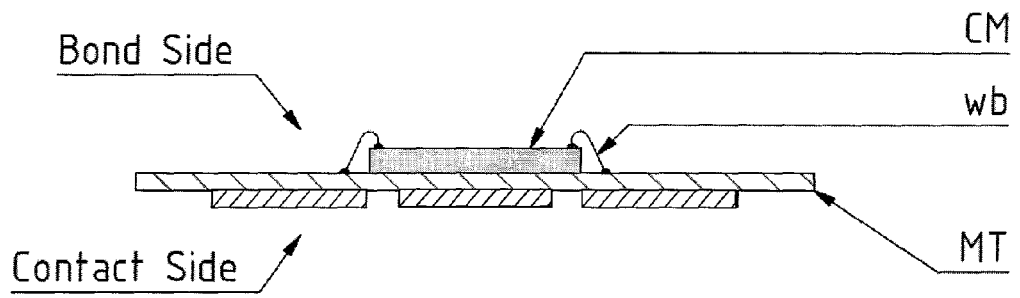

FIG. 12A is a side view diagram of a silicon die (CM) wire bonded (wb) to an epoxy glass tape (MT).

Figure 12B:
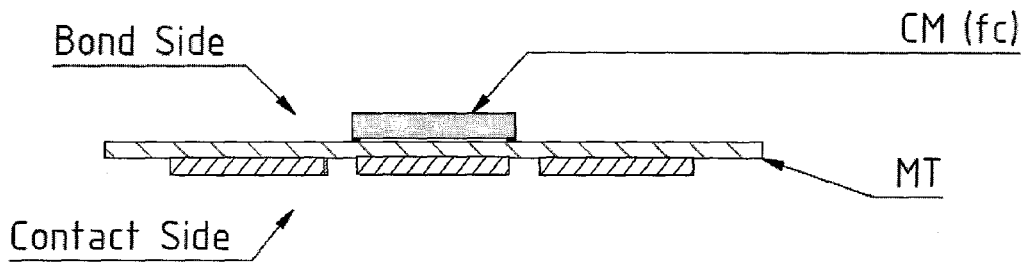

FIG. 12B is a side view diagram of a flip chip mounted (fc) to an epoxy glass tape (MT).

Figure 12C:
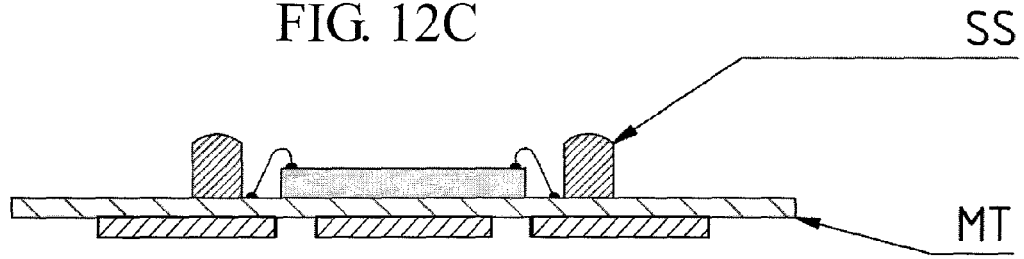

FIG. 12C is a side view diagram of a supporting structure (SS) being erected on an epoxy glass tape (MT) to form a dam and winding core.

Figure 12D:
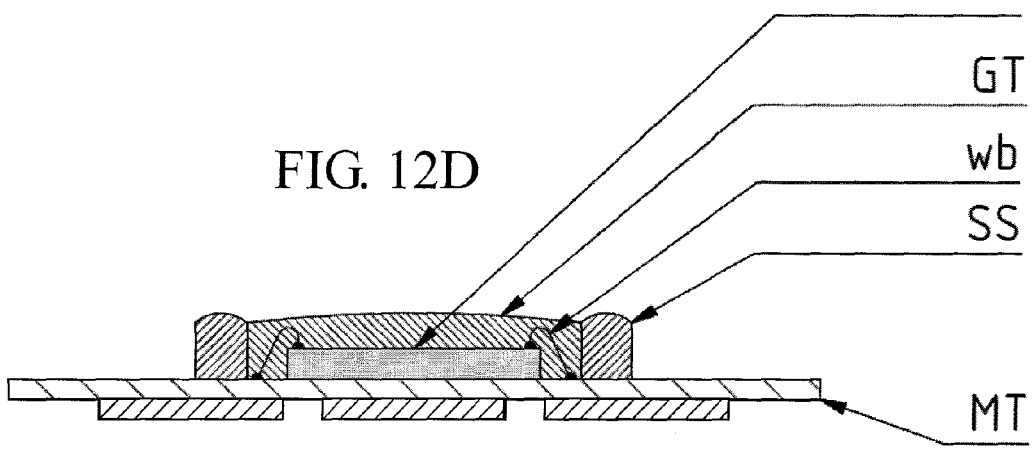

FIG. 12D is a side view diagram of a supporting structure (SS) erected on an epoxy glass tape (MT) with the inner area filled with an epoxy glob-top (GT) ("Dam & Fill"), to protect the wire bond connections to the silicon die (CM).

Figure 12E:
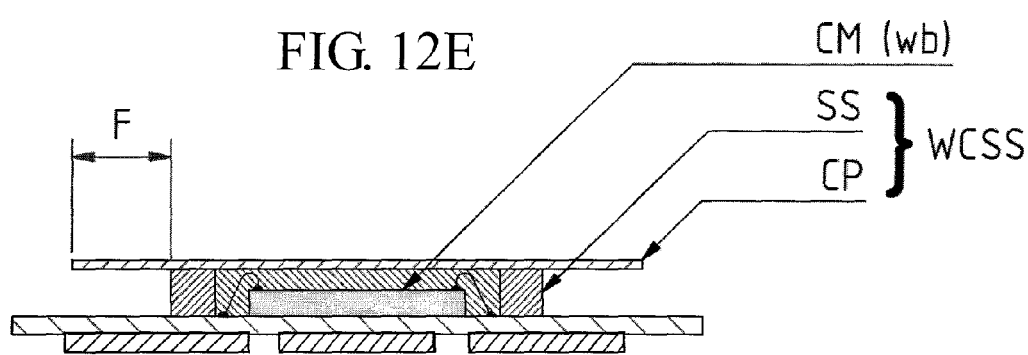

FIG. 12E is a side view diagram of a cap or cover plate (CP) mounted on the supporting structure (SS) to create a winding core support structure (WCSS) with flange (F).

FIG. 12F is a side view diagram of an antenna module (AM) with a winding core support structure (WCSS) with flange (F) and a wire coil wound around its structure to create a module antenna (MA).

FIG. 12G is a side view dimensional diagram of an antenna module (AM) with a wire bonded (wb) die.

FIG. 12H is a side view dimensional diagram of an antenna module (AM) with a flip-chip (fc).

Figure 13A:
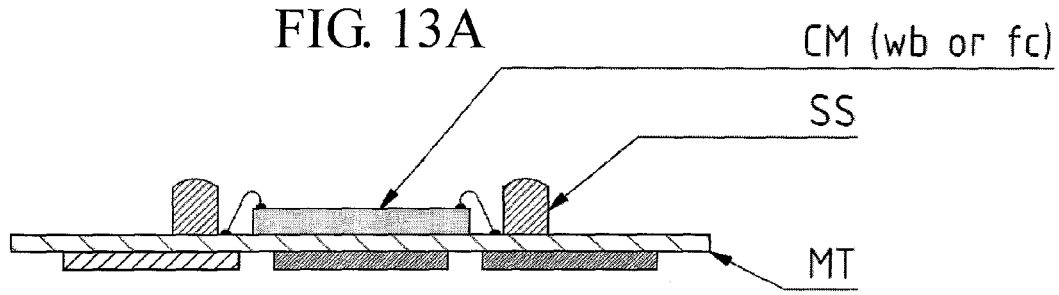

FIG. 13A is a side view diagram of a supporting structure (SS) being erected on an epoxy glass tape (MT) around a wire bonded (wb) die (or flip chip), to form a dam and winding core.

Figure 13B:
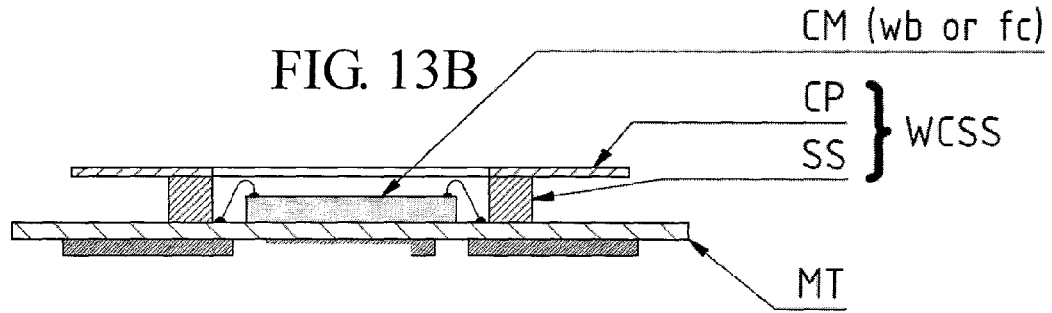

FIG. 13B is a side view diagram of a cap or cover plate (CP) with an opening mounted on to the supporting structure (SS) to create a winding core support structure (WCSS) with flange (F), according to an embodiment of the invention.

Figure 13C:
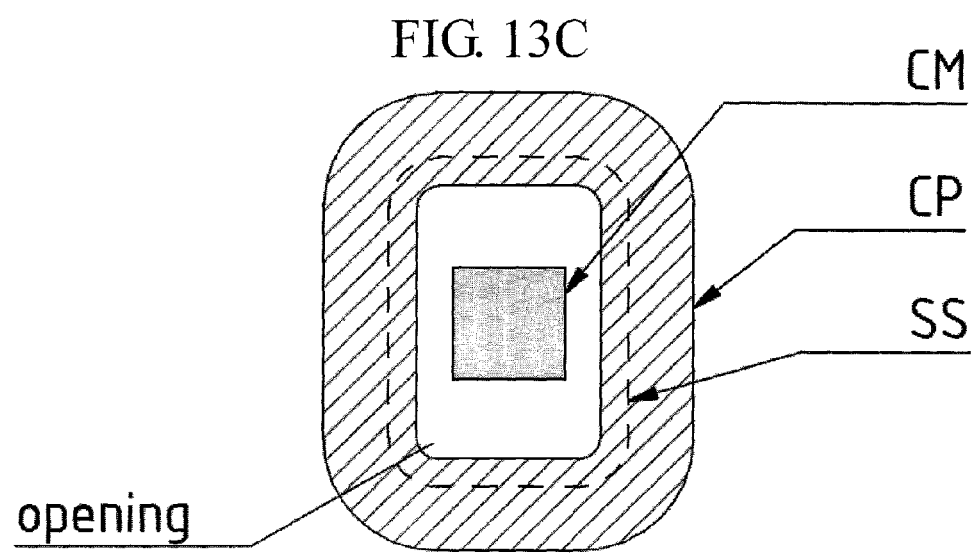

FIG. 13C is a top view diagram of the cap or cover plate (CP) with an opening to permit dispensing of the epoxy glob-top (GT), according to an embodiment of the invention.

Figure 13D:
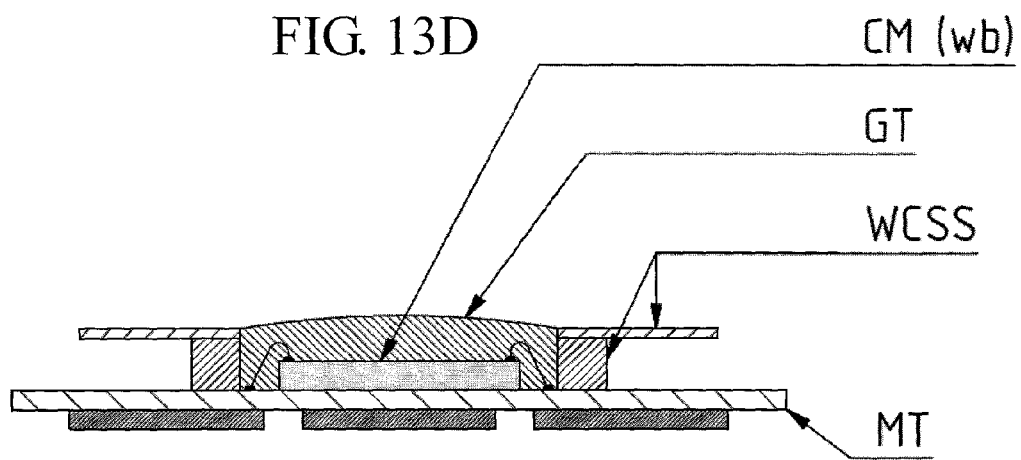

FIG. 13D is a side view diagram of a winding core support structure (WCSS) constructed on an epoxy glass tape (MT) with the inner area filled (via the opening in the cap or cover plate (CP)) with an epoxy glob-top (GT) to protect the wire bond connections to the silicon die (CM).

Figure 13E:
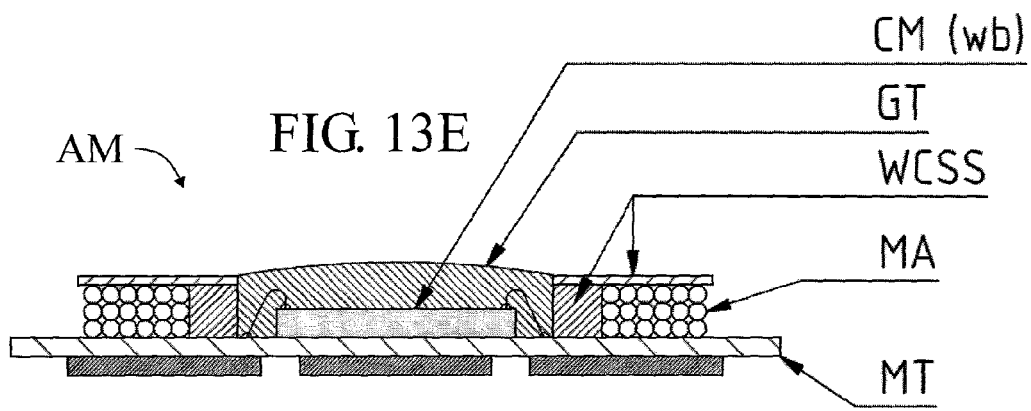

FIG. 13E is a side view diagram of a winding core support structure (WCSS) with a wire coil wound around its structure to create a module antenna (MA).

Figure 13F:
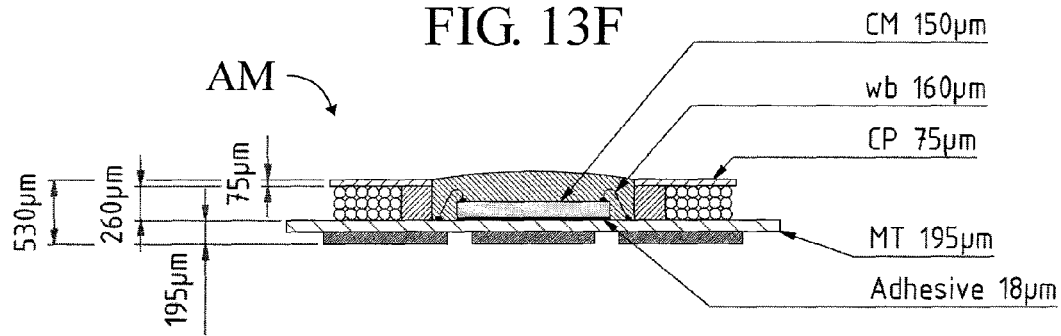

FIG. 13F is a side view dimensional diagram of an antenna module (AM) with a wire bonded die.

Figure 13G:
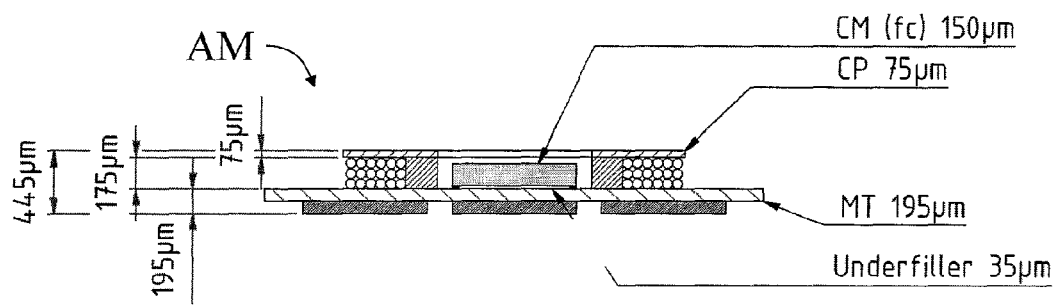

FIG. 13G is a side view dimensional diagram of an antenna module (AM) with flip chip (FC).

Figure 14A:
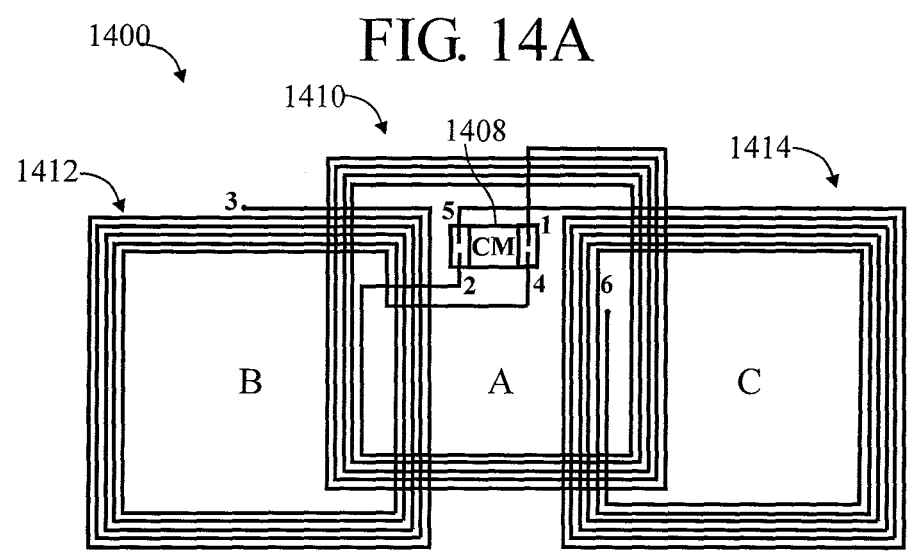

FIG. 14A is a schematic representation of an antenna module (AM).

Figure 14B:
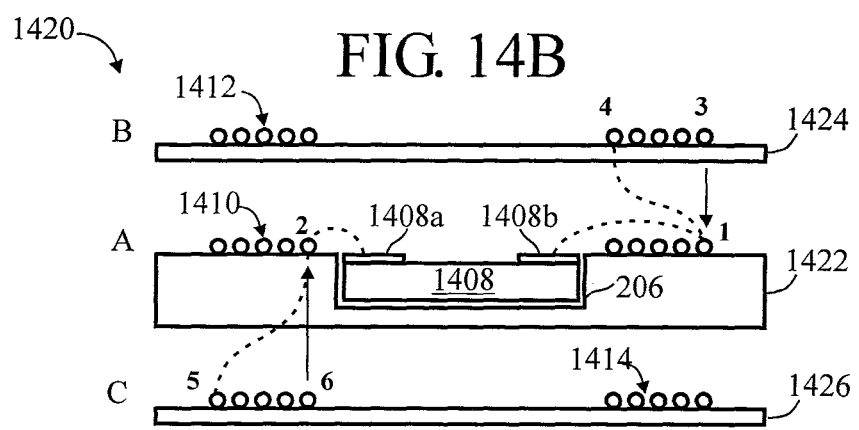

FIG. 14B is a cross-sectional view diagram of the antenna module of FIG. 2A.

Figure 15:
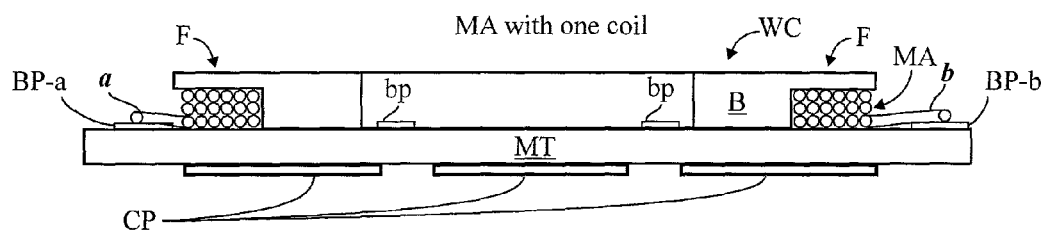

FIG. 15 is a diagram in cross-section showing a module antenna (MA) having one coil.

Figure 15A:
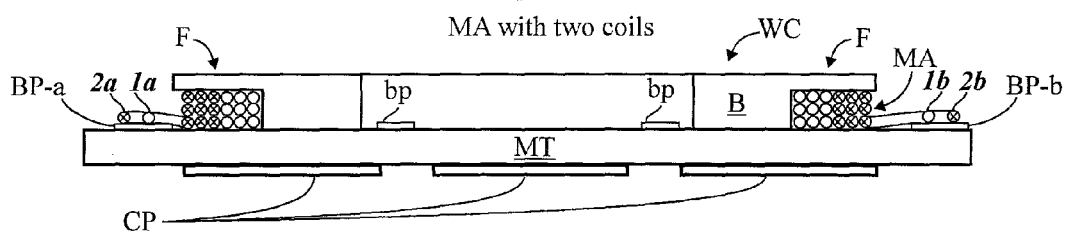

FIG. 15A is a diagram in cross-section showing a module antenna (MA) having two coils.

Figure 15B:
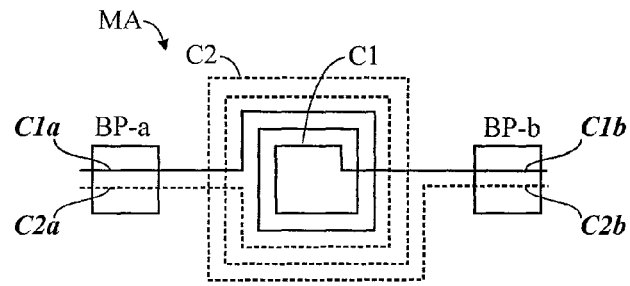

FIG. 15B is a diagram showing connecting the two coils of the module antenna (MA).

Figure 15C:
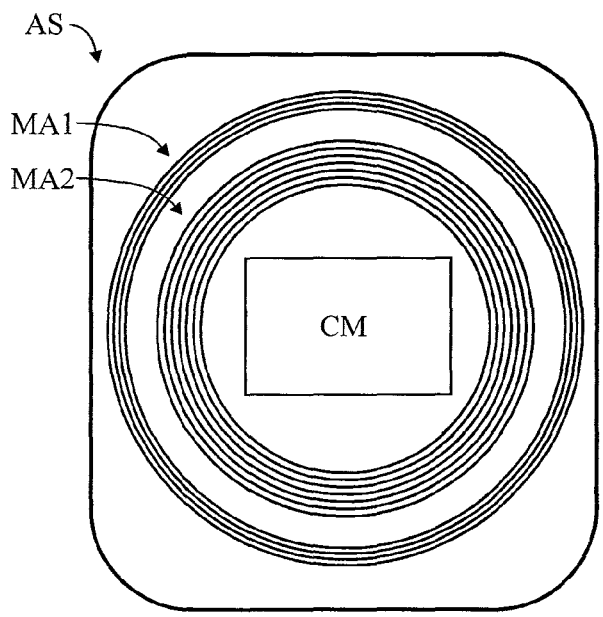

FIG. 15C is plan view of the underside of a module tape (MT) for an antenna module (AM), showing an antenna structure (AS) having two antenna segments (MA1, MA2).

Figure 15D:
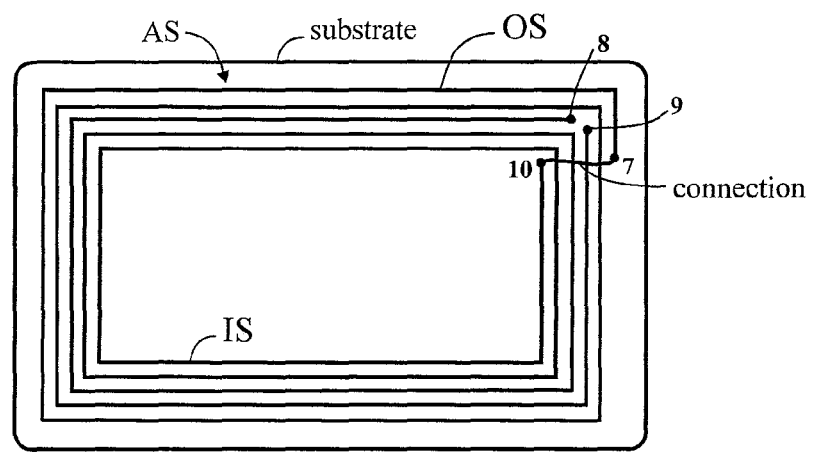

FIG. 15D is a diagrammatic view of an antenna structure (AS).

Figure 16:
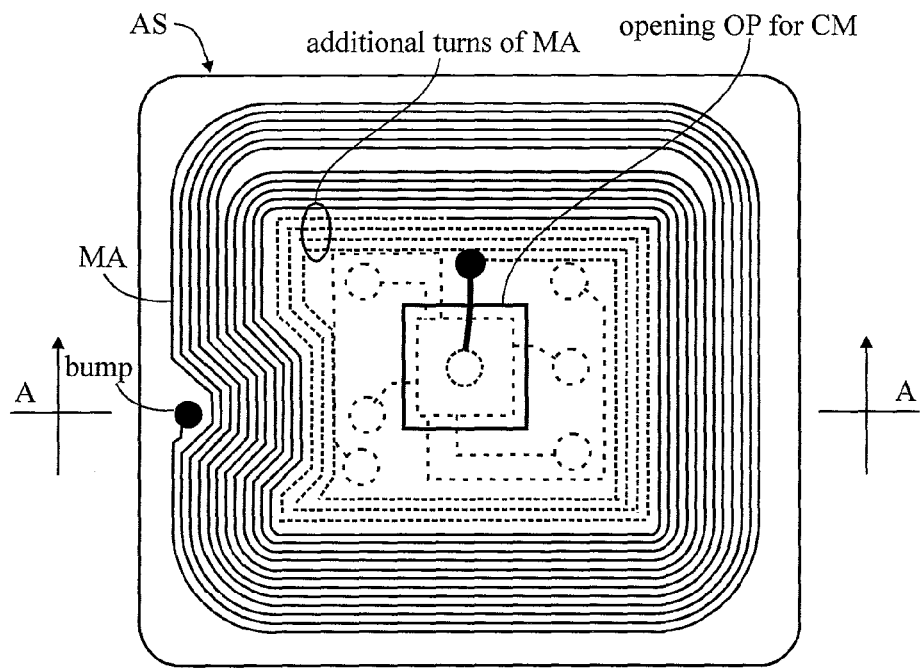

FIG. 16 is a plan view of an antenna substrate (AS).

Figure 16A:
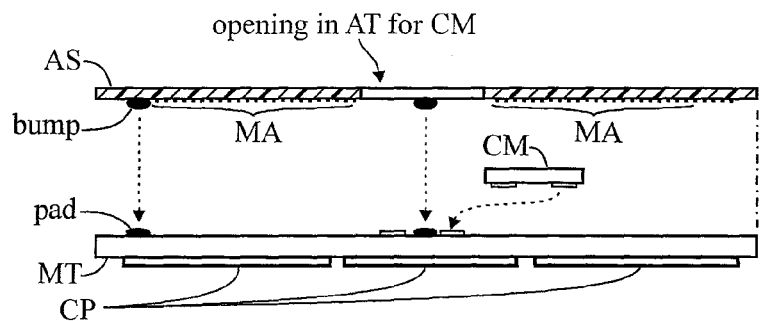

FIG. 16A is a cross-sectional view taken on a line A-A through FIG. 16.

Figure 17:
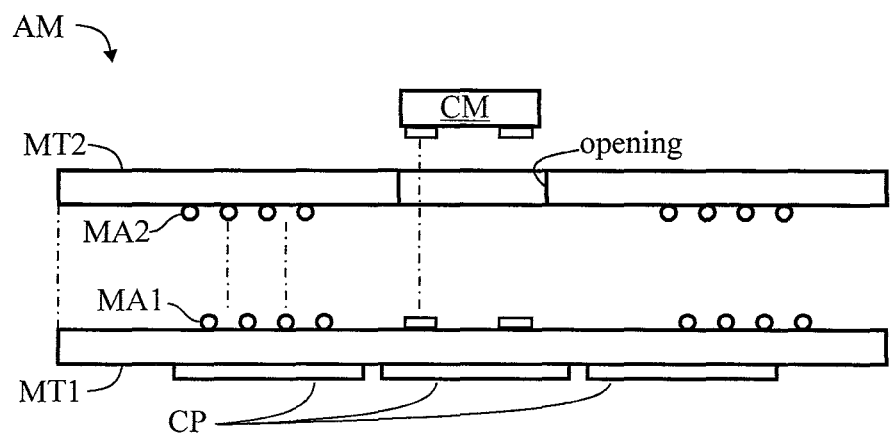

FIG. 17 is a cross-sectional view of an antenna module having a module antenna comprising two layers, each having an antenna coil.

FIGS. 18A and 18B are perspective views of steps involved in a method for making antenna modules (AMs), according to some embodiments of the invention.

FIG. 18C is a plan view illustrating perforating the contact pads (CP).

Figure 19A:
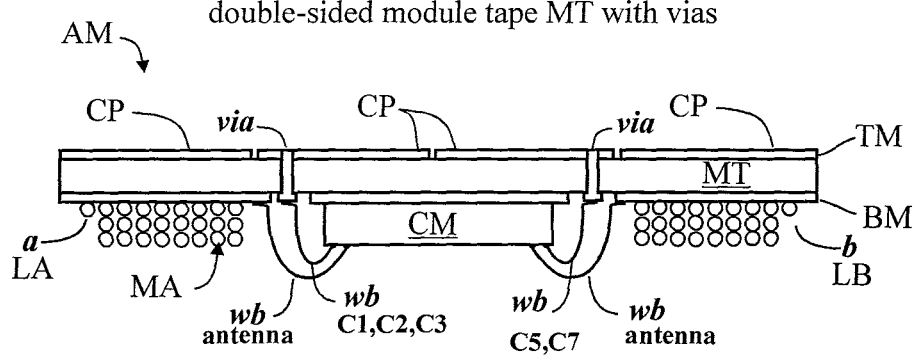

FIG. 19A is a cross-sectional view of an antenna module (AM) having a double-sided module tape (MT) with vias extending through the module tape (MT) . . . .

Figure 19B:
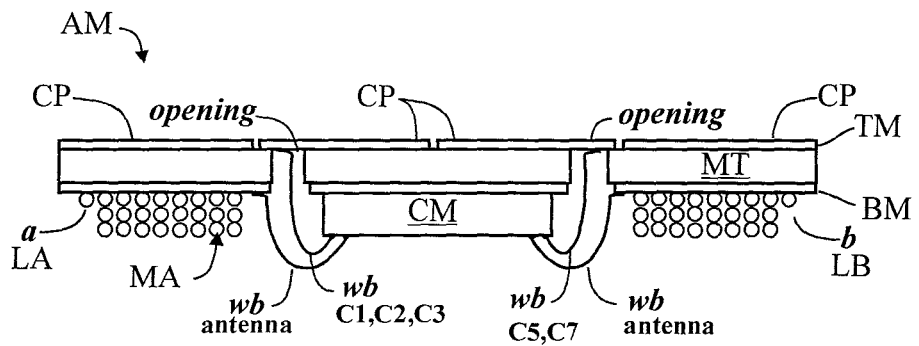

FIG. 19B is a cross-sectional view of an antenna module (AM) having a double-sided module tape (MT) with openings extending through the module tape (MT).

Figure 19C:
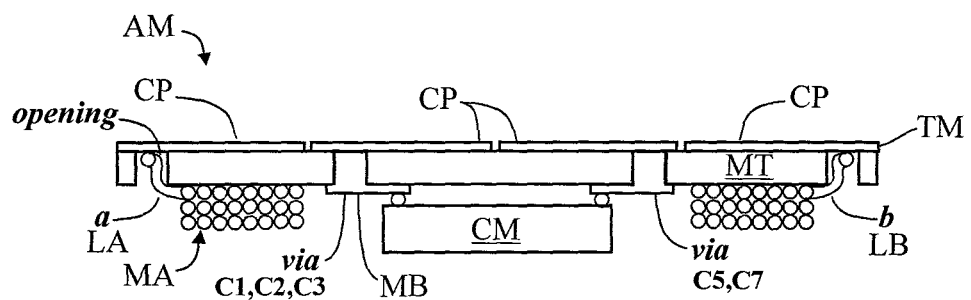

FIG. 19C is a cross-sectional view of an antenna module (AM) having a double-sided module tape (MT) with vias and openings extending through the module tape (MT).

Figure 19D:
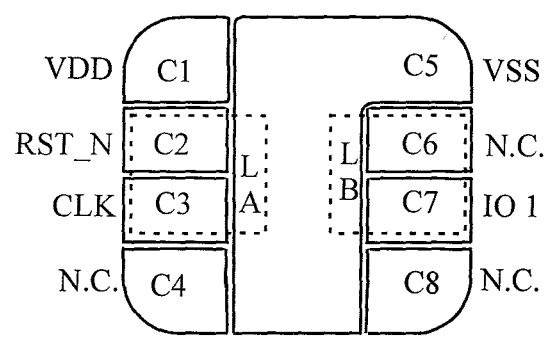

FIG. 19D is a diagram showing exemplary contact pad (CP) layout/assignments for the antenna modules (AM) of any of FIGS. 19A-19C.

Figure 19E:
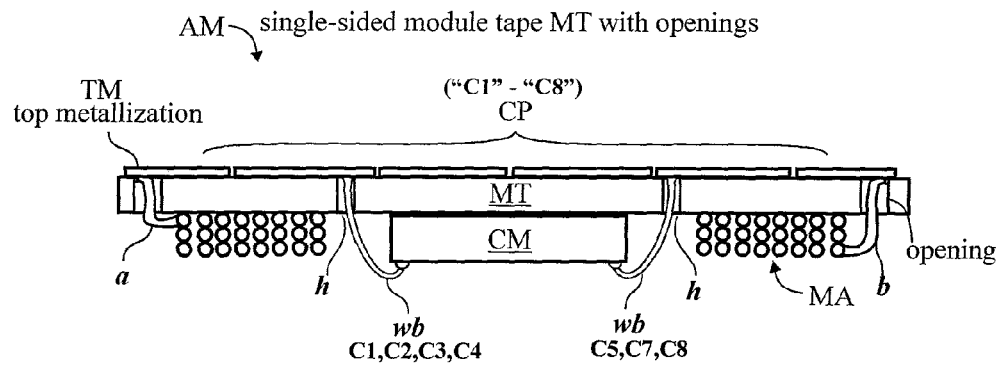

FIG. 19E is a cross-sectional view of an antenna module (AM) having a single-sided module tape with openings extending through the module tape (MT).

Figure 19F:
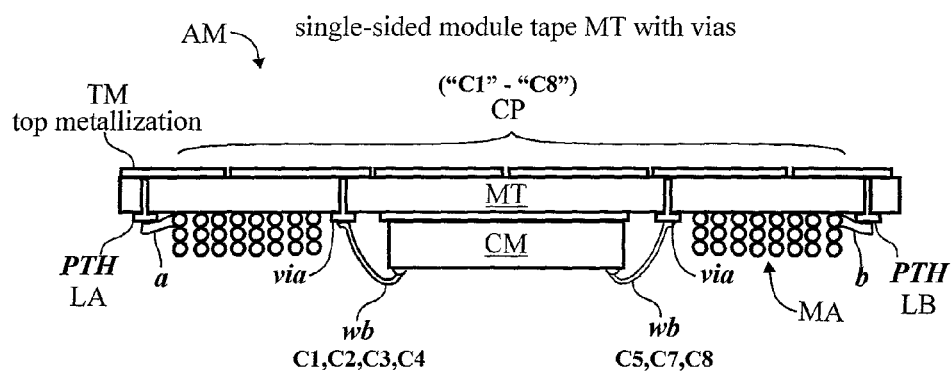

FIG. 19F is a cross-sectional view of an antenna module (AM) having a single-sided module tape with vias extending through the module tape (MT).

Figure 19G:
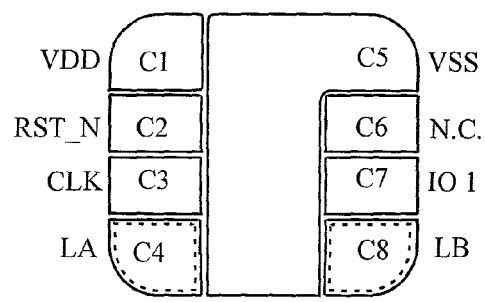

FIG. 19G is a diagram showing an exemplary contact pad (CP) layout/assignments for the antenna modules (AM) of either of FIG. 19E and FIG. 19F.

Figure 20:
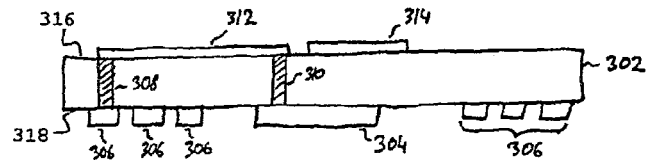
Figure 20A:
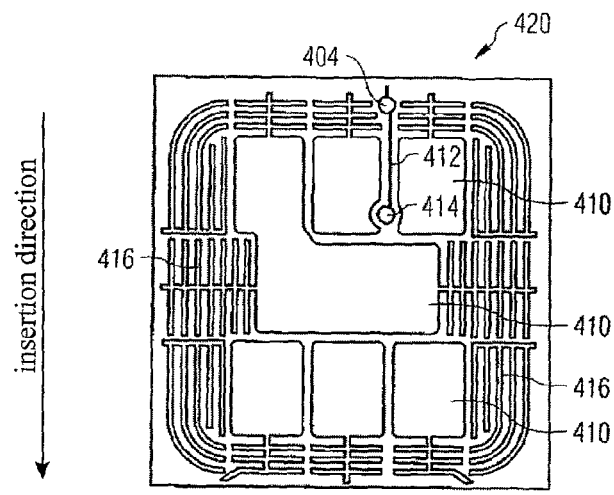
Figure 20B:
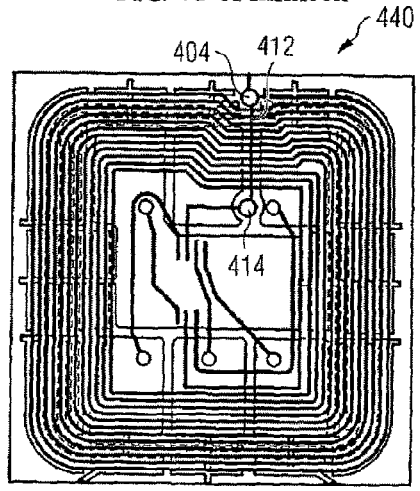

FIGS. 20, 20A and 20B are views showing a Chip Card Contact Array Arrangement.

Figure 21:
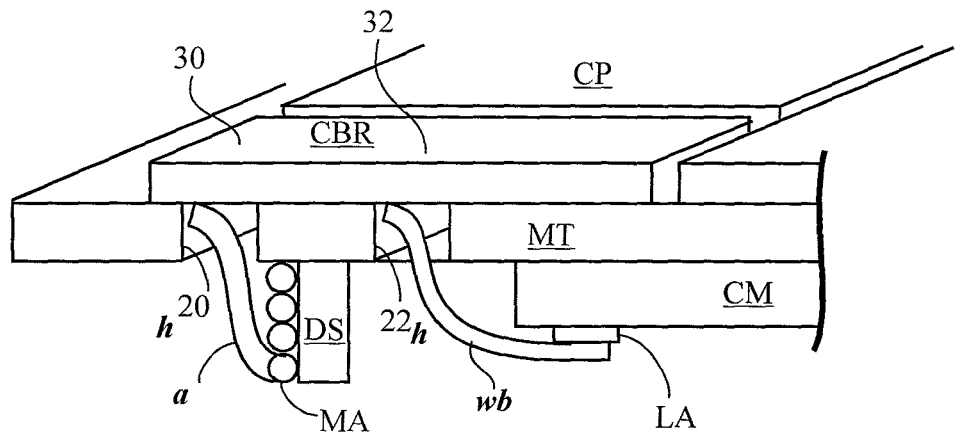

FIG. 21 is a cross-sectional view of a module tape (MT) having a connection bridge (CBR).

Figure 21A:
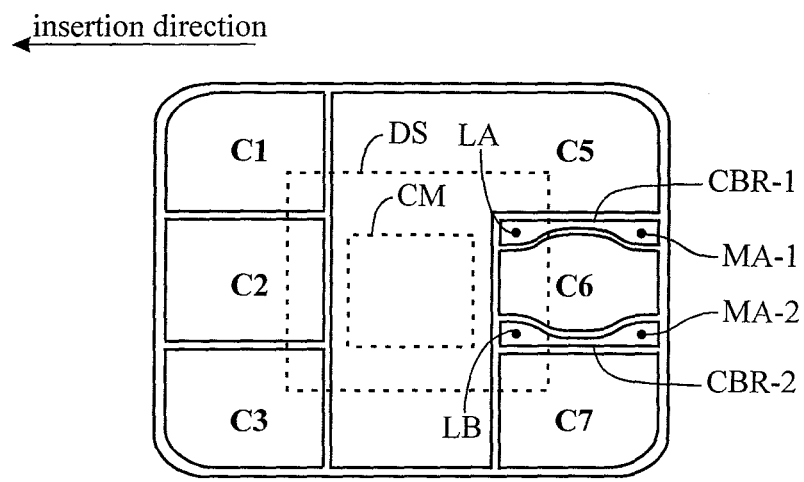

FIGS. 21A,B,C,D, E are diagrams showing contact pads C1-C6 of an antenna module (AM), and contact bridges (CBR).

Figure 22:
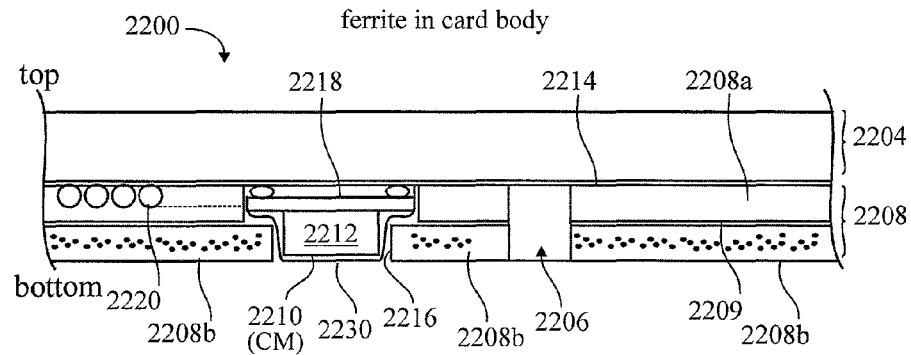

FIG. 22 is a cross-sectional view, illustrating a secure document (such as a passport cover) having ferrite in the inlay substrate (or card body).

Figure 22A:
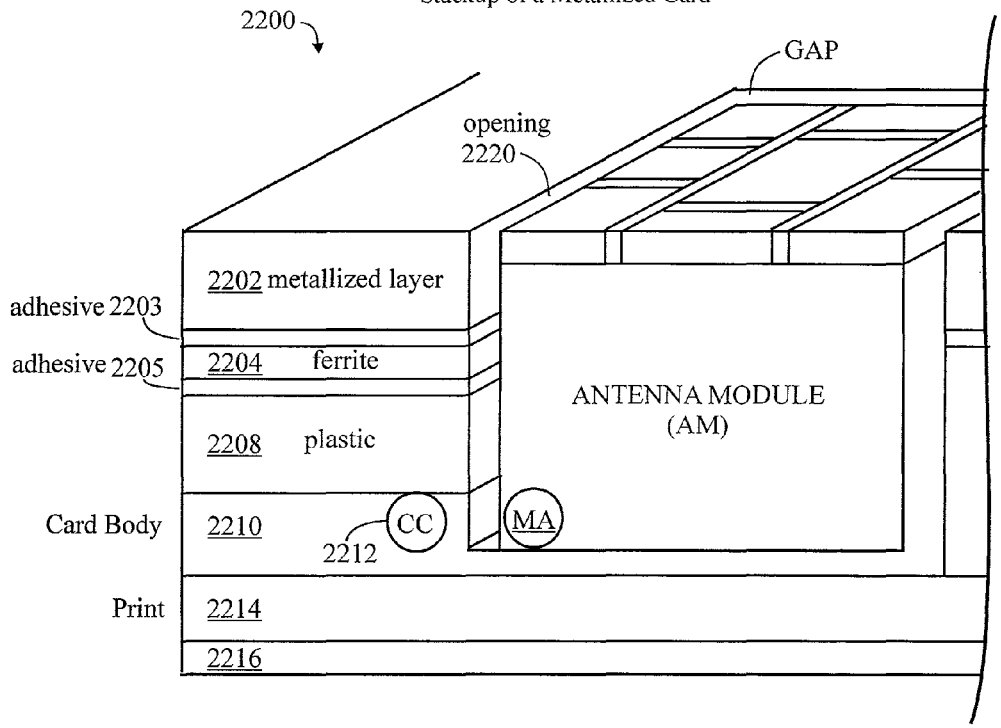

FIG. 22A is a partial diagrammatic perspective view of a smartcard with metallization.

Figure 22B:
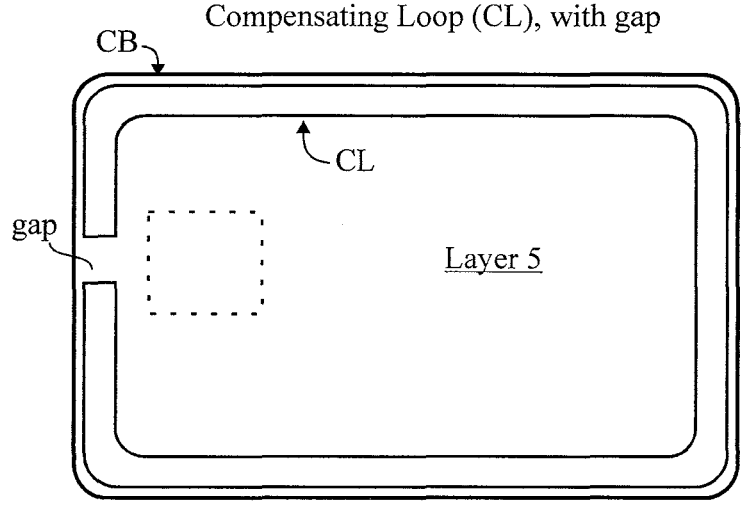

FIG. 22B shows a compensating loop (CL) with a gap.

Figure 22C:
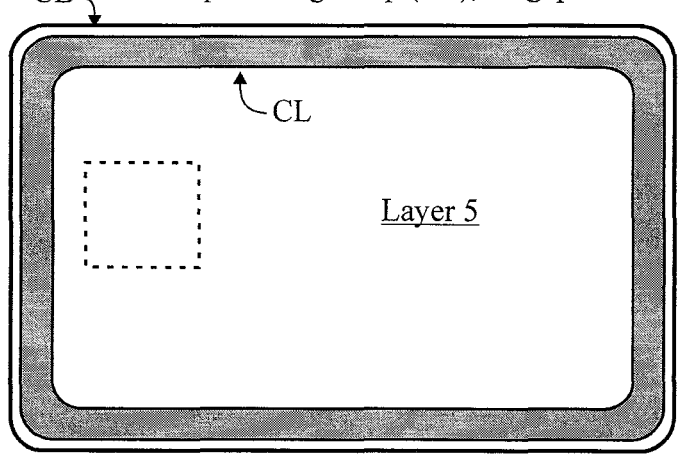

FIG. 22C shows a compensating loop (CL) without a gap.

Figure 22D:
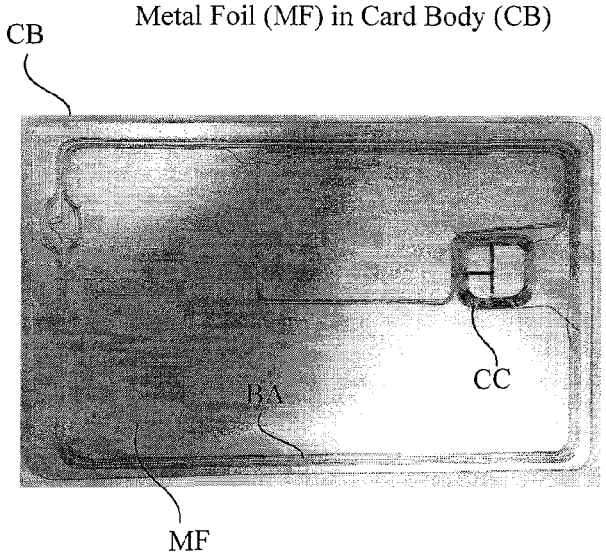

FIG. 22D, E, F, G are illustrations of including a metal foil (MF) in the card body (CB).

Figure 23A:
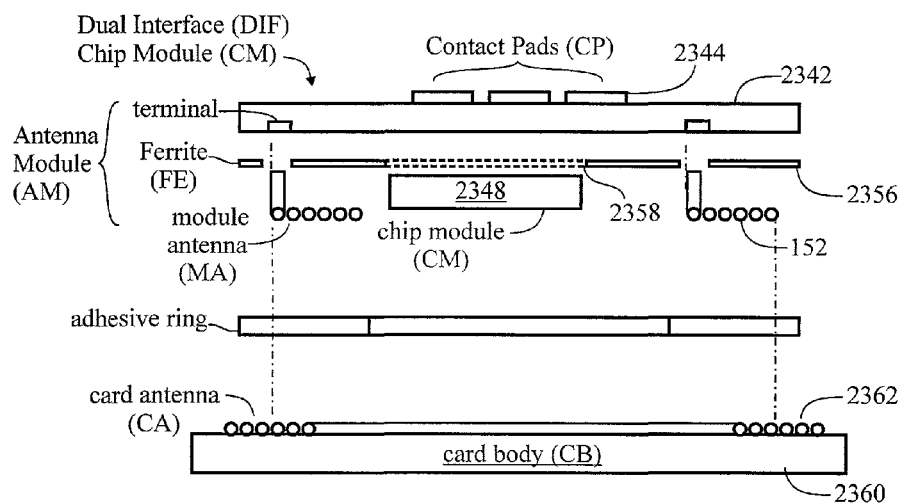

FIG. 23A is a cross-sectional view of a DIF smartcard.

Figure 23B:
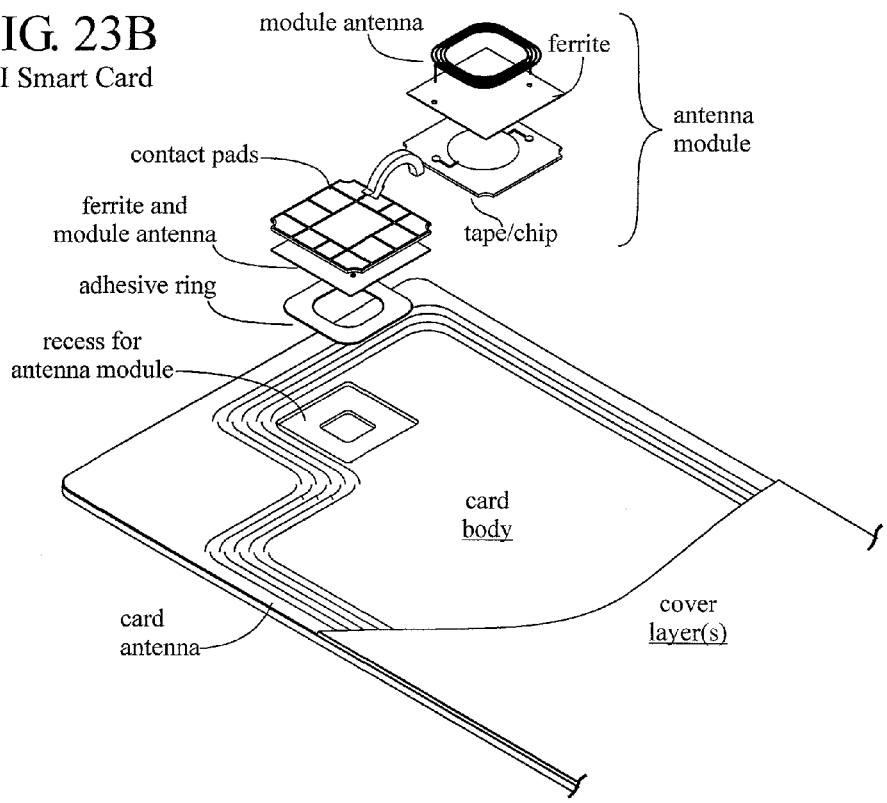

FIG. 23B is a perspective view of a smartcard implementing some of the embodiments of the invention disclosed herein.

Figure 23C:
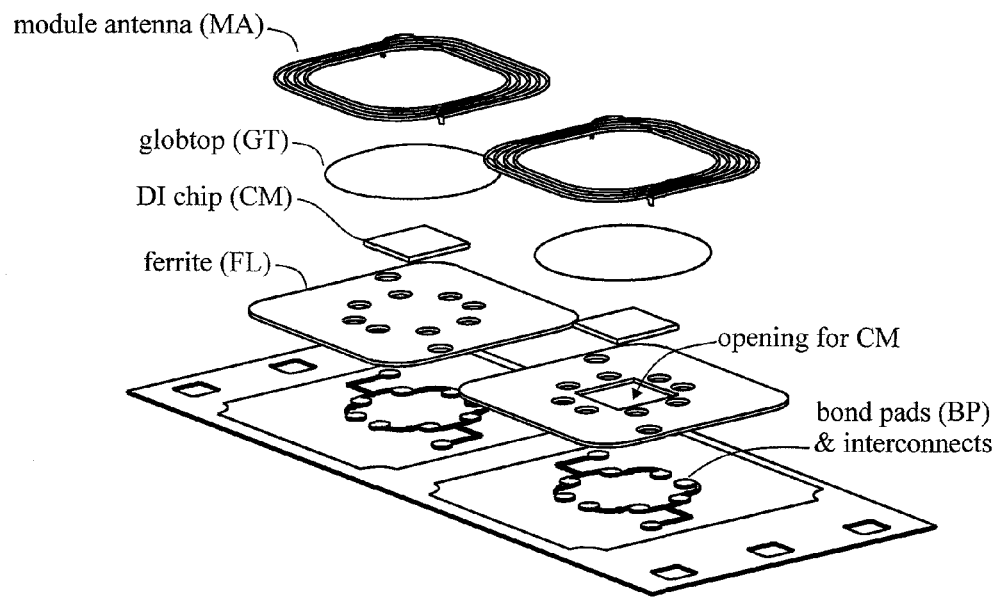
Figure 23D:
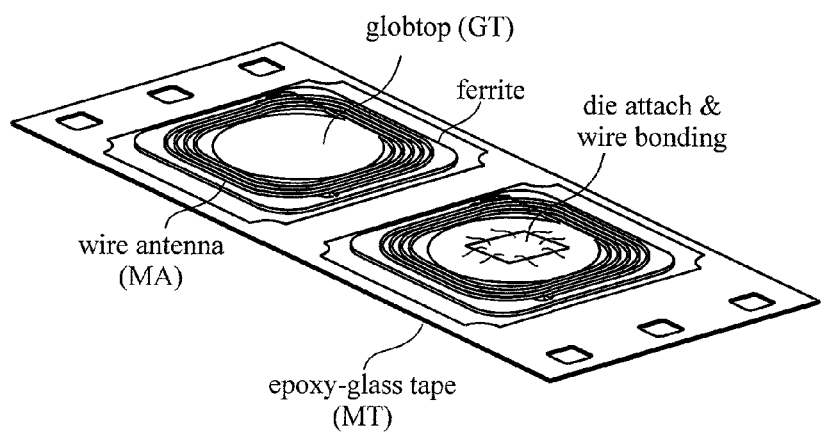

FIGS. 23C, 23D are perspective views of steps involved in a method for making antenna modules (AMs).

Figure 24:
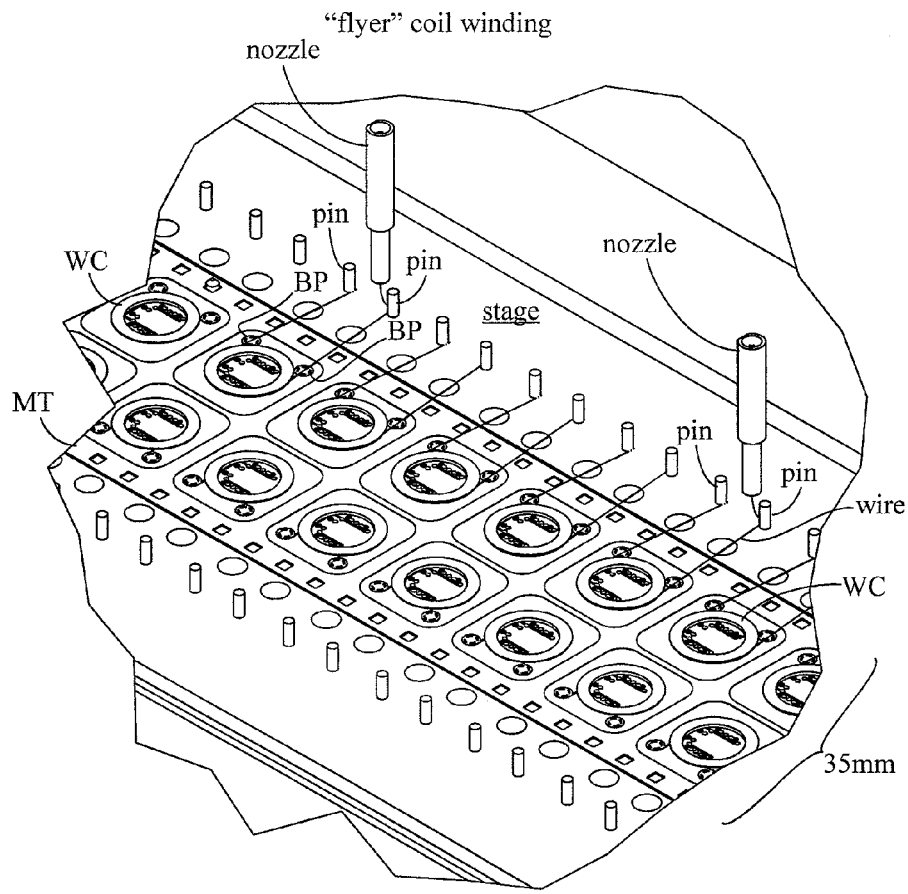
Figure 24A:
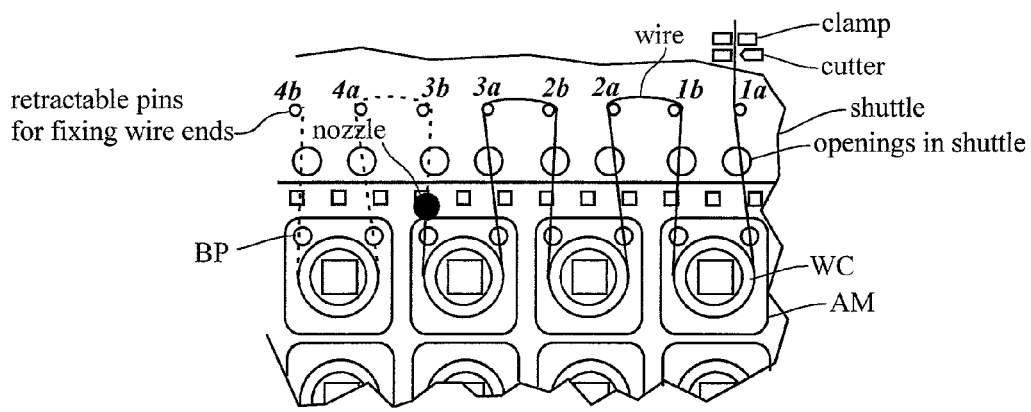

FIG. 24 is a perspective view and FIG. 24A is a plan view illustrating a technique for winding a coil for the module antenna (MA).

Figure 25:
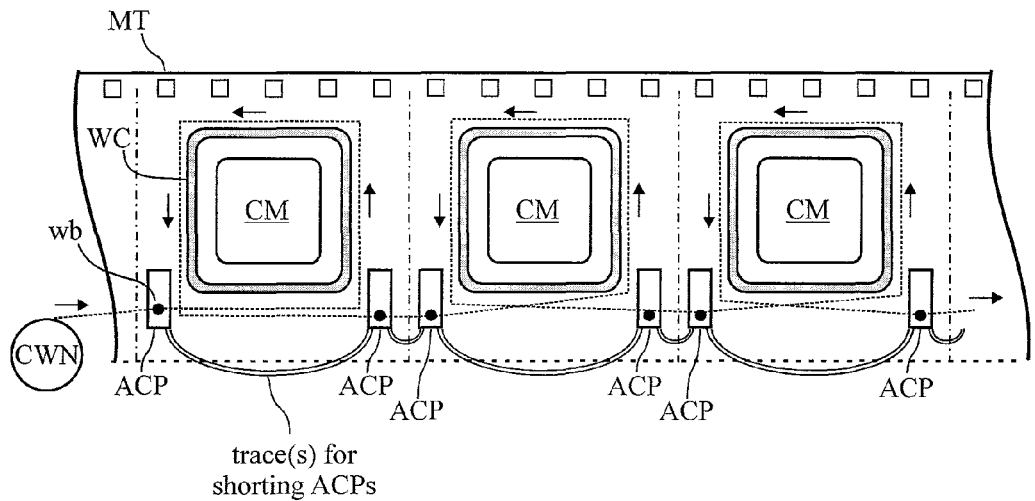

FIG. 25 is a diagram illustrating a technique for winding a coil for the module antenna (MA).

Figure 25A:
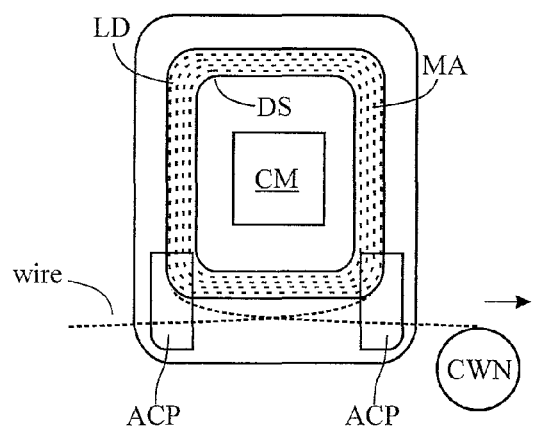

FIG. 25A is a diagram showing a site for an antenna module (AM) on a module tape (MT).

Figure 26:
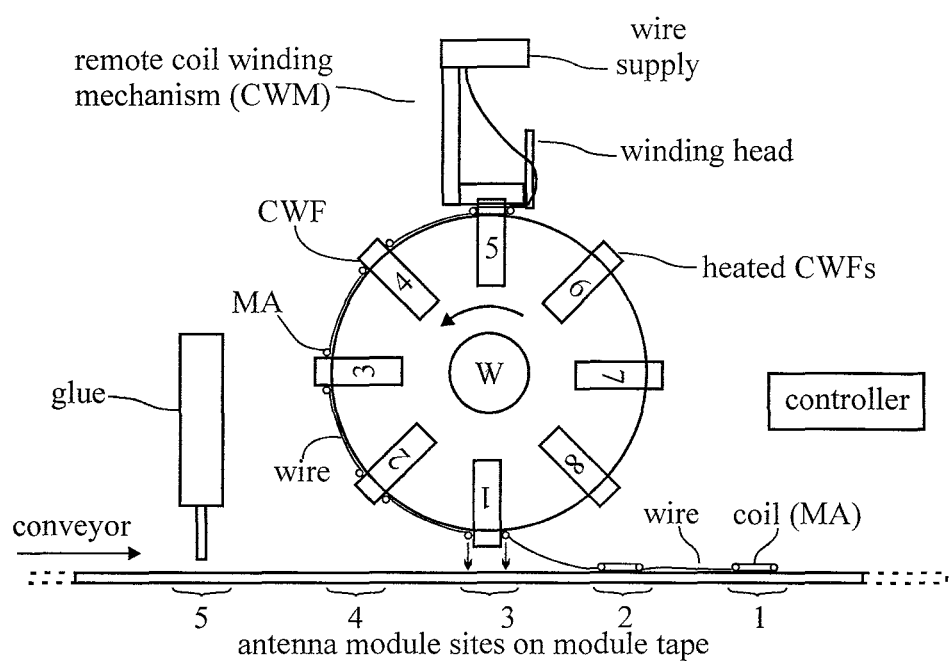

FIG. 26 is a diagram showing a technique for winding a coil for the module antenna (MA).

DETAILED DESCRIPTION

Various embodiments will be described to illustrate teachings of the invention(s), and should be construed as illustrative rather than limiting. It should be understood that it is not intended to limit the invention(s) to these particular embodiments. It should be understood that some individual features of various embodiments may be combined in different ways than shown, with one another. Reference herein to "one embodiment", "an embodiment", or similar formulations, may mean that a particular feature, structure, operation, or characteristic described in connection with the embodiment may be included in at least one embodiment of the present invention.

The embodiments and aspects thereof may be described and illustrated in conjunction with systems, devices and methods which are meant to be exemplary and illustrative, not limiting in scope. Specific configurations and details may be set forth in order to provide an understanding of the invention(s). However, it should be apparent to one skilled in the art that the invention(s) may be practiced without some of the specific details being presented herein. Furthermore, some well-known steps or components may be described only generally, or even omitted, for the sake of illustrative clarity.

Headings (typically underlined) may be provided as an aid to the reader, and should not be construed as limiting. Any dimensions and materials or processes set forth herein should be considered to be approximate and exemplary, unless otherwise indicated.

Reference may be made to disclosures of prior patents, publications and applications. Some text and drawings from those sources may be presented herein, but may be modified, edited or commented to blend more smoothly with the disclosure of the present application.

In the main hereinafter, RFID cards, electronic tags and secure documents in the form of pure contactless cards, dual interface cards, phone tags, electronic passports, national identity cards and electronic driver licenses may be discussed as exemplary of various features and embodiments of the invention(s) disclosed herein. As will be evident, many features and embodiments may be applicable to (readily incorporated in) other forms of smartcards, such as EMV payment cards, metal composite cards, metal hybrid cards, metal foil cards, access control cards and secure credential documents. As used herein, any one of the terms "transponder", "tag", "smartcard", "data carrier" and the like, may be interpreted to refer to any other of the devices similar thereto which operate under ISO 14443 or similar RFID standard. The following standards are incorporated in their entirety by reference herein:

ISO/IEC 14443 (Identification cards—Contactless integrated circuit cards—Proximity cards) is an international standard that defines proximity cards used for identification, and the transmission protocols for communicating with it.

ISO/IEC 7816 is an international standard related to electronic identification cards with contacts, especially smartcards.

EMV standards define the interaction at the physical, electrical, data and application levels between IC cards and IC card processing devices for financial transactions.

There are standards based on ISO/IEC 7816 for contact cards, and standards based on ISO/IEC 14443 for contactless cards.

A typical data carrier described herein may comprise
  (i) an antenna module (AM) having an RFID chip (CM; or chip module) and a module antenna (MA),
  (ii) a card body (CB) and
  (iii) a booster antenna (BA) with coupler coil (CC) disposed on the card body (CB) to enhance coupling between the module antenna (MA) and the antenna of an external RFID "reader".

When "chip module" is referred to herein, it should be taken to include "chip", and vice versa, unless explicitly otherwise stated. Chip or chip module may be referred to as "CM". Throughout the various embodiments disclosed herein, unless specifically noted otherwise (in other words, unless excluded), the element referred to as "CM" will most appropriately be a bare integrated circuit (IC) die (or RFID chip), rather than a chip module (a die with a carrier). In contrast therewith, some figures present examples that are specifically "chip modules" having IC chips (such as a "CM") mounted and connected to substrates. A "chip module" (die and carrier) with a module antenna (MA) mounted and connected thereto may be referred to as an antenna module (AM).

The module antenna (MA) may comprise a coil of wire, conductive traces etched or printed on a module tape (MT) or antenna substrate (AS) for the antenna module (AM), or may be incorporated directly on the chip itself.

The descriptions that follow are mostly in the context of dual interface (DI, DIF) smartcards, and relate mostly to the contactless operation thereof. Many of the teachings set forth herein may be applicable to electronic passports and the like having only a contactless mode of operation (single interface). Generally, any dimensions set forth herein are approximate, and any materials set forth herein are intended to be exemplary, not limiting.

RFID Cards, Generally

For the purpose of discussion, an RFID (radio frequency identification) card, which may be referred variously as an integrated circuit card (IC card or "chip card") or secure document, generally comprises an RFID chip (CM) implanted in or disposed on a substrate and a card antenna (CA) disposed in or on a substrate, may operate on the principle of inductive coupling with no physical electrical connections between the chip module (CM) and the card antenna (CA), and may form the basis of a secure document such as an electronic passport, national identity card, contactless smartcard, contact/contactless smartcard, chip card, electronic EMV (Europay, MasterCard and Visa) payment card, electronic driver's license, electronic health card or electronic tag, which may also be referred to as a data carrier with contactless functionality.

An RFID silicon die packaged in a suitable housing may be referred to as a chip module (CM). The chip module in its broadest sense also encompasses an integrated circuit (IC), a bare silicon die, a stud-bumped chip, a straight wall bumped chip or a coil on chip device.

The chip module (CM) may be a lead-frame-type chip module, an epoxy-glass type chip module or a flexible PET chip module. The RFID silicon or organic die may be mounted to the chip carrier tape or module tape (MT) forming the chip module (CM) by means of die & wire bonding or flip chip assembly. The chip carrier tape can be metallized on one side (contact side) or on both sides with through-hole plating to facilitate the interconnection with the antenna. The chip carrier tape may also incorporate a chemically etched antenna, printed antenna or nanostructured antenna.

The substrate, which may be referred to as an "inlay substrate" (such as for an electronic passport) or "card body" (such as for a smartcard) may comprise one or more layers of material such as Polyvinyl Chloride (PVC), Polycarbonate (PC), Polyethylene (PE), Poly(ethylene terephthalate) (PET), Polyetherurethane, PET-G (Polyethylene Terephalate Glycol-modified), Polyester Copolymer film, Teslin™, paper, synthetic paper and the like.

The combination of RFID chip (CM) and card antenna (CA) may operate solely in a contactless (non-contact) mode (such as ISO 14443), or may be a dual interface (DI, DIF) chip module (CM) which may additionally be operative to function in a contact mode (such as ISO 7816-2) and a contactless mode. The RFID chip (CM) may harvest energy from an RF signal supplied by an external RFID reader device with which it communicates.

The chip module (CM) may also be referred to as an antenna module (AM) incorporating a chip carrier tape or module tape (MT), an RFID die mounted to the module tape (MT) by means of die & wire bonding or flip chip assembly, and a module antenna (MA). In most cases, the RFID die is referred to as the chip or chip module forming part of the antenna module.

The antenna module (AM) may be quite small (having a punching size of 10.8 mm×8.2 mm for a 6 contact pad module from NXP or 11.0 mm×8.3 mm for a 6 contact pad module from Infineon, or 13.0 mm×11.8 mm for a 8 contact pad module from Infineon), in contrast with the card antenna (CA) (such as approximately 50 mm×80 mm).

The module antenna (MA) of the antenna module (AM) is inductively coupled rather than electrically connected to the card antenna (CA). In such case, the card antenna (CA) may be referred to as a booster antenna (BA). The booster antenna (BA) may comprise a portion disposed around the periphery of the card body (CB), and another portion which may comprise a coupler coil (CC) disposed at an interior area of the card body (CB) for inductively coupling with the module antenna (MA). The terms card antenna (CA) and booster antenna (BA) may be used interchangeably herein.

The module antenna MA may be a wire-wound coil, or an etched spiral pattern of conductive traces. For an etched pattern, the RFID chip CM is typically disposed in the center of the spiral antenna pattern, making that space unavailable for turns of the antenna. A significant amount of space around the chip CM is unavailable for the etched antenna. The antenna module AM may have 8 or 6 contact pads. Some dimensions (all approximate) for the module may be, The overall size of an 8-pad module may be W=13.0 mm×H=11.8 mm The overall size of a 6-pad module may be W=11.0 mm×H=8.4 mm The module antenna MA may have 12 "turns", or tracks.

Each track of the module antenna MA may have a width of 0.1 mm

A gap between adjacent tracks of the module antenna may be 0.075 mm

The "pitch" (width+gap) of the tracks may be 0.175 mm (0.1+0.075)

The RFID chip CM may measure approximately 2 mm×2 mm

The inner dimension of the module antenna MA may be approximately 9 mm×8 mm. This is the area occupied by the chip CM and its interconnects.

Because of the restrictions on the size of the smartcard module (e.g. approximately 13×12 mm, or 11×9 mm), the number of turns forming the antenna is limited to the space surrounding the central position of the silicon die which is attached and bonded to the module substrate. This substrate is generally made of epoxy glass with a contact metallization layer on the face-up side and a bonding metallization layer on the face-down side of the module. The chemically etched antenna is usually formed on the face-down side.

Reference is made to ISO 7816, incorporated by reference herein. To provide some context, the overall dimensions of the card body, as defined by ISO 7816 are:

Width: 85.47 mm–85.72 mm

Height: 53.92 mm–54.03 mm

Thickness: 0.76 mm+0.08 mm an Exemplary Dual Interface (DI) Smartcard, and Readers U.S. Ser. No. 14/020,884 filed 8 Sep. 2013, describes some embodiments of smartcards, more particularly some embodiments of booster antennas BAs, techniques for embedding wire in a controlled manner in a substrate, and techniques for controlling wire bonding.

FIG. 1 illustrates a smartcard (SC) 100 in cross-section, along with a contact reader and a contactless reader. The antenna module AM may comprise a module tape (MT) 110, an RFID chip (CM) 112 disposed on one side of the module tape MT along with a module antenna (MA) 114 and contact pads (CP) 116 disposed on the other side of the module tape MT for interfacing with an external contact reader. The card body (CB) 120 comprises a substrate which may have a recess (R) 122 extending into one side thereof for receiving the antenna module AM. (The recess R may be stepped—such as wider at the surface of the card body CB—to accommodate the profile of the antenna module AM.) The booster antenna (BA) 130 may comprise turns (or traces) of wire (or other conductor) embedded in (or disposed on) the card body CB, and may comprise a number of components such as (i) a card antenna (CA) component 132 and (ii) a coupler coil (CC) component 134. The card body (CB) 120 may measure approximately 54 mm×86 mm.

An embedding head (or tool) for embedding the wire for the booster antenna BA and its various components in a substrate may comprise an ultrasonic transducer (or sonotrode) vibrating a capillary tube through which the wire being embedded extends (or is fed) onto the surface of the substrate. By imparting an ultrasonic vibration of the tool while applying a downward force (urging the tool downward, with a force), the wire may be caused to become embedded, at least partially, into the surface of the card body CB substrate. Reference may be made to U.S. Pat. No. 6,698,089 (2004; Finn et al) and U.S. Pat. No. 6,233,818 (2001; Finn et al), incorporated by reference herein, which disclose embedding wire in a substrate using a sonotrode. See, for example, FIGS. 1 and 3 of U.S. Pat. No. 6,698,089.

Controlling Force and Ultrasonic Power During Wire Embedding

The booster antenna (BA) (and any of its components CA, OW, IW, CC, AE) may comprise several turns of wire embedded very close to one another. When embedding the several turns of a booster antenna (BA), notably the peripheral card antenna (CA) portion thereof, it may be appreciated that the first turn of wire may be embedded in the "native" substrate of the card body (CB), and may interfere (resisting or blocking, in a manner of speaking) with the embedding of subsequent turns of the booster antenna (BA).

FIG. 1A shows the ISO-7816 specification for contact pad layout. Eight contact pads C1-C8 are shown, The contact pads C1-C8 are located on the front of the card. The dimensions are referenced to the left and upper edges of the front surface of the card. For a 6-pad layout, the contact pads C4 and C8 may be omitted. The signal assignments for the contact pads are,

| | |
|---|---|
| C1 | VDD |
| C2 | RST_N |
| C3 | CLK |
| C4 | not used |
| C5 | VSS |
| C6 | not used |
| C7 | IO 1 |
| C8 | not used |

An 8-pad layout may measure approximately 12 mm×13 mm.

A 6-pad layout may measure approximately 9 mm×12 mm.

The module antennas MAs described herein may be formed in various ways, such as but not limited to:
- wound from many turns of wire as an air core coil,
- wound from many turns of wire on a support structure,
    - the support structure SS may be affixed to the module tape MT, either before or after winding the module antenna MA thereupon, and may constitute an "interim product"
- etched as a plurality of conductive traces of metallization on at least one side of the module tape MT
- wire embedded in the module tape MT or in an antenna substrate AS joined to the module tape MT An embedding head (or tool) for embedding the wire for the booster antenna BA and its various components in the substrate may comprise an ultrasonic transducer (or sonotrode) vibrating a capillary tube through which the wire being embedded extends (or is fed) onto the surface of the substrate. By imparting an ultrasonic vibration of the tool while applying a downward force (urging the tool downward, with a force), the wire may be caused to embed itself, at least partially, into the surface of the card body CB substrate. Reference may be made to U.S. Pat. No. 6,698,089 (2004; Finn et al) and U.S. Pat. No. 6,233,818 (2001; Finn et al), incorporated by reference herein, which disclose embedding wire in a substrate using a sonotrode. See, for example, FIGS. 1 and 3 of the '089 patent.

The booster antenna (BA) (and any of its components CA, OW, IW, CC, AE) may comprise several turns of wire embedded very close to one another. When embedding the several turns of a booster antenna (BA), notably the peripheral card antenna (CA) portion thereof, it may be appreciated that the first turn of wire may be embedded in the "native" substrate of the card body (CB), and may interfere (resisting or blocking, in a manner of speaking) with the embedding of subsequent turns of the booster antenna (BA).

A Booster Antenna configuration

U.S. Pat. No. 8,130,166 (2012; Assa Abloy) discloses a coupling device formed by a continuous conductive path having a central section (12) and two extremity sections (11, 11'), the central section (12) forming at least a small spiral for inductive coupling with the transponder device, the extremities sections (11, 11') forming each one large spiral for inductive coupling with the reader device. The inner end of the outer extremity section (11) and the outer end of the inner extremity section (11') are connected with the coupler coil (12). The outer end (13) of the outer extremity section (11) and the inner end (13') of the inner extremity section (11') are left unconnected (loose).

FIG. 1B is a diagram showing a configurations for the booster antenna (BA), including the coupler coil (CC) component thereof. Reference may be made to . . . .
- FIG. 2C of U.S. Ser. No. 13/205,600 filed 8 Aug. 2011 (published as US 20120038445, 16 Feb. 2012; issued U.S. Pat. No. 8,474,726, 12 Jul. 2013) and
- FIG. 3A, and other figures of U.S. Ser. No. 13/310,718 filed Dec. 3, 2011 (published as US 20120074233, Mar. 29, 2012, issued as U.S. Pat. No. 8,366,009 Feb. 5, 2013) for use as a booster antenna BA in the card body CB of a smartcard SC
- FIGS. 2A, 3, 3A-3D, and other figures of U.S. Ser. No. 13/600,140 filed 30 Aug. 2012 (published as US 20130075477, 28 Mar. 2013)

The booster antenna BA comprises an outer winding OW and an inner winding IW, both extending substantially around the periphery of the card body CB. Each of the inner and outer windings has an inner end IE and an outer end OE. The outer end OE (b) of the outer winding OW is connected with the inner end IE (e) of the inner winding IW, via a coupler coil CC. The inner end IE (a) of the outer winding OW and the outer end OE (f) of the inner winding IW may be left unconnected, as "free ends". The overall booster antenna BA comprising outer winding OW, coupler coil CC and inner winding IE is an open circuit, and may be referred to as a "quasi-dipole"—the outer winding OW constituting one pole of the dipole, the inner winding IW constituting the other pole of the dipole—center fed by the coupler coil CC.

The booster antenna BA may be formed using insulated, discrete copper wire disposed (such as ultrasonically bonded) around (inside of) the perimeter (periphery) of a card body CB (or inlay substrate, or data carrier substrate, such as formed of thermoplastic). The booster antenna BA comprises an outer winding OW (or coil, D) and an inner winding IW (or coil, D), and further comprises a coupler coil CC, all of which, although "ends" of these various coil elements are described, may be formed from one continuous length of wire (such as 80 μm self-bonding wire) which may be laid upon or embedded in the card body CB. More particularly,
- The outer winding OW may be formed as a spiral having a number (such as 2-3) of turns and having an inner end IE at point "a" and an outer end OE at point "b". The outer winding OW is near (substantially at) the periphery (perimeter) of the card body CB. The inner end IE ("a") of the outer winding OW is a free end.
- The coupler coil CC may be formed as a spiral having a number (such as approximately 10) of turns and having two ends "c" and "d". The end "c" may be an outer end OE or an inner end IE, the end "d" may be an inner end IE or an outer end OE. The coupler coil CC is disposed at an interior portion of the card body CB, away from the periphery, and is shown only generally with a few dashed lines in FIG. 1B.
- The inner winding IE may be formed as a spiral having a number (such as 2-3) of turns and having an inner end IE "e" and an outer end OE "f". The inner winding IW is near (substantially at) the periphery of the card body CB, inward of the outer winding OW. The outer end OE ("f") of the inner winding IW is a free end. In FIG. 1B, the inner winding IW is shown in dashed lines, for illustrative clarity.
- The inner end IE of the outer winding OW is a "free end" in that it is left unconnected. Similarly, the outer end OE of the inner winding IW is a "free end" left unconnected.

The outer winding OW, coupler coil CC and inner winding IW may be formed as one continuous structure, using conventional wire embedding techniques. It should be understood that references to the coupler coil CC being connected to ends of the outer winding (OW) and inner winding (IW) should not be construed to imply that coupler coil CC is a separate entity having ends. Rather, in the context of forming one continuous structure of outer winding OW, coupler coil CC and inner winding IW, "ends" may be interpreted to mean positions corresponding to what otherwise would be actual ends—the term "connected to" being interpreted as "contiguous with" in this context.

The dimensions of the card body CB may be approximately 54 mm×86 mm. The outer dimension of the outer winding OW of the booster antenna BA may be approximately 80 mm×50 mm. The wire for forming the booster antenna BA may having a diameter (d) of approximately 100 µm (including, but not limited to 80 mm, 112 µm, 125 µm.

The inner winding IW may be disposed within the outer winding OW, as illustrated, on a given surface of the card body CB (or layer of a multi-layer inlay substrate). Alternatively, these two windings of the booster antenna BA may be disposed on opposite surfaces of the card body CB, substantially aligned with one another (in which case they would be "top" and "bottom" windings rather than "outer" and "inner" windings. The two windings of the booster antenna BA may be coupled in close proximity so that voltages induced in them may have opposite phase from one another. The coupler coil CC may be on the same surface of the card body CB as the outer and inner windings.

The turns of the outer winding OW and inner winding IW of the booster antenna BA may be at a pitch of 0.2 mm (200 µm), resulting in a space of approximately one wire diameter between adjacent turns of the outer winding OW or inner winding IW. The pitch of the turns of the coupler coil CC may be substantially the same as or less than (stated otherwise, not greater than) the pitch of turns of at least one of the outer winding OW and inner winding IW—for example 0.15 mm (150 µm), resulting in space smaller than one wire diameter between adjacent turns of the coupler coil (CC). Self-bonding copper wire may be used for the booster antenna BA. The pitch of both the outer/inner windings OW/IW and the coupler coil CC may both be approximately 2× (twice) the diameter of the wire (or width of the conductive traces or tracks), resulting in a spacing between adjacent turns of the spiral(s) on the order of 1 wire diameter (or trace width). The pitches of the outer winding OW and the inner winding IW may be substantially the same as one another, or they may be different than each other.

More turns of wire for the coupler coil CC can be accommodated in a given area—for example, by laying two "courses" of wire, one atop the other (with an insulating film therebetween, if necessary), in a laser-ablated trench defining the area for the turns of the coupler coil CC.

Reference is made to FIG. 15B, below, which describes a similar "quasi-dipole" configuration for the module antenna MA of the antenna module AM.

Some Coupler Coil (CC) Configurations

FIG. 1C is a diagram illustrating schematically some antenna components of a booster antenna (BA), at least one of which is a "true" coil having a cross-over. Generally, geometrically speaking, if a coil has at least one complete 360° turn, and is connected to another component that is disposed either outside of or inside of the coil—and there are no vias through the substrate (card body CB) for making connections from inside the coil to the outside thereof—the pattern of the coil will cross-over itself so that the two ends of the coil can connect with two terminals of the other component, as shown. In this figure, both of the components are true-coils. As used herein, a "true" coil may be defined as a coil, loop or spiral of wire (or other conductor) having two ends, extending at least approximately 360°, substantially enclosing an area, and crossing over itself (either from the outside in, or from the inside out).

FIG. 1D illustrates a booster antenna BA comprising an inner winding IW and an outer winding OW (as disclosed herein, together the inner winding IW and outer winding OW may constitute a card antenna CA), an "open loop" coupler coil CC at the position of the antenna module AM, and an "extension" which may be referred to herein as an "antenna extension" or "extension antenna" or "extension coil" EA. See also U.S. Ser. No. 13/600,140 filed 30 Aug. 2012 (now US 20130075477 published Mar. 28, 2013, incorporated by reference herein.

The booster antenna BA comprises a card antenna CA component, a coupler coil CC component and an extension antenna EA component. These components may be formed (embedded in the card body CB as one continuous embedded coil. The coupler coil CC is in the form of an open loop ("horseshoe"), rather than a loop.

Note that both of the outer winding OW and inner winding IW may be enlarged to form the coupler coil CC and substantially fully encircle the antenna module AM in what may be referred to as the "coupling area" of the card body CB. The free ends (a, 0 of the card antenna CA are shown at the right edge of the card body CB.

In this example, the extension antenna EA has one end extending from an end of the coupler coil CC, and another end extending from an end of the card antenna CA, and exhibits a cross-over. The extension antenna EA (or extension coil, or extension loop) is disposed so as to have a portion adjacent two sides (or approximately 180°) of the coupler coil CC. The extension antenna EA component is shown as an "extension" of the inner winding IW, comprising some turns of wire in a spiral pattern disposed near the antenna module AM in the left hand side of the top (as viewed) portion of the card body CB. The extension antenna EA may be disposed outside of, but near the coupling area (144) of the card body CB.

In this example, the coupler coil CC component of the booster antenna BA does not need to be a "true" coil, it does not need to have a cross-over. Rather, it may be a horseshoe-shaped "open" loop which substantially fully, but less than 360°, encircles the coupling area (labeled "AM") for inductive coupling with the module antenna MA of the antenna module AM.

In this example, the card antenna CA is a true coil, in the form of a spiral extending around the peripheral area (142) of the card body CB, and exhibits a cross-over.

The extension antenna (or extension coil) EA has two ends—one end is connected to the coupler coil CC, the other end is connected to the card antenna CA. The extension antenna EA may be formed as a spiral of wire embedded in the card body CB, contiguous with one or more of the card antenna CA and coupler coil CC, and is a true coil which exhibits a cross-over, and contributes to the inductive coupling of the booster antenna BA. The extension antenna EA is shown as being disposed only in the upper half of the card body CB, but it may extend to the lower half of the card body CB.

FIGS. 1E, 1F, 1G are diagrams of some coupler coil (CC) configurations for a booster antenna (BA). The coupler coil CC may be configured in various ways to increase a coupling factor between the coupler coil CC component of the booster antenna BA and the module antenna MA of the antenna module AM.

FIG. 1E shows a configuration of a conventional (typical) coupler coil CC in the form of a flat coil having number (such as ten) of turns, and two ends c and d. The booster antenna BA extending around the periphery of the card body is illustrated with only one turn, for illustrative clarity. The coupler coil CC may have, for example, approximately 10 turns of wire, in a flat spiral pattern.

FIG. 1F shows a coupler coil CC having inner and outer windings. Starting at one end "d" of the coupler coil CC, an inner winding iw (or inner portion IP, shown in dashed lines) has approximately 5 turns of wire and is wound (laid) in a counter clockwise direction from outside-to-inside, then jumps over itself (over previously laid turns) at a "crossover", and an outer winding ow (or outer portion OP, shown in solid lines) has approximately 5 turns of wire and is wound (laid) in a counter clockwise direction from inside-to-outside, then terminates at the other end "c". It should be understood that the coupler coil CC could be wound from "c" to "d", rather than from "d" to "c", and other variations may be implemented. The inner and outer windings iw and ow may have substantially the same number of turns, five each. Fewer turns are shown in the figure, for illustrative clarity.

FIG. 1G shows a magnetically conductive patch (e.g. ferrite) MP which may improve the coupling. The patch MP could e.g. be placed onto the coupling coil CC (between the module antenna MA and the coupling coil CC). Instead of using the whole area (module and coupling coil) it could also be possible to create only a ring of conductive material MP around the coupler coil which is outside of the module recess area covering the wires of the coupling coil only. The card antenna CA component of the booster antenna BA, which extends around the periphery of the card body is shown as having only one turn, for illustrative simplicity. It should be understood that the card antenna CA component may have several turns, and may include an inner winding IW and an outer winding OW (FIG. 1D).

Some Configurations of Booster Antenna (BA) Components

FIGS. 1H-1M show various exemplary configurations of a booster antenna BA.

The booster antenna BA may comprise various antenna components, such as (but not limited to):

a card antenna CA component extending around a periphery of the card body (CB, not shown, see FIG. 1) for coupling with an external contactless reader (see FIG. 1),
the card body CA component may comprise an outer winding OW and an inner winding IW (see FIG. 1B)
a coupling coil CC component disposed at an interior position (area) of the card body (CB), corresponding with a position for the antenna module (AM, not shown) for coupling with the module antenna (MA, not shown) of the antenna module (AM), and
an extension antenna (or extension coil) EA component.

The components CA, CC, EA of the booster antenna BA may be interconnected, as shown. The components of the booster antenna may comprise wire which is laid in a continuous path, from a starting point "a" to a finishing point "f" (or vice-versa). In some of the examples, the "sense" or laying direction (either clockwise CW, or counter clockwise CCW) of the various components may be the same, or different than (e.g., opposite from) the sense of other components. Some of the components may be "true coils" which may form a complete loop having a crossover "x" and contributing to the inductive coupling of the booster antenna BA. The overall booster antenna BA may have two or more crossovers "x". The various components may each be shown with only a few turns, for illustrative simplicity, and are generally laid in a flat rectangular spiral pattern having a number (generally two or more) "turns". One of the turns, or a portion thereof, may be an "innermost" turn of the booster antenna component. Another of the turns, or a portion thereof, may be an "outermost" turn of the booster antenna component.

Some characteristics and advantages of the various configurations shown in FIGS. 1H-1M may include, but are not limited to . . .

altering the Q-factor of the booster antenna/module antenna system by altering the winding direction of one or more components (elements) making up the booster antenna BA winding one or more turns of the coupler coil CC in the opposite direction to the majority of the turns, with no increase in DC resistance, but counter-winding may broaden the resonance curve and reduce Q-factor, and there may be no power loss as would be the case if a resistor introduced winding one or more turns of the booster antenna BA in the opposite direction to the majority of the turns winding one or more turns of the extension antenna EA in the opposite direction to the other extension antenna EA turns, or winding the entire extension antenna EA in the opposite direction to the inner and outer windings (IA, OW) of the booster antenna BA.

Figure 1H:
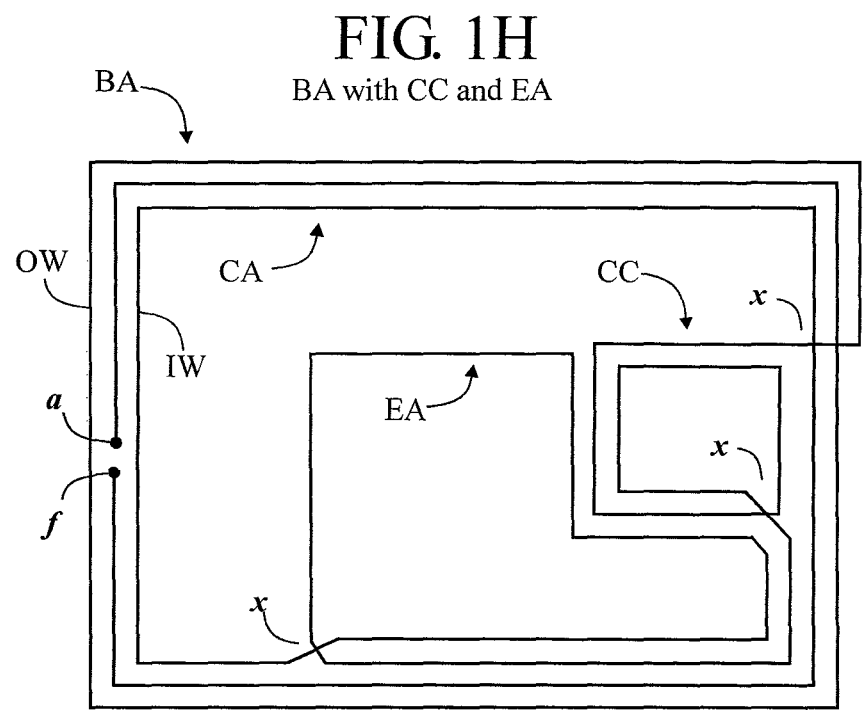

FIG. 1H shows a configuration for the booster antenna BA wherein from the starting point "a", the wire commences being laid in a clockwise CW direction forming outer windings (OW, compare FIG. 1B) of the card antenna CA (from an innermost turn to an outermost turn), then crosses over "x" itself and heads towards the interior of the card body (CB) whereat the coupler coil CC may be formed with turns of wire laid in the counter clockwise CCW direction (from an outermost turn to an innermost turn), then crosses over "x" itself and heads towards the periphery of the card body (CB) for laying the extension antenna EA in a clockwise CW direction (from an outermost turn to an innermost turn), then the wire crosses over then crosses over "x" itself and heads towards the periphery of the card body (CB) for laying the inner windings (IW, compare FIG. 1B) of the card antenna CA which may be laid in a clockwise CW direction (from an innermost turn to an outermost turn), until the finishing point "f". the entire sequence may be performed in reverse, starting at the point "f" and finishing at the point "a".

Figure 1I:
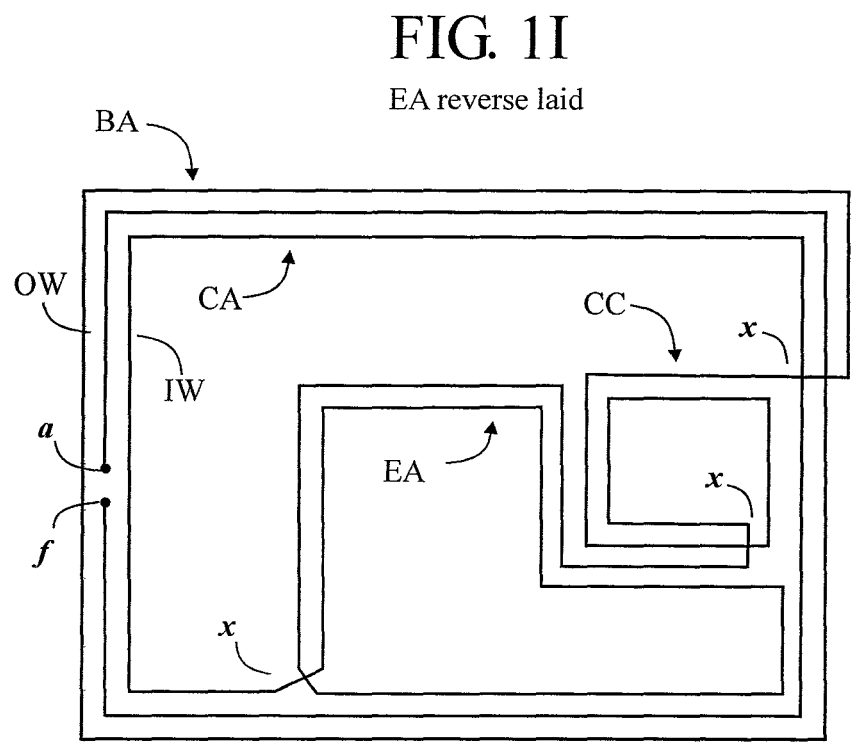

FIG. 1I shows a configuration for the booster antenna BA wherein from the starting point "a", the wire commences being laid in a clockwise CW direction forming outer windings (OW, compare FIG. 1B) of the card antenna CA (from an innermost turn to an outermost turn), then crosses over "x" itself and heads towards the interior of the card body (CB) whereat the coupler coil CC may be formed with turns of wire laid in the counter clockwise CCW direction (from an outmost turn to an innermost turn), then crosses over "x" itself and heads towards the periphery of the card body (CB) for laying the extension antenna EA in a counter clockwise CCW direction (from an outermost turn to an innermost turn), then the wire crosses over then crosses over "x" itself and heads towards the periphery of the card body (CB) for laying the inner windings (IW, compare FIG. 1B) of the card antenna CA which may be laid in a clockwise CW direction (from an innermost turn to an outermost turn), until the finishing point "f". the entire sequence may be performed in reverse, starting at the point "f" and finishing at the point "a".

Figure 1J:
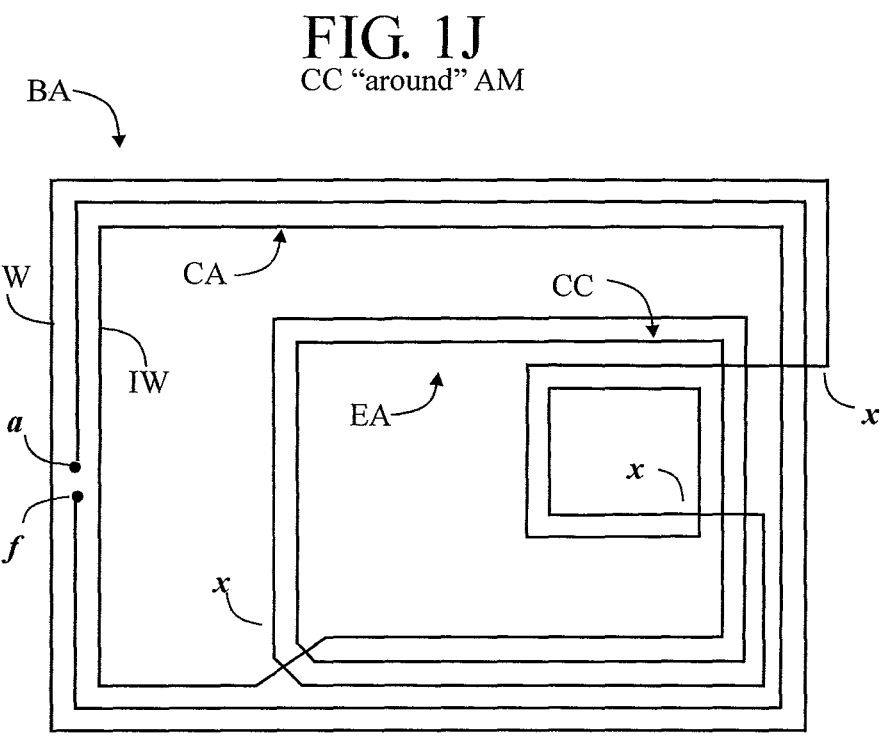

FIG. 1J shows a configuration for the booster antenna BA wherein from the starting point "a", the wire commences being laid in a clockwise CW direction forming outer windings (OW, compare FIG. 1B) of the card antenna CA (from an innermost turn to an outermost turn), then crosses over "x" itself and heads towards the interior of the card body (CB) whereat the coupler coil CC may be formed with turns of wire laid in the counter clockwise CCW direction (from an outermost turn to an innermost turn), then the wire crosses over "x"

itself and heads towards the periphery of the card body (CB) for laying the extension antenna EA in a clockwise CW direction (from an outermost turn to an innermost turn), then the wire crosses over "x" itself and heads towards the periphery of the card body (CB) for laying the inner windings (IW, compare FIG. 1B) of the card antenna CA which may be laid in a clockwise CW direction (from an innermost turn to an outermost turn), until the finishing point "f". the entire sequence may be performed in reverse, starting at the point "f" and finishing at the point "a".

Figure 1K:
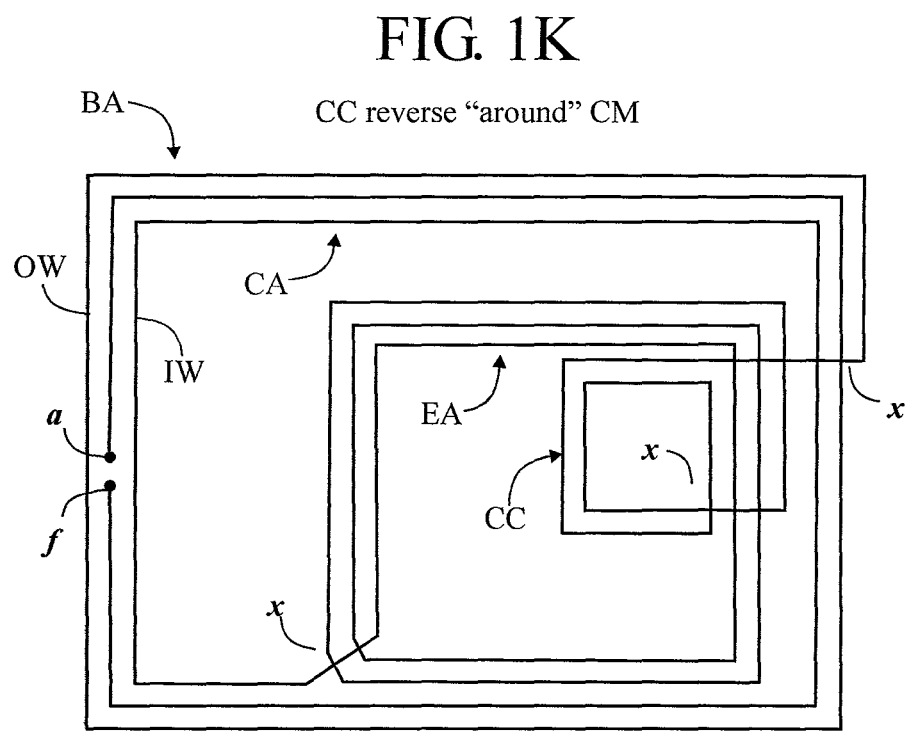

FIG. 1K shows a configuration for the booster antenna BA wherein from the starting point "a", the wire commences being laid in a clockwise CW direction forming outer windings (OW, compare FIG. 1B) of the card antenna CA (from an innermost turn to an outermost turn), then crosses over "x" itself and heads towards the interior of the card body (CB) whereat the coupler coil CC may be formed with turns of wire laid in the counter clockwise CCW direction (from an outermost turn to an innermost turn), then the wire crosses over "x" itself and heads towards the periphery of the card body (CB) for laying the extension antenna EA in a counter clockwise CCW direction (from an outermost turn to an innermost turn), then the wire crosses over "x" itself and heads towards the periphery of the card body (CB) for laying the inner windings (IW, compare FIG. 1B) of the card antenna CA which may be laid in a clockwise CW direction (from an innermost turn to an outermost turn), until the finishing point "f". the entire sequence may be performed in reverse, starting at the point "f" and finishing at the point "a".

Figure 1L:
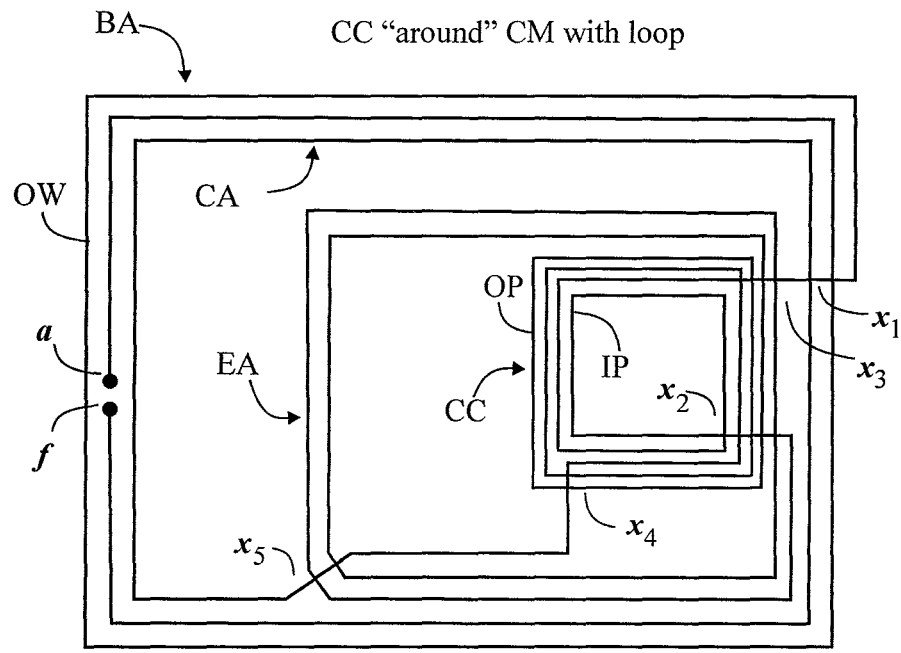

FIG. 1L shows a configuration for the booster antenna BA wherein from the starting point "a", the wire commences being laid in a clockwise CW direction forming outer windings (OW, compare FIG. 1B) of the card antenna CA (from an innermost turn to an outermost turn), then crosses over "x" (x1) itself and heads towards the interior of the card body (CB) whereat an inner portion IP of the coupler coil CC may be formed with turns of wire laid in the counter clockwise CCW direction (from an outermost turn to an innermost turn), then the wire crosses over "x" (x2) itself and heads towards the periphery of the card body (CB) for laying the extension antenna EA in a clockwise CW direction (from an outermost turn to an innermost turn), then the wire crosses over "x" (x3) itself for laying an outer portion OP of the coupler coil CC with turns of wire laid in the clockwise CW direction (from an outermost turn to an innermost turn), then the wire crosses over "x" (x4, x5) itself and heads towards the periphery of the card body (CB) for laying the inner windings (IW, compare FIG. 1B) of the card antenna CA which may be laid in a clockwise CW direction (from an innermost turn to an outermost turn), until the finishing point "f". the entire sequence may be performed in reverse, starting at the point "f" and finishing at the point "a".

Figure 1M:
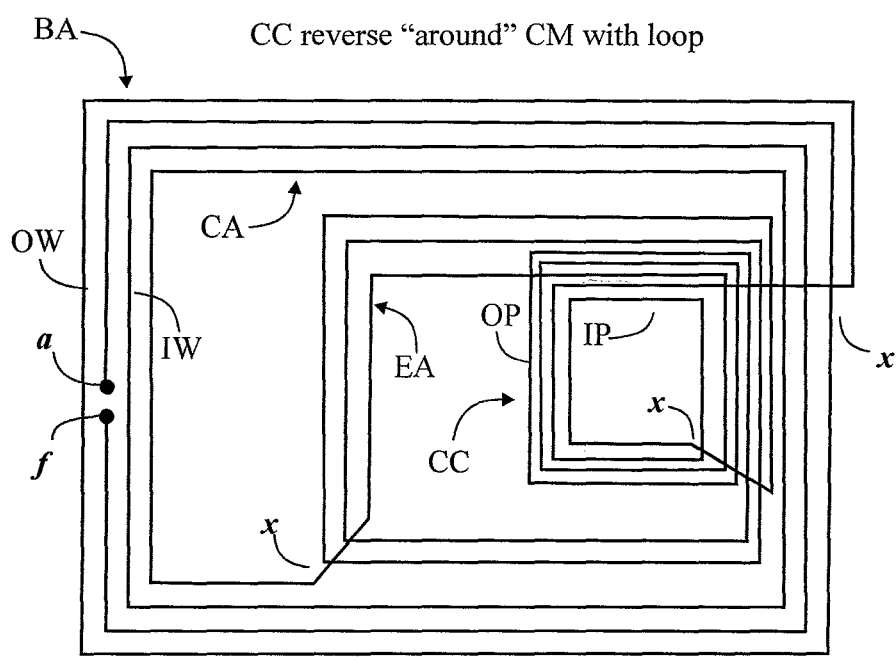

FIG. 1M shows a configuration for the booster antenna BA wherein from the starting point "a", the wire commences being laid in a clockwise CW direction forming outer windings (OW, compare FIG. 1B) of the card antenna CA (from an innermost turn to an outermost turn), then crosses over "x" itself and heads towards the interior of the card body (CB) whereat an inner portion IP of the coupler coil CC (compare "iw", FIG. 1F) may be formed with turns of wire laid in the counter clockwise CCW direction (from an outermost turn to an innermost turn), then the wire crosses over "x" itself for laying the extension antenna EA in a counter clockwise CW direction (from an outermost turn to an innermost turn), then the wire crosses over "x" itself for laying an outer portion OP of the coupler coil CC (compare "ow", FIG. 1F) with turns of wire laid in the counter clockwise CCW direction (from an outermost turn to an innermost turn), then the wire crosses over "x" itself and heads towards the periphery of the card body (CB) for laying the inner windings (IW, compare FIG. 1B) of the card antenna CA which may be laid in a clockwise CW direction (from an innermost turn to an outermost turn), until the finishing point "f". the entire sequence may be performed in reverse, starting at the point "f" and finishing at the point "a".

The following table presents the "laying" senses of the various components CA (OW, IW), CC, EA of the booster antenna BA. (The OW and IW may have the same sense as one another.)

|  | OW of CA | CC | EA | IW of CA |
| --- | --- | --- | --- | --- |
| FIG. 1H | CW | CCW | CW | CW |
| FIG. 1I | CW | CCW | CCW | CW |
| FIG. 1J | CW | CCW | CW | CW |
| FIG. 1K | CW | CCW | CCW | CW |
| FIG. 1L | CW | (IP) CCW (OP) CW | CW | CW |
| FIG. 1M | CW | (IP) CCW (OP) CCW | CCW | CW |

Although not specifically directed to the antenna module AM, the configurations of and improvements to booster antennas disclosed herein may provide for improved coupling of the booster antenna BA with the antenna module AM, and consequent improvements in "read distance" and "activation distance".

According to some embodiments (examples) of the invention, a booster antenna (BA) may comprise a card antenna (CA) component disposed around a periphery of a card body (CB) and comprising an inner winding (IW) and an outer winding (OW); a coupler coil (CC) component disposed at a location for an antenna module (AM) on the card body (CB); and an extension antenna (EA) component; and may be characterized in that: at least one of the components is laid having a sense which is opposite one or more of the other components. At least some of the components may have innermost and outermost turns; at least one of the components is laid from an innermost turn to an outermost turn; and at least another of the components is laid from an outermost turn to an innermost turn.

Embedding and Bonding

FIG. 2 shows the cross-section of a typical coil (booster antenna component) embedded on a substrate of a card body CB and shows the sequence used to scribe the 7 coil windings. A first (1st) turn may be laid or embedded in the card body CB, followed by a second (2nd) turn, followed by a third (3rd) turn, followed by a fourth (4th) turn, followed by a fifth (5th) turn, followed by a sixth (6th) turn, followed by the final seventh (7th) turn. Evidently, when the second and subsequent turns are being embedded, the process can be resisted by the first and other previously-embedded turns.

A method is disclosed in U.S. Ser. No. 14/020,884 for controlling at least one of the downward force which is exerted by an embedding tool and a power of ultrasonic vibration while embedding the wire in the surface of a substrate. Various benefits may be obtained, such as improved embedding of the wire, more consistent embedding of the wire, and reduced pitch (closer spacing) of turns of the wire in a booster antenna BA component (for example) which may allow for more turns of wire (hence, more inductance) in a given space. (such as, but not limited to the peripheral area 146 of the card body CB).

FIG. 2A shows a device for embedding wire (such as for a booster antenna (BA) in a substrate (card body CB) may comprise: an ultrasonic transducer; a sonotrode; a capillary with wire exiting (feeding out) from one end thereof; and means for urging the device downward with a given force.

The means for urging the device for embedding downward may comprise a linear actuator comprising a movable part with at least one coil and a fixed part having magnets. The downward force imparted to the capillary may be proportional to current flowing through the coil(s) of the movable part. For the purposes of this invention the downward motion of the device will be along an axis defined as the "z-axis", set perpendicular to the plane of the card body (CB). The plane of the card body (CB) will be denoted the "x-y plane" with the device moving across the x-y plane along an "x-axis" and a "y-axis" set perpendicular each other.

The embedding device may be based on a controlled sonotrode. The device has a moving stage control system allowing downward force control.

An additional actuator (not shown), such as a pneumatic piston may be provided to apply an upward force to the capillary when current flow to the coil(s) is turned off, such as at the commencement and termination of the embedding operation.

According to an aspect of the invention, a force profile may be established so that the force of embedding can be controlled based on position, for example (but not limited to) applying a first force (f1) at the beginning of embedding, a second force (f2) during embedding a first turn of a booster antenna BA, a third force (f3) during embedding subsequent turns of the booster antenna BA, etc. An exemplary force profile is presented in FIG. 2B.

During embedding of the wire, either or both of the ultrasonic power provided by the sonotrode and the downward force exerted by the capillary may be controlled, and varied at different positions along the path of embedding the wire, to facilitate embedding. For example, power or force may be changed at turns (for example at the corner of the card body CB when embedding a rectangular spiral shaped card antenna CA). Better control over embedding may be achieved. Closer spacing of turns of a given booster antenna BA coil component (IW, OW, CC, AE) may be achieved.

FIG. 2B illustrates an example of force profile for embedding a series of consecutive turns of a booster antenna (BA) into the substrate of a card body (CB). (Ultrasonic power may be profiled in a similar manner.)

The downward force being applied, via the capillary, during embedding, may be increased or reduced, as desired, at any given location (position) on the substrate (card body CB) during embedding of wire, such as for the booster antenna (BA), including the peripheral card antenna (CA) portion thereof and the inner coupler coil (CC) thereof.

Typical forces may be in the range of a few hundred grams (a few Newtons). Given a typical sonotrode diameter of approximately 4 mm this gives typical pressures or the order of a few hundred kPa. The downward force being applied, via the capillary, during embedding, may be reduced to zero where the wire has to "jump over" previously-embedded wires. During embedding, control may be switched between downward force and vertical position of the capillary. The invention enables a high degree of control over the embedding process. During embedding, at any point in the X-Y plane of the card body (CB), several parameters can be controlled and varied. These include: the speed of movement over the entire device in the x-y plane, the power fed to the sonotrode, the height of the sonotrode above the sample (for example when performing a jump), the downward force exerted by the sonotrode during embedding. Of course, when making a cross-over, force may be reduced to nearly zero, and the ultrasonic power may (or may not) be turned off.

Controlling Bonding of a Wire

It may be necessary to bond the wire to bond pads on the card body, or on the RFID chip. For example, when bonding a wire of an antenna coil to a module tape MT for an antenna module AM, or wire bonding the RFID chip to the module tape MT.

Bonding of a wire to bond pads of a chip module CM or to contact pads of interconnects on the module tape MT may be realized using a thermode, which essentially welds the wire to the pad. The integrity of the bonds is of course important, and can be monitored with an optical inspection system. During bonding, the wire is deformed, and may exhibit a diameter which is (for example) approximately 30% smaller than its pre-bond diameter. A typical wire being bonded may have an initial diameter of 112 μm. Wires having smaller (or larger) diameters may be wire bonded. Wire having insulating (or other non-conductive) coatings may also be wire bonded.

The position of the thermode may be measured, with micrometer precision, to achieve a deformation of the wire in a range of values centered around a target value representative of (for example) a 30% reduction in the diameter of the wire. The position of the thermode may be monitored to ensure that wires which are bonded are in this range, and when they are not, the thermode may be cleaned, or the process re-calibrated to ensure successful subsequent bonds.

FIG. 2C illustrates a wire bonder comprising a thermode, and means for measuring position, and also shows a wire (pre-deformed) being bonded to a pad, and the resulting bonded wire which is deformed (squished). By precisely measuring the deformation of the wire as it is being bonded, the quality of the resulting bond can be inferred, with a high degree of confidence. As the thermode becomes dirty, the measured thickness may change, and the thermode can be cleaned.

According to some embodiments (examples) of the invention, a method of embedding a wire in a surface of a substrate may comprise: with an embedding tool, feeding wire onto the surface of the substrate while applying a given downward force and while imparting an ultrasonic vibration to the embedding tool; and controlling at least one of the downward force which is exerted by the embedding tool and a power of the ultrasonic vibration while embedding the wire in the surface of the substrate. The embedding tool may comprise a linear actuator for urging at least a portion of the embedding tool downward. The method may further comprise establishing a force profile and applying different forces at different positions, during the embedding process, in a controlled manner. The method may further comprise while controlling the force, controlling a power of the ultrasonic vibration imparted to the embedding tool. Different downward forces may be applied by the embedding tool at different positions being embedded. Different downward forces may be applied depending upon which of a plurality of turns is being embedded.

According to some embodiments (examples) of the invention, a method of bonding wires to pads may comprise using a thermode; and may be characterized by: precisely measuring deformation of the wire as it is being bonded. It may be determined that bonding is complete when a wire is deformed to have a diameter approximately 30% smaller than its pre-bond diameter.

Support Structures (SS, DS, WC) for Winding the Module Antenna (MA)

According to some embodiments of the invention, a support structure SS (or dam structure DS, or winding core WC) may be mounted to the module tape MT, and may serve as a winding core WC upon which the module antenna MA may be wound. The winding core WC may be mounted to the same side of the module tape MT as the chip CM, and may surround the chip CM, so that the winding core WC may also act as a dam for containing encapsulant GT covering the chip CM. The chip may CM may be wire bonded or flip chip mounted to the module tape MT, and the encapsulant will also protect these connections. The module antenna MA may be wound on the winding core WC, after it is mounted to the module tape MT, either before of after encapsulating the chip, using any suitable coil winding technique.

U.S. Pat. No. 6,378,774 (2002; Toppan), which may be referred to as "Toppan '774", incorporated by reference herein, discloses a smartcard comprising an IC module and an antenna for non-contact transmission. The IC module has both a contact-type function and a non-contact-type function.

The IC module has a first coupler coil (8), the antenna has a second coupler coil (3). The first and second coupler coils are disposed to be closely coupled to each other, and are coupled in a non-contact state by transformer coupling.

Toppan '774 discloses various ways of forming the first coupler coil (8). FIGS. 12 and 13 disclose winding the wire around the seal resin 16, i.e. using the seal resin 16 as winding core. FIG. 14 shows winding the coil 8 on a coil frame 17 having two flanges—essentially, a bobbin. It is apparent that the coil 8 may be wound around the frame 17 "offline" (which may provide several manufacturing advantages), and that the resulting assembly of coil wound on frame may later be mounted (and connected) to the module substrate 9. FIG. 15 shows that the wire is wound around the module substrate 9.

U.S. Ser. No. 13/594,895 filed 27 Aug. 2012 (US 20130062419 published 14 Mar. 2013) discloses various techniques for winding a module antenna MA around a support structure disposed on the module tape MT around the chip CM. The support structure may serve both as a winding core WC upon which the module antenna MA may be wound, and as a dam structure DS for containing encapsulating material (glob-top) GT applied onto the chip CM and its connections.

FIG. 3 shows that a dam structure (or simply "dam") DS 320 may be disposed on the underside (top, as viewed) of a module tape MT 302, and affixed thereto (such as with an adhesive). (The module tape MT 302 is illustrated inverted in contrast with FIG. 1, the contact pads CP 304 being on the bottom, as viewed, in this figure.)

The dam DS 320, which may be referred to as a "winding core" (WC) or a "support structure" (SS) or simply as a "ring", has an elongate tubular body portion B and two opposite open ends 320a and 320b, and may be cylindrical (as illustrated) or substantially rectangular in cross-section (or any other suitable shape). One end 320b of the body portion B is mounted to the module tape MT, using a suitable adhesive, the other end 320a is a free end (un-mounted).

The dam DS may be formed of a plastic material such as Mylar, having a thickness 't' of approximately 200 μm. The inner diameter (ID) of the dam DS may be approximately 7 mm, the outer diameter (OD) of the dam DS may be approximately 8 mm.

Although shown as round (cylindrical), the cross-section of the dam DS may be substantially rectangular, or other suitable shape (for winding an module antenna MA thereupon), in which case "ID" would be inner dimension, and "OD" would be outer dimension of the body portion B.

A module antenna MA 330 having several layers and turns of self-bonding wire may be wound on the dam DS. The dam DS should have a height 'h' which is at least as high as the resulting module antenna MA, such as approximately 350 μm. The dam DS may be impregnated with ferrite to increase the inductance of the module antenna MA. A fixture (not shown) may be used to support the DS during winding the module antenna MA. The resulting interim product comprising a module antenna MA and dam DS mounted to a module tape MT, may be considered to be a subassembly for an antenna module AM. The two ends a, b of the module antenna MA are shown, extending outwardly, to bond pads BP 306 on the surface of the module tape MT.

An RFID chip CM 310 may be subsequently be mounted to surface of the module tape MT, within the interior of the dam DS and wire-bonded from its terminals CT to bond pads BP on the underside of the module tape MT. Then, glob-top potting compound GT (not shown) may be applied within the interior of the dam DS to protect the chip CM and wire bonds, resulting in a substantially complete antenna module AM 300. The RFID chip CM and module antenna MA may be overmolded by a mold mass MM (not shown, see FIG. 4F), for protecting the chip CM and module MA components, and respective interconnections to bond pads BP on the module tape MT, completing the antenna module AM.

FIG. 3A shows that at least one slot S may be provided through the body portion B of the dam DS (winding core WC) to accommodate corresponding at least one end (a, b) of the module antenna MA wire (not shown) passing therethrough, inwardly, from external to the body portion B to the "interior" space enclosed by the dam DS. One or both ends (a, b) of the module antenna MA may extend inwardly, through one or two slots in the body portion B (two ends can extend through a single slot, at different levels) so that the ends (a, b) terminate in an area on the module tape MT enclosed by the dam DS. The slot(s) S should be sized to (wide enough) accommodate the diameter of the antenna wire passing therethrough. Having the ends of the antenna wire terminate interior to the dam DS has the advantage that they can be protected by the same glob-top GT that protects the chip CM (see FIG. 4E).

Printing the Dam Structure (DS)

The dam structure DS is an example of a support structure SS upon which the module antenna MA may be wound. (Other support structures are disclosed herein, for example the winding cores WC of FIG. 4A, 11A, 11B, 11C.) As mentioned above, the dam structure DS may be formed of a plastic material such as Mylar, having a thickness 't' of approximately 200 μm.

The dam structure DS, and other support structures (SS, WC) described herein may be formed, such as on the on the module tape (MT) or on a sacrificial substrate, by dispensing a thixotropic fluid using an auger screw pump and curing with UV light, substrate heating or using a variable frequency microwave curing method. The height, width and perimeter of the dam may be defined by the footprint of the wire bonded die or flip chip and the geometry of the module antenna (MA). The dam structure (DS) can be a variety of shapes, typically forming a closed loop, such as round, oval or rectangular. Alternatively the dam structure (DS) can be made by rapid prototyping and additive manufacturing technologies (e.g. 3D printing). These processes are all "additive", in that the support structure (SS, DS, WC) is built up on the surface of the module tape (MT). The dam structure (DS) may be formed directly on the module tape (MT) or formed independently and then placed on and attached to the module tape (MT) by means of an adhesive.

The dam structure (DS) may be formed to a height of approximately 250 μm by repeated deposition of a high viscosity epoxy via a nozzle, needle or other liquid placement system. The dam structure (DS) may be subsequently cured thermally or by UV light exposure. The glob top (GT) filling compound or similar may be used to fill in the dam either partially, up to the dam level or slightly above the dam level. The lid (LD) of thickness approximately 75 μm may then be attached to the dam structure (DS) and or glob top (GT) to facilitate the coil winding process. A flange (F) section of the lid (LD) protrudes over the dam structure (DS) to hold the windings of the antenna in place during coil winding. The antenna wire may be a self-bonding insulated copper wire or alloy wire which adhesively bonds to the layers of the coil by the application of hot air. The lid (LD) with protruding flange (F) can be left in place after coil winding or removed yielding an overall antenna module (AM) height in the range approximately 450 μm-540 μm.

The Antenna Module

FIGS. 4, 4A-4F illustrate a winding core WC 420 upon which a module antenna MA may be wound. The winding core WC, which may be referred to as a "support structure", may be made of a plastic material, such as glass fiber reinforced PPS (Polyphenylene Sulfide). As with the dam structure DS 3220 (FIGS. 3, 3A), the winding core WC may be in the form of a ring, or tubular structure, having a circular or substantially rectangular cross-section, and two opposite open ends 420a, 420b, one of which ends will be secured (affixed) to the underside of a module tape MT, the other of which is a free end (un-mounted).

The winding core WC comprises a main body portion B 422, and a flange portion F 424 extending radially (to the left or right, as viewed) outward from the top (as viewed) free end of the body portion B. (This is in contrast with the dam DS 3220 in which both ends are essentially the same as one another.)

The flange F serves to stiffen the body portion B, and also to constrain (contain) the windings of the module antenna MA as it is being wound. By way of analogy, when installed on the module tape MT, the flange F serves as one flange of a "bobbin", the surface of the module tape MT serves as the second flange of the "bobbin". The module antenna MA will be wound in a coil winding area between the two "bobbin" flanges. FIG. 4 shows a portion of the module tape MT in phantom (dashed lines), and indicates the coil winding area formed between the flange F and the underside surface of the module tape MT. (The module tape MT may be epoxy-glass, copper-clad on both sides, etched to form bond pads BP on the underside, contact pads CP on the face-up side.)

The winding core WC 420 may have the following dimensions (approximate):
  thickness t of the body portion B=~0.85 mm
  width fw of the flange F=~0.5 mm
  outer diameter OD of the winding core WC (including flange F)=~9.4 mm
  inner diameter ID of the winding core WC=~6.7 mm
  height h1 of coil winding area=~0.250 mm
  height h2 of the flange F=~0.100 mm
  overall height h3 of the body portion B=~0.350 mm The coil winding area between the flange F and the surface of the module tape MT may accommodate (contain) approximately 20 turns of 112 μm diameter self-bonding wire for the module antenna MA. Wire having other diameters, greater or less than 112 μm may be used for the module antenna MA.

Figure 4A:
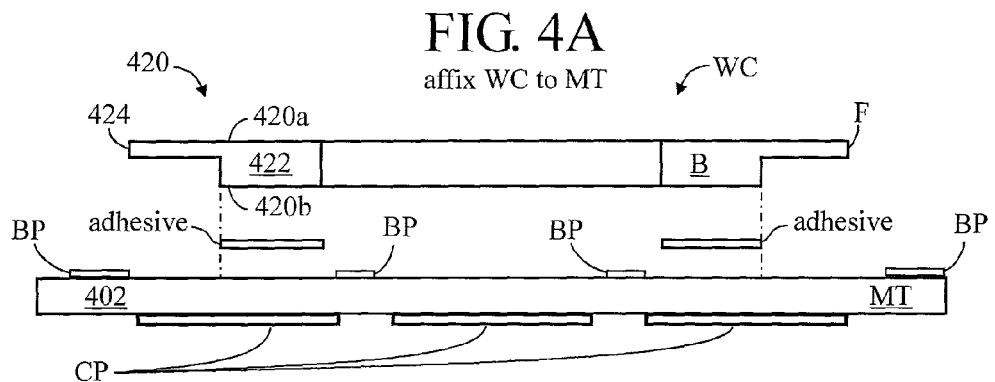

A process for forming a module antenna MA 430 on the winding core WC, further forming an antenna module AM is described with respect to FIGS. 4A-4F, and generally comprises:
  fix WC to MT
  wind MA on WC
  dispense adhesive for the CM
  place CM, cure adhesive (cure self-bonding wire)
  wire bonding (CM and MA to BPs on MT)
  glob top fill interior of WC (covering CM)
  overmold MA, WC, CM FIG. 4A illustrates a first step, wherein the winding core WC 420 is affixed to the module tape MT, such as with an adhesive. The adhesive may be applied to either of the end 420b of the winding core WC or the surface of the module tape MT. The final thickness of the adhesive may be approximately 30 μm. Alternatively, the winding core WC may be affixed to the module tape MT without adhesive, such as by spin-welding (a frictional welding technique). In a production process, a winding core WC (or simply "ring") may be placed at a plurality of locations along a 35 mm carrier tape in preparation for coil winding (winding of the module antenna MA on the winding core WC, or dam DS). This step may be referred to as "ring placement".

Contact pads CPs for a contact interface (with an external reader) are shown in on the face-up (bottom, as viewed) surface of the module tape MT, for a dual interface (DI) antenna module AM. However, is should be understood that the invention can be practiced in the context of an antenna module AM that operates solely in contactless mode, without such contact pads CP.

Figure 4B:
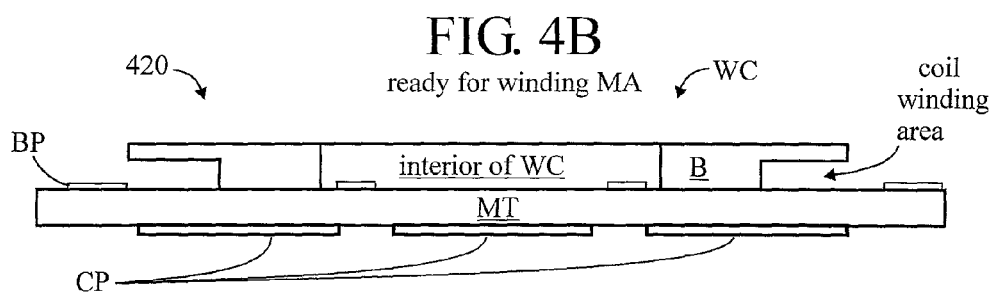

FIG. 4B illustrates the winding core WC affixed (assembled, mounted) to the module tape MT. A coil winding area is formed between the flange F and the surface of the module tape MT. In this and in subsequent figures, the adhesive is omitted, for illustrative clarity.

Figure 4C:
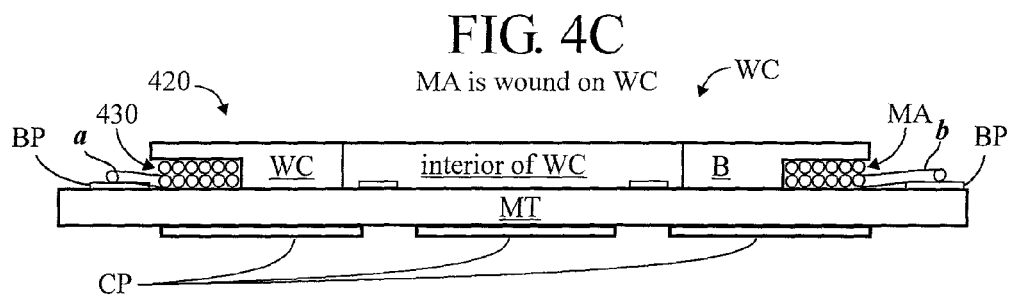

FIG. 4C illustrates a next step, wherein the module antenna MA 430 is wound on the winding core WC, around the body portion B, in the coil winding area between the flange F and the surface of the module tape MT. This may be done in the manner shown in and described with respect to FIG. 3 (using the "flyer" winding technique). Other coil winding techniques may be used to form the coils of the module antenna MA, some of which may be disclosed herein. The ends (a, b) of the module antenna MA, extending outward from the winding core WC, may be connected with respective bond pads BP in this step. Although not shown, the winding core 420 may have at least one slot (S), comparable to the at least one slot (S) shown in FIG. 3A, to allow the ends (a, b) of the module antenna MA to extend to bond pads (BP) located the inside of the winding core WC.

The coils (turns) of wire may not be so neatly arranged, as illustrated. Nevertheless, the coils (turns) of wire are constrained within the coil winding area by the flange F and the surface of the module tape MT, as shown. The module antenna MA may comprise a total of 20 turns (coils) of wire in the coil winding area, and two ends (a, b) extending over respective bond pads BP on the surface of the module tape MT.

Self-bonding (insulated) wire may be used to wind the coil of the module antenna MA. The thickness of the insulating layer on the wire may be increased (thicker) or decreased (thinner) to influence and control the capacitance of the coil. In addition, the material of the wire (it may be an alloy) may be selected to control its resistance.

Figure 4D:
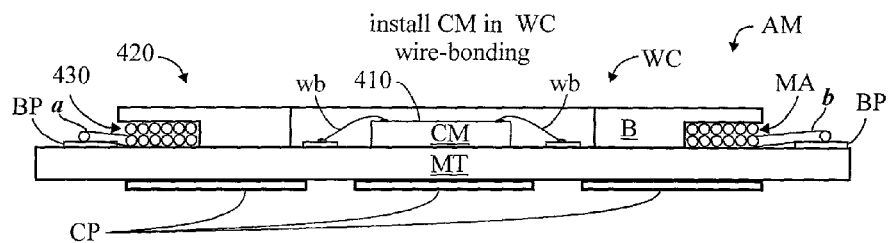

FIG. 4D illustrates a next step of forming the antenna module MA, wherein the chip CM is installed in the interior area of the winding core WC. Then, wire bonds wb (or WB) may be formed between the terminals of the chip CM and selected ones of the bond pads BP on the surface of the module tape MT. The ends (a, b) of the module antenna MA may also be bonded to the selected ones of the bond pads BP on the surface of the module tape MT in this step, if they were not previously connected.

Figure 4E:
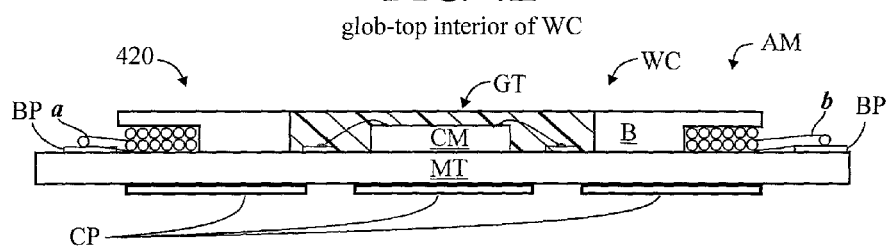

FIG. 4E illustrates a next step, wherein the interior area of the winding core WC may be filled with glob-top potting compound GT, or the like, to protect the chip CM and wire bonds wb. If heat is applied to cure the glob-top GT, the heat may also cause sticking together of the self-bonding wire forming the turns (coils) of the module antenna MA.

Figure 4F:
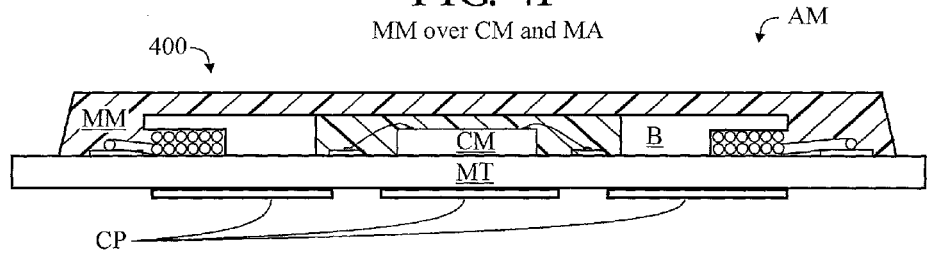

FIG. 4F illustrates a next step, wherein a mold mass MM may be formed (by overmolding) over the module antenna MA, the ends (a, b) of the module antenna MA, the winding core WC, the glob-top GT (including over the chip CM and wire bonds). The mold mass MM may extend over the outer edge (lip) of the flange F, slightly into the coil winding area (except where there is wire), which may helping retain the mold mass MM in place. To a lesser extent, the dam structure DS, which is also affixed at one end to the module tape MT, if used in lieu of the winding core WC, may also help to support (retain, capture) the mold mass MM.

The process of forming a module antenna MA for an antenna module AM described above may be contrasted with Toppan '774 which shows (FIG. 14) a coil wound around a coil frame or core having flanges mounted around the epoxy resin protecting the die and wire bonds to the die. For example, in the technique described above (FIGS. 4A-4F) . .

the winding core WC has only one flange (the other "virtual" flange at the opposite open end of the support structure being the surface of the module tape MT),
the tubular support structure (SS, WC, DS) may serve as a dam for containing later-applied glob-top GT resin,
the chip CM may be installed after the module antenna MA is formed upon the module tape MT (and the wire bonds to the chip CM also being performed after bonding the ends of the module antenna MA)

As an "interim product", a module tape MT (either single-sided or double-sided) may be supplied with a dam structure DS or winding core WC already affixed thereto, without the chip CM, and may (or may not) have a module antenna MA disposed or wound on the dam structure DS or winding core WC. Later, the chip CM may be installed on the module tape MT, connected (wire bonded or flip chip mounted) with the contact pads CP and module antenna MA, and encapsulated (and overmolded). The dam structure DS may constrain encapsulant to an area within the dam structure DS.

According to some embodiments (examples) of the invention, a module tape (MT) for a smartcard (SC) may comprise a dam structure (DS) for supporting a module antenna (MA) and constraining encapsulant to an area within the dam structure (DS). This (module tape plus dam structure) may be considered to be an "interim product". A module antenna (MA) may be included in the interim product. A chip CM may later be installed, connected and encapsulated.

FIG. 5 illustrates the antenna module AM (which, for example, could be used as the antenna module AM of FIG. 1 or of FIG. 4F, or other antenna modules described herein) installed in a recess R in a card body CB of a smartcard SC having a booster antenna BA having an outer portion at the periphery of the card body and a coupler coil CC at an interior area of the card body, such as surrounding the recess R. At least some (including all) of the turns of wire of the coupler coil CC may be embedded in the bottom of the recess R, to enhance the inductive (transformer) coupling between the coupler coil CC and the module antenna MA. Channels or a wide trench for receiving the turns of wire in the bottom of the recess R may be formed by laser ablation.

Antenna Modules Formed on 35 mm Chip Carrier Tape

The module antenna MA may be connected, by its two ends, to pads on the module tape MT which are external to (outside of, rather than inside of) the dam structure DS or winding core WC. Having the pads disposed outside of (external to) the winding core WC (or dam structure (DS) may facilitate some of the coil winding techniques disclosed herein. Nevertheless, other advantages (such as encapsulating the bonds) may accrue to having the pads disposed inside of (internal to) the winding core WC (or dam structure DS), and to this end a dam structure DS having at least one slot S so that the wire ends of the module antenna can be routed through the dam structure DS and connected to the module tape MT (or directly to the chip CM) within the interior area surround by the dam structure DS (and protected by encapsulant GT). Other means for connecting the module antenna MA to the RFID chip CM are disclosed herein, such as "connection bridges" which are discussed hereinbelow.

FIG. 6A illustrates a technique for forming one of many module antennas MA on a winding core WC on a 35 mm chip carrier tape (module tape MT). The two ends a, b of the module antenna MA wire may extend inward (such as though one or more slots in the winding core WC), for bonding to bond pads BP disposed on the module tape MT internal to the winding core WC. Alternatively, the winding core WC may be omitted, and the module antenna MA may be an air-core coil.

FIG. 6B illustrates a technique for forming one of many module antennas MA on a winding core WC on a 35 mm chip carrier tape (module tape MT). The two ends a, b of the module antenna MA wire may extend outward for bonding to bond pads BP disposed on the module tape MT external to the winding core WC. Alternatively, the winding core WC may be omitted, and the module antenna MA may be an air-core coil. The bond pads BP to which the two ends a, b of the module antenna MA are connected may be referred to as "antenna connection pads" (ACP).

FIGS. 6A and 6B show a square pad for receiving the chip CM. A number of smaller bond pads are shown inside the winding cores WC which are connected internally to the module tape to the contact pads CP (not shown) on the face-up side of the module tape MT, and various contact terminals of the chip may be wire bonded thereto, followed by glob-top filling of the winding core WC to protect the wire bonds.

Wire Bonding and Flip Chip Connecting the Chip (CM, IC)

U.S. Ser. No. 13/756,631 filed 1 Feb. 2013 (now US 20130140370 published 6 Jun. 2013) discloses antenna modules (AM) with both wire-bonded and flip-chip mounted chips (CM, IC).

FIGS. 7A and 7B reprise some prior art shown in FCOS™ Flip Chip On Substrate, by Infineon Technologies AG, which is directed to memory and microprocessor cards which are contact-type cards. Two "chip modules" are shown, comprising an IC chip (comparable to what has been referred to hereinabove as chip or chip module "CM") mounted to one side of a carrier substrate (FR4, PET) or tape (comparable to what has been referred to hereinabove as module tape MT), the IC chip (CM) being connected ISO contacts (comparable to what has been referred to hereinabove as contact pads CP) disposed on the other side of the substrate. The chip modules do not have antennas (module antenna MA) incorporated therewith. Mention is made of 6-contact and 8-contact chip modules—in other words, chip modules having 6 or 8 contact pads.

FIG. 7A shows a standard chip module cross section, having an IC chip (CM) mounted to one side of a FR4 substrate (referred to as "card body", compare module tape MT) and ISO contacts (contact pads, CP) on the other side of the substrate. The IC chip is wire bonded to the undersides of contact pads on the other side of the substrate. This is representative of a "single-sided" module tape (substrate) that has metallization which is patterned, on only one side of the tape. The IC chip and wire bonds are encapsulated.

FIG. 7B shows an FCOS™ card, having an IC chip mounted with a non-conductive adhesive (NCA) to one side of a PET substrate, and electrical chip connections which are bumps (rather than bond wires). The substrate has conductive traces on its bottom surface. The IC chip is flip-chip mounted to the conductive traces, which connect with conductive vias extending through the substrate to the underside of the ISO contacts. This is representative of a "double-sided" module tape (substrate) that has metallization which is patterned, on both sides of the tape.

As noted by Infineon, flip chip technology refers to a process of interconnecting semiconductor chips with carriers. The technology makes it possible to increase the packing density of elements on a carrier and allows for a more direct and more stable electrical interconnection compared to wire bond technology. Unlike wire bond technology, which has been almost exclusively used in smartcard modules up to now, the flip chip process involves flipping the chip, i.e. its electrical interconnections (pads) are turned toward the carrier side. In addition, there is no need for encapsulation (glob top). The electrical interconnection is made using conductive materials, so-called bumps, located between the chip contacts and carrier. The system is held together mechanically by means of an adhesive between the chip and carrier. As a result of the development of new materials for flip chip technology and optimization of the production process, it is now possible to use flip chip technology in the area of smartcards.

Some Problems being Addressed

A smartcard, chip card, or integrated circuit card (ICC) is any pocket-sized card with embedded integrated circuits. Smartcards are made of plastic, generally polyvinyl chloride, but sometimes polyethylene terephthalate based polyesters, acrylonitrile butadiene styrene or polycarbonate.

Contact smartcards have a contact area of approximately 1 square centimeter (0.16 sq in), comprising several gold-plated contact pads. These pads provide electrical connectivity when inserted into a reader, which is used as a communications medium between the smartcard and a host (e.g., a computer, a point of sale terminal) or a mobile telephone. Contactless smartcards, communicate with the external reader through RF induction technology, and require only proximity to an antenna to communicate. Dual-interface cards implement contactless and contact interfaces on a single card with some shared storage and processing. In the main, hereinafter, dual interface (DI, or DEF) cards are discussed. Reference is made to U.S. Pat. No. 6,378,774 (2002, Toppan) for an example of a DIF chip solution, and to US 2010/0176205 (2010, SPS) for an example of a two chip solution wherein one chip performs the contact function and the other chip performs the contactless function, both of which are incorporated by reference herein.

In the language of this patent application, the combination of an RFID chip (CM) on one side of a carrier substrate (MT) with contact pads (CP) on the other side of the substrate (MT), with the addition of an antenna (MA) disposed on the chip side of the substrate (MT) and connected with the RFID chip (CM) is termed "antenna module" ("AM").

The plastic card (card body CB) in which the chip module (such as Infineon) or antenna module (AM) is embedded is fairly flexible, and the larger the chip, the higher the probability that normal use could damage it. Cards are often carried in wallets or pockets, a harsh environment for a chip. It is therefore generally desirable that the chip modules (ISO-7816 only) or antenna modules (with the addition of ISO-14443) be as small as possible.

Etched Module Antenna

FIG. 7C shows an antenna structure MA disposed on the chip (IC) side of the substrate. A typical pattern for an antenna is generally rectangular, in the form of a flat (planar) coil (spiral) having a number (such 12) of turns (conductive tracks). The antenna is typically chemically etched from the metal layer (foil) on the chip side of the substrate. The 7 filled circles and the dashed line circle under the chip CM represent vias (a total of 8) through the substrate tape MT.

FIG. 7D illustrates an 8-pad pattern for ISO 7816 contacts. FIG. 7E illustrates a 6-pad pattern for ISO 7816 contacts. The overall dimensions of the module antenna MA are typically commensurate with the overall dimensions of the contact pads which (all dimensions are approximate), for a 8-pad contact pattern is 12.6 mm×11.4 mm, or 144 mm$^2$ (and each contact may have a minimum rectangular surface area not less than 1.7×2 mm)

for a 6-pad contact pattern is 10.6 mm×8.0 mm, or 85 mm$^2$ Generally, for a 6-pad contact, the bottom two pads, C4 and C8 of the 8-pad pattern are simply omitted.

the "punching size", or size of an opening through a top layer of the smartcard, through which the contact pads are exposed, may be 0.2 mm larger than the contact pad pattern around the periphery of the contact pads, for a total of 0.4 mm wider (and taller). For a 6-pad pattern having a "footprint" of 10.6 mm×8.0 mm, an appropriate punching size may be 11.0 mm×8.4 mm.

It is readily apparent that an area of approximately 1.6 mm×3 mm may be "lost" around the perimeter of a 6-contact pad chip (or antenna) module, as contrasted with a comparable 8-pad contact pattern antenna module (AM), which results in the loss of at least approximately (1.6 mm/0.175 mm) 9 turns of antenna (etched). The chip (IC, CM) may measure 2 mm×2 mm, or 4 mm$^2$, and this area is unavailable for the antenna, leaving (all dimensions are approximate). Generally, an area immediately surrounding the IC chip may also be unavailable for the antenna, for example, 3 mm×3 mm (including the IC chip), or 10 mm$^2$. It can thus be seen that a 6-pad contact pattern may have approximately 30-50% less space available for the antenna than an 8-pad contact pattern module. And, an etched antenna is usually 2-dimensional, in one layer only. In contrast with an etched antenna, a wire wound antenna may make much better use of the space available.

Another limitation in creating an inductive antenna through chemical etching is the minimum pitch (or spacing) between tracks, which is economically attainable using a lithographic process. The optimal pitch (or spacing) between (adjacent) tracks of an etched antenna on super 35 mm tape is approximately 100 µm. (As used herein, the term "pitch" may refer to the spacing between adjacent conductive tracks, rather than its conventional meaning the center-to-center dimension between track centerlines or the number of tracks per unit length.)

Some exemplary and/or approximate dimensions, materials and specifications may be:
- Module Tape (MT): epoxy-based tape (or Kapton), 75 μm-110 μm thick
- Chip Module (CM): NXP SmartMx or Infineon SLE66, or other
- Antenna Module (AM): 13 mm×11.8 mm and 195 μm thick
- Module Antenna (MA): several windings of 50 μm or 80 μm copper wire, approximately the size of the chip module CM (and not greater in size than the AM)

Some Solutions

A 6-pin (six contact pad) dual interface (DI, DIF) module offers many advantages over an 8-pin (8 contact pad) module. Because of its reduced size in comparison to the 8 pin DIF module, there are cost savings in terms of the amount of gold which is required on the surface of each contact pad (copper, nickel gold), the milling time to produce a cavity in a card body is reduced because of the smaller space required to accommodate and protect the die, and the gold wires (Ø24-32 μm) for wire bonding are no longer possible. Because of its smaller footprint, there is more space on the card body after insertion of the module for printing of brand logos and the embossing of character lines. Also, by virtue of being smaller than an 8-pad module, a 6-pad module can better survive card body flexing.

However, due to the small footprint (11.0 mm×8.4 mm, for the contact pads) of a 6-pin (pad) DIF module, it is virtually impossible to produce a functional etched antenna on the bond side (chip side) of the module. As discussed above the circumference space (area) between the chip and the perimeter of the chip module is insufficient to contain the etched antenna tracks for inductive coupling. Additionally, because of its small footprint, it is not possible to wire bond the silicon die (chip CM) to the chip module (carrier tape MT) as the spacing between the silicon die and perimeter is insufficient to perform a ball and wedge bond.

Rather than wire-bonding the chip CM to the vias, the chip CM may be flip-chip (ball) bonded to selected traces in the bottom metal layer MB which are associated with those vias. Underfiller may be provided under (on top, as viewed) of the chip CM to support it on and secure it to the module tape MT. Although flip-chip bonding may free up some space for the module antenna MA, wire wound antennas may make better use of the available space than etched antennas.

A structure such as a dam structure DS or winding core WC (which may be a ring which is oval, round or rectangular) may be used to contain the flow of the glob top after wire bonding, while at the same time the ring may be used as a supporting frame for a coil wound around the dam structure DS or winding core.

The ring frame (winding core WC) may advantageously be used to flatten & stiffen the chip carrier tape to protect the flip chip bonds from flexing during normal use and when the card is inserted into a card terminal. Additionally, the ring frame (winding core WC) may advantageously be used firstly to keep the contact pad surfaces substantially homogenous and substantially completely flat. The flatness may determine the longevity of the card, especially when inserted regularly into a card terminal. The winding core (WC) may stiffen, stabilize and planarize the module tape (MT), particularly in the area of the chip (CM) to enhance reliability.

Because of the reduced footprint of a 6-pad module, the only reliable method to produce an inductive coupling module may be to use a wire wound coil (with several layers) mounted to a chip carrier tape having a die mounted to its surface by means of flip chip bonding. The wire wound coil, serving as the module antenna MA, may be wound on a winding core WC that is already mounted to the substrate tape MT, as described above with respect to FIGS. 4A-4F. Alternatively, the coil may first be wound on the core, then the coil with core may be mounted to the substrate tape MT.

An Example of a Flip-Chip Mounted RFID Chip CM

FIG. 8 shows an antenna module AM, wherein the chip CM (compare 110) is installed on one side (the chip side) of the module tape (or substrate) MT in an interior area of the winding core WC which may have previously been mounted to the chip side of the substrate MT. In contrast with the previously described technique (FIG. 4D) of wire bonding the chip CM to bond pads on the chip side of the module tape, in this embodiment the chip is flip-chip mounted and connected to conductive traces and pads on the chip side of the substrate MT, such as in the manner described herein.

A wire module antenna MA may be wound on the winding core WC, in the manner described herein, either before or after mounting the chip CM, with the winding core WC already in place on the chip side of the substrate MT. (The module antenna MA is shown here having 3 layers, 6 turns each, neatly stacked, for illustrative purposes only. The wires need not be so neatly stacked, and there may be other than 18 turns.) Alternatively, a wire module antenna MA may first be wound on the winding core WC, or a modified version thereof, and subsequently attached to the chip side of the substrate MT. Subsequently, the ends (a, b) of the module antenna MA may be bonded to bond pads BP on the chip side of the substrate MT, if they were not previously connected.

In the FIG. 8 embodiment, the chip CM may be mounted and bonded to the substrate MT prior to affixing the winding core WC to the substrate MT, and thereafter winding the antenna MA on the winding core WC. Alternatively, the winding core WC may be mounted to the substrate MT before mounting and bonding the chip CM. In the FIG. 4 embodiment, the chip CM may be mounted to the substrate MT before mounting the winding core WC, then connected afterwards.

The opposite surface of the substrate MT may be provided with contact pads for ISO-7816, such as six contact pads. When module tape or substrate is referred to, this typically means an epoxy glass tape, copper clad on both sides (double-sided).

The winding core WC may have the following dimensions (approximate):
- thickness t of the body portion B=~0.85 mm
- width fw of the flange F=~0.5 mm
- outer diameter OD of the winding core WC (including flange F)=~9.4 mm
- inner diameter ID of the winding core WC=~6.7 mm
- height h1 of coil winding area=~0.250 mm
- height h2 of the flange F=~0.100 mm
- overall height h3 of the body portion B=~0.350 mm In contrast with the winding core WC of FIG. 4D, the winding core WC of FIG. 8 may be smaller overall—namely smaller OD and smaller ID. Firstly, it may be smaller because of the 6-pad versus 8-pad contact pad layout. Secondly, because the chip CM is flip chip mounted to the substrate MT, rather than being wire bonded thereto, less space is required around the chip CM, and the ID of the winding core WC can consequently be significantly smaller. The winding core WC may be round, or rectangular, or other suitable shape. Some exemplary OD and ID dimensions for the winding core WC of FIG. 8 may be:
- outer dimension OD of the winding core WC=~7 mm, such as 6.5×7.7 mm inner dimension ID of the winding core WC=~4 mm, such as 3.7×4.5 mm As set forth above, the coil winding area between the flange F and the surface of the module tape MT may accommodate (contain) approximately 20 turns of 112 μm diameter self-bonding wire for the module antenna MA. Wire having other diameters, greater or less than 112 μm may be used for the module antenna MA.

After the antenna MA and chip CM are mounted and connected, the interior area of the winding core WC may be filled with glob-top potting compound GT, or the like, to protect the chip CM. If heat is applied to cure the glob-top GT, the heat may also cause sticking together of the self-bonding wire forming the turns (coils) of the module antenna MA.

Thereafter, a mold mass MM may be formed (by over-molding) over the module antenna MA, the ends (a, b) of the module antenna MA, the winding core WC, and the glob-top GT (including over the chip CM). The mold mass MM may extend over the outer edge (lip) of the flange F, slightly into the coil winding area (except where there is wire), which may helping retain the mold mass MM in place.

Traditional flip-chip mounting involves providing a chip with re-flowable bumps such as solder balls, flipping the chip onto a substrate having pads, and re-flowing the solder balls, using heat, to effect the electrical (and mechanical) connection between the chip and the substrate. The Infineon FCOS chip module mentioned above utilizes an adhesive technology (such as DELO-MONOPDX or DELO-MONOPDX AC) to effect the connections between the chip and the substrate.

The brochure "Adhesives for flip chip bonding", by DELO, incorporated by reference herein, which discloses pressing of bumps and electrically conductive particles in the adhesive being clamped between bumps and substrate metallization. Process steps may include (i) adhesive application, (ii) placement of the flip-chip, (iii) curing by thermode with pressure and temperature, and optionally (iv) final curing in tunnel oven. Gold-plated nickel particles or silver particles are used as filler for the adhesive (DELO-MONOPDX AC) in order to achieve the electrical conductivity. These solid particles are used for contacting flip-chips with flexible and rigid substrates. When pressing the particles, the oxide layers on the surfaces of metallic circuit paths are ruptured. (Remaining adhesive which is not pressed may remain non-conductive.) With this, low contact resistances can also be achieved on copper and aluminum circuit paths. When manufacturing smartcard modules, flip-chips are an economic alternative to the chip-on-board technology. DELO-MONOPDX or DELO-MONOPDX AC are used on standard substrates like FR4 or PET for contacting flip chips.

In an exemplary manufacturing process, substrate tape may be purchased from one vendor (such as Interplex), bumped chips may be purchased from another vendor (such as NXP), and the chips are joined and connected with the substrate using a selectively-conductive adhesive containing suitable electrically conductive particles (such as copper, nickel, gold, and the like). As used herein, a "selectively conductive adhesive" is an adhesive, such as DELO-MONOPDX or DELO-MONOPDX AC, that becomes conductive only at areas where pressure is applied. Conductive areas of the adhesive are shown as shaded, in FIG. 9. Other adhesives, such as those which are conductive, may be used to connect the bumps to the pads, such as by applying only to those areas.

FIG. 9 shows a chip (CM) 910 having two bumps 912 and a substrate (MT) 920 having two corresponding pads 922. A "selectively conductive adhesive" 930 is disposed between the chip 910 and the substrate 920. When the chip 910 is pressed down onto the substrate 920, selected areas (portions) 932 of the adhesive 930 become conductive, the remaining area of the adhesive remains non-conductive. In this manner, the adhesive 930 secures (mechanically connects) the chip 910 to the substrate 920, and electrical connections are made between the bumps 912 and corresponding pads 922.

To enhance the electrical connections between the bumps 912 and the pads 922, as a precursor to performing flip-chipping, a conductive material may be applied to the bumps 912 of the chip and/or to the pads 922 of the substrate. A quantity 914 of conductive material is shown on the bumps 912, a quantity of conductive material 924 is shown on the pads 922. An exemplary conductive material is silver nanowires, such as 90 μm long, which will form a network (mesh) on the bump and/or pad surface(s) to improve mechanical and electrical connection between the bumps and the pads. Silver nanowire material is available from Seashell Technology (http://www.seashelltech.com/nanoRods.shtml), incorporated by reference herein, and may be applied to one or both of the bumps and the pads by spraying, inkjet application, aerosol application, and the like.

As an alternative to adhesive bonding, conventional flip-chip bonding, involving re-flowing solder bumps, may be used to mount and connect the chip (CM, IC) to the substrate (MT).

Antenna Substrate (AS)

In FIG. 7C it was shown that the area for the antenna MA was limited to a peripheral area of the module substrate MT, the central area of the module substrate MT being utilized by the chip CM and its associated interconnects (and vias). One end of the antenna MA terminated at a pad (via) near the edge of the module substrate MT, the other end of the antenna MA was shown as terminating on a pad (via) under the chip CM.

FIGS. 10, 10A illustrate that the antenna MA may be formed on an antenna substrate AS (or tape layer) which is substantially the same size as the module substrate MT (or tape layer) and separate from the module substrate MT.

An opening OP in the antenna substrate AS, which may be only slightly larger than the chip CM, may be provided through the antenna substrate AS for accommodating the chip CM (the chip CM may protrude through the opening OP) when the antenna substrate AS is joined (and connected) to the module substrate MT. In FIG. 10, the chip CM and its interconnections are shown in dashed lines.

As best viewed in FIG. 10A, the antenna substrate AS may be and may have bumps on its bottom (as viewed) surface which will be connected with corresponding pads on the top (as viewed) surface of the module substrate MT, such as by using a conductive adhesive.

By avoiding the problem of leaving the area around the chip CM free for interconnects, this area can be used for additional turns (or tracks) of the antenna MA. Some of these additional tracks are shown in dashed lines in FIG. 10.

The antenna substrate AS may be opaque, or dark in color to conceal the underling module substrate MT, chip CM and antenna MA. This may be an important security feature if the module substrate MT is transparent (such as parlex).

The antenna MA may be formed of wire, embedded in the antenna substrate AS, such as shown in U.S. Pat. No. 6,233, 818. Alternatively, the antenna MA may be chemically etched from a metal layer (foil) on the antenna substrate AS.

Alternatively, the antenna MA may be laser etched, which may allow for finer pitch, and more tracks. For example, the antenna may be laser etched (isolation technique) into a copper cladded "seed" layer (face-down side of the pre-preg) having a thickness of 17 μm, using a UV or Green nanosecond or picosecond laser with a distance between tracks dimensionally equal to the width of the laser beam, approximately 25 μm. After the laser etching of the copper seed layer, the antenna substrate AS may further be processed by one or more of sand blasting to remove residual laser ablated particles and to prepare for plating adhesion; depositing carbon to support the through-hole plating of the vertical interconnects; dry film application and photo-masking process; electroless deposition copper (Cu~6 μm) to increase the thickness of the tracks; electroplating of nickel and nickel phosphorous (Ni/NiP~9 μm) or nickel (Ni~9 μm) and palladium/gold or gold (Pd/Au or Au-0.1 μm/0.03 μm or 0.2 μm) to prevent oxidization.

U.S. Pat. No. 7,229,022 and US 2008/0314990, disclose an array of antennae installed on a separate substrate to the substrate hosting the RFID chips with an identical format. The antenna substrate is then placed over the substrate with the array of RFID chips and the termination areas of each antenna are manually connected to each chip on the respective transponder site.

Reference is made to US 20120080527 which discloses forming antenna structures having several conductor turns (wire, foil, conductive material) on an antenna substrate (carrier layer or film or web), removing the antenna structures individually from the antenna substrate using pick & place gantry or by means of die punching, laser cutting or laminating, and transferring the antenna structure with it's end portions (termination ends) in a fixed position for mounting onto or into selected transponder sites on an inlay substrate, and connecting the aligned termination ends of the antenna structure to an RFID (radio frequency identification) chip or chip module disposed on or in the inlay substrate. A contact transfer process is capable of transferring several antenna structures simultaneously to several transponder sites. As disclosed therein, a method of forming a transponder site comprising an inlay substrate, an RFID chip module and an antenna structure connected to the chip module may comprise:
  preparing a plurality of transponder sites on an inlay substrate, each transponder site comprising a defined area of the inlay substrate;
  forming a plurality of antenna structures on an antenna substrate which is separate from the inlay substrate; and
  removing given antenna structures from the antenna substrate and transferring them to selected ones of the transponder sites;
wherein removing the antenna structures comprises:
  causing antenna structures to be released from the antenna substrate using one or more of the processes selected from the group consisting of:
  applying a mechanical force to the antenna substrate;
  directing a laser beam at the antenna substrate;
  heating a portion of the antenna substrate;
  softening a portion of the antenna substrate;
  distorting a portion of the antenna substrate;
  causing a temperature differential between the antenna substrate and the inlay substrate;
  bringing the antenna substrate and the inlay substrate into face-to-face contact with one another;
  selecting physical properties of the antenna substrate and inlay substrate to facilitate release of the antenna structures from the antenna substrate onto the inlay substrate; and
  performing a laminating process.

The techniques disclosed herein for transferring antenna structures to an inlay substrate may be utilized to transfer antenna structures to a module tape (MT) for an antenna module.

a Winding Core (WC) without any Flanges

U.S. 61/860,354 filed 31 Jul. 2013, discloses an antenna module AM may comprise a module tape MT, a chip module CM surrounded by a dam structure DS mounted to one side of the module tape MT. The dam structure DS may be generally in the form of a cylinder, and may be filled with glob top GT potting compound (or the like) to protect the chip module CM and wire bonds connecting the chip module to the module tape MT. Some connections may be made through the module tape MT to the underside of contact pads CP on the other side of the module tape MT.

A planar element, which may be referred to herein as a "lid" (LD) or a "cover plate" (CP), which is separate from the winding core (SS, DS, WC) itself, may be disposed on the free end of the winding core WC to serve as a flange for constraining wire being wound in situ (with the core WC mounted on the module tape MT).

FIG. 11A shows a substantially flat "lid" LD which may be in the form of a cylindrical disc, having an outer diameter (OD) greater than that the body of the of the dam structure DS may be disposed atop the dam structure DS (and glob top, if already encapsulated) to serve as (or substitute for) a flange for controlling winding the module antenna MA. The lid LD may be in the form of a planar structure, of plastic material, having a thickness of approximately 200 μm.

In this, and other examples of support structures (SS), including dam structures (DS) and winding cores (WC), a tubular body portion (B) of the support structure (SS) may have a substantially uniform cross-section over its entire length, between its two ends—one of which ends is secured to or extends from a surface of the module tape (MT), the other of which ends is a "free end".

FIG. 11B shows that the lid LD may be in the form of a ring, having an opening (typically centered) to allow for glob top GT encapsulant to be applied with the lid LD in place, including after the module antenna MA is wound on the dam structure DS. The encapsulant GT may substantially fill the interior area of the body portion (B) to cover the chip CM and its connections. The lid LD may be referred to as a cover plate (CP), or as a "planar element".

The lid LD may be mounted with adhesive to the dam structure (DS) and left in place after the module antenna MA is wound on the dam structure DS. The lid LD may be removed after the module antenna MA is wound on the dam structure DS, in which case it may be beneficial to first heat the module antenna MA so that its windings (of insulated wire) stick together. In the latter case (removing the flange F), the lid LD may simply be a flat rigid surface, such as metal.

The planar element (LD, CP) may comprise ferrite, such as a plastic material impregnated or coated with ferrite particles. The tubular body portion, or core (B) may also comprise ferrite, such as a plastic material impregnated or coated (on its inner or outer surfaces, or both) with ferrite particles.

The chip (CM) may have a thickness of approximately 75 μm, and may be bonded with an approximately 18 μm thick adhesive layer to the module tape MT having a thickness approximately 195 μm. The module tape MT may be a glass-epoxy or polyimide super 35 mm tape having nickel or gold passivated, pre-patterned connection pads (contact pads CP and bond pads BP) on both faces with or without connective tracks such as vias. Gold wire bonds of height approximately 160 μm electrically connect metallized contact pads on the chip module (CM) to bond pads on the module tape (MT).

The flange (F) formed by the lid or cover plate (LD) may extend beyond the periphery of the dam outer wall. The flange (F) assists coil winding to form the module antenna (MA), by constraining the winding of the coil to the body (B) of the dam structure (SS, DS, WC), and may or may not be required after coil winding is complete.

FIG. 11C shows a planar tool PT tool being used when winding the module antenna MA. The tool PT may be in the form of a disc (compare FIG. 11A) or ring (compare FIG. 11B), and may be metal, or any suitable material. The planar tool PT may be used instead of a lid (LD, CP) to constrain the wire while it is being wound, and may be either removed or left in place upon completion of winding the module antenna MA.

In FIGS. 11A,B,C the module antenna MA is shown as being a coil of wire having 4 (four) layers having 6 (six) turns each, or a total of 18 turns. And the turns are shown as being neatly stacked one upon the other. It should be understood that the module antenna MA may have other than 3 layers of 6 turns, such as (but not limited to) 4 layers of 8 turns, and the turns may be not so neatly stacked upon each other.

It is generally desirable to fill up the space between the lid LD (or the tool T) and the module tape MT with as many turns of wire as practical. Since currents in the module antenna are very low, wire having a diameter of as little as 50 μm may be used to form the module antenna MA.

In FIGS. 11A,B,C the chip CM is shown "generically", without limiting how it is connected (wire bonded) or flip-chip mounted to the module tape MT. Also, the contact pads (CP) on the opposite side (from the chip CM and module antenna MA) are omitted, for illustrative clarity.

Reference is made to U.S. 61/868,089 filed 21 Aug. 2013, particularly to FIG. 100 thereof, which also shows an antenna module with a lid (LD, disc or ring), which shows 3 layers having 6 turns each. (The module antenna MA has 18 turns of wire.

The RFID chip CM can be wire bonded to the module tape MT after the dam DS has been mounted to the module tape MT, including after the module antenna MA has been wound around the dam structure DS. Also, the module antenna MA can be wound around the dam structure after the chip CM is installed and connected (e.g., wire-bonded), including after encapsulation.

FIG. 11D shows an antenna module AM may comprise a module tape MT, a wire bonded silicon die or flip-chip mounted die (hereinafter referred to a chip or chip module CM) surrounded by a dam structure (DS) mounted to one side of the module tape (MT). The dam structure DS may be generally in the form of a cylinder or rectangular structure, and may be filled with glob top (GT) potting compound (or the like) to protect the chip (CM) and wire bonds connecting the chip to the module tape (MT). Some connections may be made through the module tape (MT) to the underside of contact pads (CP) on the other side of the module tape (MT).

According to some embodiments (examples) of the invention, a substantially flat "lid" (LD), cap or cover plate (CP) which may be in the form of a disc or ring, having an outer diameter (OD) greater than that the outer diameter (or comparable cross-dimension) of the tubular body portion (B) of the dam structure (SS, DS, WC) may be disposed atop the tubular body portion (B) of the dam structure (SS, DS, WC) to serve as a flange (F) for constraining turns of wire when winding the module antenna (MA) around the tubular body portion (B) of the dam structure (SS, DS, WC). The flange (F), lid (LD) or cover plate (CP) may be in the form of a planar structure (element), of plastic material, having a thickness of approximately 75 μm.

The planar element (LD, CP) may be mounted with adhesive to the dam structure (DS) and left in place after the module antenna (MA) is wound on the dam structure (DS).

The flange (F) may be removed after the module antenna (MA) is wound on the dam structure (DS), in which case it may be beneficial to first heat the module antenna (MA) so that its windings (of self bonding insulated wire) stick together. In the latter case (removing the flange F), the flange (F) may simply be a flat rigid surface, such as metal. Alcohol or a suitable solvent can be used to soften a thermoplastic adhesive coating on the wire, followed by an oven bake to promote inter-wire adhesion and solidify the air core coil. Another alternative is to draw the coil through a wet adhesive or to apply wet adhesive to the wire using a dispensing apparatus within or adjacent the coil winding nozzle (CWN). The wet adhesive can be dried at ambient temperature, oven dried or dried under a flow of hot air.

According to some embodiments (examples) of the invention, a module tape (MT) for an antenna module (AM) may comprise: a substrate (MT); and a support structure (SS, DS, WC) disposed on a surface of the substrate and comprising a tubular body portion (B) having two opposite open ends, one of which is disposed against the surface of the substrate, the other of which is a free end; characterized by: a planar element (F, LD, CP, PT) selected from the group consisting of a flange (F), a lid (LD, CP) and tool (PT) disposed upon the free end of the support structure, such as for constraining winding of the module antenna (MA) on the support structure. The support structure may function as winding core for a module antenna (MA), constraining wire wound around the tubular body portion (B) and may function as a dam for containing glob-top (GT) covering a chip (CM) disposed within the support structure The tubular body portion may have a substantially uniform cross-section over its entire length, between its two ends.

According to some embodiments (examples) of the invention, an antenna module (AM) interim product may comprise: a module tape (MT); and a support structure (SS, DS, WC) disposed on a surface of the substrate and comprising a tubular body portion (B) having two opposite open ends, one of which is disposed against the surface of the substrate, the other of which is a free end. A module antenna (MA) may be wound around the tubular body portion (B), using any suitable technique. An RFID chip (CM) may later be mounted on and connected to the module tape (MT), in the interior of the body portion (B).

According to some embodiments (examples) of the invention, a method of making a module antenna (MA) may comprise: providing a module tape (MT); and providing support structure (SS, DS, WC) having a tubular body portion (B) on a surface of the module tape, the tubular body portion having an end on the surface of the module tape and a free end; and may be characterized by: disposing a planar element (LD, CP, PT) against the free end of the body portion; and winding a module antenna (MA) around the body portion (B) between the surface of the module tape (MT) and the planar element. The planar element (LD, CP) may be left in place or may be removed upon completion of winding the module antenna MA. The planar element (LD, CP, PT) may be in the form of a ring, and with the planar element (LD, CP, PT) in place on the tubular body portion (B), an interior area of the body portion (B) may be filled with encapsulant (GT). The support structure (SS, DS, WC) may be formed on the module tape (MT) by an additive process.

Some Exemplary Embodiments

FIG. 12A shows a die (RFID chip, or IC) CM mounted to a module tape MT and connected thereto by wire bonds wb. FIG. 12B shows a die (RFID chip) flip-chip mounted to a module tape MT. The module tape MT is typically an epoxy glass tape with metallization on at least one side thereof. The steps that follow (FIGS. 12C-12H) may be applied in either case (wire-bonded, flip-chip mounted). In the main, a wire-bonded configuration will be described. Although the steps are shown in an illustrative sequence, selected ones of the steps could be rearranged in their order.

FIG. 12C shows a support structure SS mounted, such as with an adhesive, to the module tape to form a dam structure DS to contain the resin (GT) protecting the wire bonds to the chip CM, and as at least part of a winding core (WC).

It should be understood that a module tape MT with a support structure SS, or dam structure DS, or winding core WC, without the chip CM, may constitute an interim product, which may be shipped.

FIG. 12D shows the inner (interior) area of the support structure SS filled with an epoxy glob-top (GT) ("Dam & Fill"), to protect the wire bonds (connections) between the chip (CM) and the bond pads (BP), before mounting a cap or cover plate (CP) (or "lid", or "cap") to the support structure (SS). See FIGS. 11A, 11B.

FIG. 12E shows a cap or cover plate (CP) mounted on the support structure (SS) to create a winding core support structure (WCSS) having a flange (F). Compare FIG. 4. The cap or cover plate CP may be a PET lamination foil which can be adhesively attached to the support structure (SS) by the application of heat and slight pressure. For a six contact module, the cap or cover plate CP may measure approximately 9.3 mm×6.7 mm, with a thickness of 75 µm. For an eight contact module, the cap or cover plate CP may measure approximately 11.5 mm×10.3 mm, with a thickness of 75 µm.

FIG. 12F shows a module antenna MA wound around the winding core support structure (WCSS) with flange (F). The module antenna MA, or "coil", may comprise several layers and turns of self-bonding wire.

It should be understood that a module tape MT with a support structure SS, or dam structure DS, or winding core WC, with the module antenna MA, and without the chip CM, may constitute an interim product, which may be shipped. Later the chip CM may be installed and connected, and encapsulated.

FIG. 12G shows a completed antenna module (AM) comprising: a wire bonded (wb) die mounted on a module tape (MT) and protected by epoxy glob-top (GT) by means of a "Dam & Fill" process; a cap or cover plate (CP) mounted to the supporting structure (SS) of the "Dam and Fill" to create a winding core support structure (WCSS) with flange, and a wire coil wound around said structure to create a module antenna (MA).

FIG. 12H shows a completed antenna module antenna module (AM) comprising: a bumped die mounted to a module tape (MT) by means of flip chip (fc or FC) assembly, a cap or cover plate (CP) is mounted to the non-active side of the flip-chip or to a supporting structure erected around the flip chip having an overall height above the flip chip, to create a winding core support structure (WCSS) with flange, and a wire coil wound around said structure to create a module antenna (MA).

FIG. 13A shows a supporting structure SS being erected on a module tape MT around a wire bonded (wb, WB) die (or flip chip), to form simultaneously a dam and winding core.

FIG. 13B shows a cap or cover plate (CP) having an opening mounted on to the supporting structure (SS) to create a winding core support structure (WCSS) with flange (F). See FIG. 11B.

FIG. 13C shows (top view) the cap or cover plate (CP) with an opening to permit dispensing of the glob-top potting compound (GT) within the interior of the dam or supporting structure (SS).

It should be understood that a module tape MT with a support structure SS, or dam structure DS, or winding core WC, with the lid CP, without the module antenna MA, and without the chip CM, may constitute an interim product, which may be shipped. Later the module antenna MA may be wound on the support structure, and also the chip CM may be installed and connected, and encapsulated.

FIG. 13D shows the inner area of the winding core support structure (WCSS) filled (via the opening in the cap or cover plate CP) with an epoxy glob-top (GT) to protect the wire bond connections to the RFID chip CM.

FIG. 13E shows a side view diagram of a winding core support structure (WCSS) with a wire coil wound around its structure to create a module antenna (MA). This constitutes what may be referred to herein as a complete "antenna module" AM.

It should be understood that the techniques disclosed in FIGS. 13A-13E are also applicable when the chip CM is flip-chip mounted, rather than wire-bonded.

FIG. 13F illustrates an antenna module AM with a wire bonded (wb) die, a winding core support structure (WCSS) with flange, and a wire coil wound around its structure to create a module antenna (MA).

FIG. 13G illustrates an antenna module AM with flip chip (fc or FC), a winding core support structure (WCSS) with flange, and a wire coil wound around its structure to create a module antenna (MA).

Multiple Antenna Structures (AS) in the Antenna Module (AM)

In the embodiments described hereinabove, there may be only one antenna structure functioning as the module antenna MA for the antenna module AM. There will now be described some embodiments of module antennas MAs comprising multiple (two or more) antenna structures. It should be understood that the antenna structures may comprise wires wound around a winding core, or traces on a module tape or an antenna substrate, said traces being formed by additive (printing) or subtractive (etching) processes, or combinations of wires and traces.

FIGS. 14A,14B illustrate an embodiment of an antenna module (AM) 1400 for a transponder comprising a chip (CM) 1408 having two terminals 1408*a*, 1408*b* an inductive wire antenna (A) 1410 formed as a flat coil of embedded wire having a number (such as 12) of turns, and two ends—an outer end 1 (at the end of an outer one of the turns) and an inner end 2 (at an end of an inner one of the turns)

The overall length of the antenna A may be 400 mm

The ends 1 and 2 of the antenna A may be connected to the terminals of the chip module.

The chip module may be disposed within (interior to) the turns of the antenna A.

The outer turn of the antenna A may cross over inner turns of the antenna A to be routed to the chip module CM.

The antenna A is an "antenna structure".

capacitive antenna extensions (or stubs) B and C also formed as flat coils of embedded wire having a number of turns, and connected to the inductive wire antenna as described below.

The stubs B,C are "antenna structures"

The chip (CM) 1408 and antenna A 1410 may be disposed in or on a layer 1422 of a multi-layer antenna substrate 1400.

The chip module 1408 may be disposed in a recess (pocket) 1406 extending partially through the layer 1422 (as illustrated), or may be disposed in a recess (opening) extending completely through the layer 1422, with the chip module 1408 being supported by an underlying layer 1424.

The antenna module (AM) 1420 is illustrated in FIG. 14B "face up", with its terminals for connecting with the antenna A on its top side. Alternatively, the chip module may be orientated "face down" with its antenna-receiving terminals on its bottom side (and extend through the substrate 1422, for example), and another set of terminals (not shown) for a contact interface on its top side.

Other variations for the antenna module (AM) 1420 may include, but are not limited to . . . .
  the antenna A may be on the bottom of the layer 1422
  the stub B 1412 may be on the bottom of the layer 1424
  the stub C 1414 may be on the bottom of the layer 1426
  the stubs B and C may be on the top and bottom surfaces of a single layer which is either above or below the layer 1422

The stub B 1412 may be formed as a flat coil of wire having a number (such as 12) of turns and two ends—an outer end 3 of an outer turn and an inner end 4 of an inner turn—in a layer 1424 overlying the layer 1422. The stub B may have an overall length of approximately 400 mm, and may be aligned with (directly over) the antenna A.

The stub C 1414 may be formed as a flat coil of wire having a number (such as 12) of turns and two ends—an outer end 5 of an outer turn and an inner end 6 of an inner turn—in a layer 1426 underlying the layer 1422. The stub C may have an overall length of approximately 400 mm, and may be aligned with (directly under) the antenna A. The stub C may be aligned with (directly under) the stub B. The stubs B and C may be formed by etching, printing, or other processes, instead of (other than) using embedded wire.

In the schematic view of FIG. 14A, the antenna A and stubs B, C are shown laterally offset from each other. In FIG. 14B, the inductive wire antenna A and capacitive antenna extensions B and C are shown positioned and aligned atop one another. As best viewed in FIG. 14A, the antenna structures A, B, C may each be formed in a flat coil pattern having a number of turns, an overall length (from end to end), and a footprint (length×width), and may be substantially identical with one another in these regards. As best viewed in FIG. 14B, the antenna structures A, B, C may be disposed substantially directly over one another.

FIG. 14B illustrates that the number of turns, length, width, pitch and pattern of the stubs B, C may be substantially the same (match) as each other and they may be aligned one atop the other in layers of the antenna module 1400 so that their turns are aligned with one another, turn-for-turn. The stubs B, C may also substantially match and be aligned with the antenna A. Capacitance and the resonant circuit is formed between A+B and A+C. Antenna A is shown disposed in a layer between the layers for stubs B and C. Antenna A could alternatively be disposed in a layer above or below both of the layers for stubs B and C.

Dashed lines ( - - - ) indicate that the inner end 4 of the stub B 1412 may be connected to the outer end 1 of the antenna A 1410, such as at the terminal 1408b, and the outer end 5 of the stub C may be is connected to the inner end 2 of the antenna A, such as at the terminal 1408b. The outer end 3 of the stub B and the inner end 6 of the stub C may be left unconnected (remain open).

Alternatively, the vertical arrows (↓,↑) indicate that the outer end 3 of the stub B may be connected to the outer end 1 of the antenna A (such as at terminal 1408b), and the inner end of stub C may be connected with the inner end of the antenna A.

Note that in either case, "opposite" (inner versus outer) ends of the stubs B, C are connected to the two ends 1, 2 of the antenna A—in other words, the inner end 4 of B and the outer end 5 of C. As used herein, "connected in an opposite sense" means that the inner end of one of the two stubs (B or C) is connected with one end of the antenna (A), and the outer end of the other of the two stubs (C or B) is connected with the other end of the antenna (A). It is generally not desirable that the "same" (such as both inner) ends of the stubs are connected with the ends of the antenna A. The connections (interconnects) discussed herein can be made in any conventional manner, such as by vias through layers, traces on layers, bonding, soldering, crimping, welding, etc.

Locating the stubs B and C over each other in close proximity with the antenna A between them forms additional resonant circuits between the A and the stubs B, C realized by the stray capacitance between the antenna structures A, B, C. The interaction between the coupled stubs B and C exposed to the same electromagnetic field from the antenna A may advantageously reduce the self-resonance (or self-resonant) frequency of the antenna A. Stub B is close to antenna A and stub C is close to antenna A, ergo stub B is close to stub C.

In electronics, capacitors and inductors have parasitic inductance and capacitance, respectively. For a capacitor, the inductance is primarily due to the physical dimensions including the leads. Since a capacitor and inductor in series creates an oscillating circuit, all capacitors and inductors will oscillate when stimulated with a step impulse. The frequency of this oscillation is the self-resonant frequency (SRF).

The dimensions of the antenna module (AM) may be approximately 15 mm×15 mm. Due to the relatively small available area, an inductive wire loop of the size of the antenna module may have a self-resonance frequency of approximately 75 MHz. The over-layered close coupled antenna structures (stubs B and C) may function as a wire formed capacitor—with open wire ends (3 and 6)—that may reduce the resonance frequency of the formed transponder to a more desirable value of approximately 13~17 MHz, thereby increasing the voltage and transferred power to the chip module.

In combination with a commercially-available chip module (such as NXP SmartMx or Infineon SLE66, or other) which may be specified with an input capacitance of approximately 10~30 pF the assembled transponder can be matched to a resonance frequency of 13~17 MHz. See, for example, the following, incorporated by reference herein:
  Product short data sheet, P5CD016/021/041/051 and P5Cx081 family, Secure dual interface and contact PKI smartcard controller, Rev 3.2—March 2011, 20 pages
  Preliminary Short Product Information, SLE 66CLX360PE(M) Family, 8/16-Bit Security Dual Interface Controller For Contact Based and Contactless Applications, Infineon, November 2006, 14 pages
  SLE 66 CX126PE, short Product Overview, May 2010, 4 pages
  SmartMX for programmable high-security, multi-application smartcards, NXP, 2009, 2 pages,
  mifare DESFire Data Sheet Addendum, Preliminary specification, Revision 2.0, April 2003, 7 pages M086820_MF3ICD40_ModuleSpec This principle of over-layered close-coupled wire (or other conductive trace) antenna structures (stubs B and C) facilitates reducing the space consumption of the antenna A to a minimum, by moving the additional wire turns of structures (stubs) B, C to separate planes. This principle may be more efficient than connecting a number of inductive wire antennas (with all wire ends connected) in series or in parallel. Capacitive extensions for the antenna A could be formed by creating more conventional conductive surfaces (plates) to offset the resonant frequency. An advantage of using wire is ease of creation using wire embedding technology, and better utilization of space. (The antenna module may have very limited space restrictions.)

Various alternatives to the "solution" discussed above may include, but are not limited to

- having the two stubs B and C in the same layer as one another, but with their turns interleaved with one another,
- having one or both of the stubs B and C in the same layer as the antenna A,
- having the two stubs B and C in the same layer as one another, but both on the same side of (i.e., overlying or underlying) the antenna A.
- connecting the outer end 3 instead of the inner end 4 of the stub B to the outer end 1 of the antenna A, and connecting the inner end 6 instead of the outer end 5 of the stub C to the inner end 2 of the antenna A,
- having only one stub (B or C) connected by either its outer or inner end (one only) to the outer or inner end (one only) of the antenna A, and it may generally be preferred to connect the ends opposite-wise (outer end of one to inner end of the other), although connecting likewise (inner end to inner end, or outer end to outer end) is also possible.

According to some embodiments (examples) of the invention, an antenna module for a transponder may comprise: a chip module; a first antenna structure which is an antenna having two ends connected with the chip module; a second antenna structure having an outer end and an inner end, one of which is connected with the first antenna structure, the other of which is left unconnected; and a third antenna structure having an outer end and an inner end, one of which is connected with the first antenna structure, the other of which is left unconnected. The inner end of one of the two stubs may be connected with one end of the antenna, and the outer end of the other of the two stubs is connected with the other end of the antenna. The first, second and third antenna structures may be formed in a flat coil pattern having a number of turns, and are substantially identical with one another. The first, second and third antenna structures may be disposed substantially directly over one another. The first, second and third antenna structures are formed by embedding wire. The first, second and third antenna structures are formed other than by embedding wire. The antenna module may be incorporated into a secure document.

The embodiment shown and described with respect to FIGS. 14A and 14B illustrates that there may be more than a single antenna structure in the antenna module AM. Some other embodiments of multiple antenna structures will now be described.

FIG. 15 shows a module antenna MA formed by one coil having a total of 18 turns, and having two ends "a" and "b", both ends extending outward from the module antenna MA and connected with a respective one of two bond pads BP-a and BP-b on the carrier tape MT.

The wire may generally be wound around the body portion B of the winding core WC one turn atop the other, expanding radially outward as the winding area between the carrier tape MT and the flange F becomes filled with wire—resulting, for example, in three (3) layers of wire, each layer having six (6) turns.

FIG. 15A shows diagrammatically a module antenna MA comprising two coils C1 and C2, each of the coils having 9 turns, the overall module antenna MA having a total of 18 turns. Each of the coils C1 and C2 has two ends. Coil C2 is shown with "X's". Coil C2 is shown wound around the coil C1. The module tape MT is shown as being double-sided, but may be single-sided.

FIG. 15B shows schematically that the two coils C1 and C2 may be connected in parallel with one another. Coil C2 is shown in dashed lines.

The coil C1 may be the first coil wound on the winding core WC, and may comprise 9 turns of wire and two ends 1a, 1b. The coil C2 may be the second coil wound on the winding core WC, and may comprise 9 turns of wire and two ends 2a, 2b.

A first end 2a of the second coil C2 may be connected with a first end 1a of the first coil C1 at a first bond pad BP-a. A second end 2b of the second coil C2 may be connected with a second end 1b of the first coil C1 at a second bond pad BP-b.

The module antenna MA having two coils C1, C2 may couple better with a booster antenna BA on the card body, or directly with an external contactless reader, when contrasted with a comparable (substantially the same size, same total number of turns, etc.) module antenna MA having but a single coil, resulting in a greater read-write distance and energy harvesting, and potentially rendering the booster antenna BA superfluous. This may be attributable to the RF signal being radiated (or received) by the two coils reinforcing one another, or a higher quality factor (Q), or another characteristic of the two coil versus one coil approach including, perhaps, capacitance formed by the parallel connected ends of the two coils.

It is generally not necessary that the turns of the coils (C1, C2) be so neatly stacked as shown. Generally, it is sufficient to fill the entire winding area between the flange F and the carrier tape MT with turns of the module antenna MA, whether one coil or two coils. It should also be understood, particularly with reference to the two coil embodiment(s) that

- the two coils C1 and C2 can be wound either in the same or in opposite directions from one another
- the two coils C1 and C2 may have non-equal numbers of turns, for example the inner coil C1 having 10-12 turns and the outer coil C2 having 6-8 turns—more generally, the outer coil C2 having fewer (or more) turns than the inner coil C1.
- the two coils C1 and C2 may be connected in parallel with each other—the inner end 1a of the inner coil C1 being connected with the inner end 2a of the outer coil C2, and the outer end 1b of the inner coil C1 being connected with the outer end 2b of the outer coil C2
- the two coils C1 and C2 may be connected in parallel with each other—the inner end 1a of the inner coil C1 being connected with the outer end 2b of the outer coil C2, and the outer end 1b of the inner coil C1 being connected with the inner end 2a of the outer coil C2
- the two coils C1 and C2 may be connected other than in parallel with each other, for example the inner end 1a of the inner coil C1 being connected with the outer end 2b of the outer coil C2, with the outer end 1b of the inner coil C1 being connected to one terminal of the RFID chip (via a bond pad) and the inner end 2a of the outer coil C2 being connected with another terminal of the RFID chip (via another bond pad).

Additionally, it is not necessary that the two coils C1 and C2 of the module antenna MA be arranged as an inner coil and an outer coil. Rather . . .

- one coil could be formed (wound) atop the other, rather than inside or outside of the other
- the various turns of the two coils can be interleaved with one another
- the two coils C1 and C2 may be wound simultaneously (both at once), in the manner of a bifilar coil Additionally, the following variations may be implemented . . . .

- the coils C1 and C2 need not be wound on the specific winding core(s) illustrated above. They may be wound on other cores, directly on resin or mold mass encapsulating the RFID chip, may be air core coils, etc.
- the coils C1 and C2, shown above as being concentric with one another, may be formed in a manner that is not concentric
- the module antenna MA may comprise more that two coils, such as three coils (C1, C2, C3), each having six turns (for an 18-turn MA)
- the coils C1 and C2 need not be formed of wire, they may be formed as electrical traces using any additive (such as printing) or subtractive (such as etching) process
- ferrite material (such as a film, or particles) may be incorporated into the winding core WC, on the carrier tape MT, or in a coating (such as the insulating coating) on the wire
- capacitive elements may be formed in or on the carrier tape and connected with one or both of the coils FIG. 15C illustrates the underside of a module tape MT for an antenna module (AM). An antenna structure (AS) for a module antenna (MA) is shown, comprising two module antenna segments MA1 and MA2. These two module antenna segments MA1, MA2 may be arranged concentric with one another, as inner and outer antenna structures. Both module antenna segments MA1, MA2 may be wound coils, or patterned tracks, or one may be a wound coil and the other a pattern of tracks. The two module antenna segments MA1, MA2 may be interconnected with one another in any suitable manner to achieve an effective result.

FIG. 15D illustrates an exemplary antenna structure AS which may be used in an antenna module AM, having two segments (compare MA1, MA2) which are interconnected with one another, the antenna structure comprising

- an outer segment OS having an outer end 7 and an inner end 8
- an inner segment IS having an outer end 9 and an inner end 10
- the outer end 7 of the outer segment OS is connected with the inner end 10 of the inner segment IS
- the inner end 8 of the outer segment OS and the outer end 9 of the inner segment IS are left unconnected
- this forms what may be referred to as a "quasi dipole" antenna structure AS.
  - Such an arrangement is shown in U.S. Ser. No. 13/205,600 filed Aug. 8, 2011 (published as 20120038445, Feb. 16, 2012, issued as U.S. Pat. No. 8,474,726 Jul. 2, 2013) for use as a booster antenna BA in the card body CB of a smartcard SC. See FIG. 2C therein.
  - Such an arrangement is shown in U.S. Ser. No. 13/310,718 filed Dec. 3, 2011 (published as 20120074233, Mar. 29, 2012, issued as U.S. Pat. No. 8,366,009 Feb. 5, 2013) for use as a booster antenna BA in the card body CB of a smartcard SC. See FIGS. 3 and 4A therein.

In the case of a wire-wound module antenna MA, the module antenna MA which encircles the chip CM may serve as a dam for glob-top which is applied to protect the chip CM and its connections to the module tape MT.

Rather than (or in some cases, in addition to) using globtop, protection may be achieved by transfer molding a mold mass (MM), which covers/protects the module antenna MA as well as the chip CM and its connections. The chip CM may be mounted to the module tape MT before, or after mounting the module antenna MA to the module tape (and before transfer molding). This has applicability to module antennas that are formed by etching a conductive layer, as well as to wire-wound module antennas.

An antenna module (AM) for a smartcard (SC) may comprise: a module tape (MT); a chip (CM) disposed on a surface of the module tape (MT); and a module antenna (MA) disposed on the surface of the module tape (MT), and connected with the chip (CM); characterized by: the module antenna comprises a first coil (C1) and a second coil (C2). The first and second coils may be connected in parallel with one another. The second coil (C2) may be wound around the first coil (C1). The second coil (C2) may have substantially the same number of turns as the first coil (C1). The first and second coils may be wound in the same direction as one another. An antenna module (AM) may be made by affixing a tubular support structure (DS, WC) on a surface of a module tape (MT); and winding a wire for a module antenna (MA) around the tubular support structure (DS, WC); characterized in that the module antenna comprises two coils (C1, C2). The module antenna (MA) may be wound using any suitable winding technique.

Multiple Dam Structures and Module Antennas

More than one dam structure can be deposited or written onto the module tape (MT). This would facilitate the winding of more than one coil to make up the antenna module (AM), improving the electromagnetic coupling to the booster antenna in the card body. Additionally, the size of the dam structure (DS) can be tuned to facilitate die or chip module (CM) placement and the wire bonding process after dam structure (DS) formation. This would enable an alternative process flow whereby the dam structure (DS) and/or module antenna (MA) coil winding can be completed prior to die or chip module (CM) placement, bonding and connecting. The use of multiple dam structures (DS) can also facilitate the enclosing of the module antenna (MA) within the cavity formed by two or more dam structures (DSs). The use of a filler or flange within the cavity between two or more dam structures (DSs) and covering over the module antenna (MA) may also be considered. The use of multiple dam structures (DSs) can thus enhance the mechanical stability of the module antenna (MA) and improving the reliability and longevity of the antenna module (AM) device. The concept of multiple dam structures (DS) and dam structures of varying size can be applied to other antenna module systems including, for example, 8-contact modules. Two dam structures (DS-1, DS2) may be disposed, one inside of the other, such as concentric. Or, two or more dam structures may be disposed, each in a unique location on the module tape MT.

Etched Antenna Structure on a Separate Layer

FIGS. 16 and 16A illustrate that the antenna MA may be formed on an antenna substrate AS (or tape layer) which is separate from and substantially the same size as the module substrate MT (or tape layer) and separate from the module substrate MT.

An opening OP in the antenna substrate AS, which may be only slightly larger than the chip CM, may be provided through the antenna substrate AS for accommodating the chip CM (the chip CM may protrude through the opening OP) when the antenna substrate AS is joined (and connected) to the module substrate MT. In FIG. 16, the chip CM and its interconnections are shown in dashed lines.

As best viewed in FIG. 16A, the antenna substrate AS may be and may have bumps on its bottom (as viewed) surface which will be connected with corresponding pads on the top (as viewed) surface of the module substrate MT, such as by using a conductive adhesive. The bumps (which may be pads) are shown as filled circles in FIG. 16.

By avoiding the problem of leaving the area around the chip CM free for interconnects, this area can be used for additional turns (or tracks) of the antenna MA. Some of these additional tracks are shown in dashed lines in FIG. 16.

The antenna substrate AS may be opaque, or dark in color to conceal the underling module substrate MT, chip CM and antenna MA. This may be an important security feature if the module substrate MT is transparent (such as Parlex SMART TAPE® based on Polyethylene terephthalate (PET), Polyethylenimine (PEI) or Polyimide (PI)).

The antenna MA may be formed of wire, embedded in the antenna substrate AS, such as shown in U.S. Pat. No. 6,233,818. Alternatively, the antenna MA may be chemically etched from a metal layer (foil) on the antenna substrate AS.

Alternatively, the antenna MA may be laser etched, which may allow for finer pitch, and more tracks. For example, the antenna may be laser etched (isolation technique) into a copper cladded "seed" layer (face-down side of the pre-preg) having a thickness of 17 μm, using a UV or Green nanosecond or picosecond laser with a distance between tracks dimensionally equal to the width of the laser beam, approximately 25 μm. After the laser etching of the copper seed layer, the antenna substrate AS may further be processed by one or more of sand blasting to remove residual laser ablated particles and to prepare for plating adhesion; depositing carbon to support the through-hole plating of the vertical interconnects; dry film application and photo-masking process; electroless deposition copper (Cu~6 μm) to increase the thickness of the tracks; electroplating of nickel and nickel phosphorous (Ni/NiP~9 μm) or nickel (Ni~9 μm) and palladium/gold or gold/Pd/Au or Au–0.1 μm/0.03 μm or 0.2 μm) to prevent oxidization.

FIG. 17 shows an antenna module AM comprising two layers MT1 and MT2, each layer having an antenna coil MA1 and MA2, respectively. The antenna module may comprise two layers of an insulating material such as PET or copper clad epoxy glass, each having an antenna with approximately 12 turns. The layers may be module tapes, and may each be considered to be an antenna substrate.

A first one of the layers (the bottom layer in the figure) MT1 may be double-sided, having a first antenna structure (or coil) MA1 formed or disposed on one side thereof and a contact interface with contact pads CP on the other side thereof. A second one of the layers (the top layer in the figure) MT2 may have an second antenna structure (or coil) MA2 formed on one side thereof, and an opening for receiving and positioning a chip, which may be a flip chip.

The chip CM may be connected to pads associated with interconnect traces and vias on the first (bottom) layer MT1. The first and second antenna structures MA1, MA2 may be interconnected to form the module antenna MA, such as in series with one another, and may be connected to the chip CM. A resulting dual interface (DIF) module may have six (6) contact pads CP, and may measure approximately 10.8×8.2 mm Laser Etching of Contact Pads (CP)

FIG. 18A illustrates a first step in an exemplary manufacture and assembly of an antenna module (AM) comprising:
 copper foil with gold, nickel or palladium plating,
 module tape (MT) such as conventional "super 35 mm" tape
 Holes may be provided through the tape, for connecting from the opposite side of the tape to the underside of the foil, as described hereinbelow FIG. 18B illustrates a further step in the manufacture and assembly of the antenna module (AM). The foil may be laser etched to have a number (such as six) of contact pads (CP) for a contact interface (ISO-7816). This is the familiar terminal block of contacts seen on the "face-up" side of many bank cards and the like. On the opposite side (underside) of the module tape MT, an RFID chip CM and module antenna MA will be provided.

The contact pads CP and antenna structures AS described herein may be formed using laser etching (isolation technique) of copper cladded "seed" layers on a module tape MT using a UV nanosecond or picosecond laser. A seed layer may have a thickness of approximately 17 μm. For the antenna structures AS, the space between tracks may be dimensionally equal to the width of the laser beam, approximately 30 μm. the tracks themselves may have a width of 30-50 μm. Perforations, such as those described above, may be formed by laser percussion drilling.

After laser etching of the copper seed layer to pattern and/or to perforate the contact pads CP or antenna structure(s) AS, the module tape MT may be further processed as follows:
 sand blasting to remove residual laser ablated particles and to prepare for plating adhesion;
 depositing carbon to support the through-hole plating of the vertical interconnects;
 dry film application and photo-masking process;
 electrodepositing copper (Cu~6 μm) to increase the thickness of the patterned (for CP or AS) seed layer on both sides of the tape;
electroless plating of nickel and nickel phosphorous (Ni/NiP~9 μm) or nickel (Ni~9 μm) and palladium/gold or gold (Pd/Au or Au–0.1 μm/0.03 μm or 0.2 μm) to prevent oxidization.

FIG. 18C shows the face-up side of the module tape MT, and illustrates that a pattern of holes or perforations may be formed in the contact pads CPs. In this example, the pattern of perforations is arranged in concentric circles. This pattern will be visible to the user (of the smartcard SC).

By trimming or perforating the contact pads, less metal is covering the underlying coil of the module antenna. This amount of metal overlying the module antenna may be referred to as "coil coverage". By reducing coil coverage, and conversely increasing coil exposure, the read distance may be increased. The perforations may be of various sizes and may be arranged in a pattern of a logo (such as the logo for Chase Bank or Deutsche Bank).

Double-Sided Module Tapes

FIG. 19A illustrates a double-sided module tape MT having contact pads CPs on one side thereof for the contact interface with an external reader. On the opposite side of the module tape MT, a pattern of conductive traces may be used to effect interconnects, such as of the module antenna MA with the chip CM. With an 8-pad layout, the contact pads CP (C1, C2, C3, C5, and C7) may be connected with the chip CM, and the contact pads (such as "C4" and "C8" in, which are reserved), or additional metallization on the top surface of the module tape MT may be used for interconnect, rather than for contact interface to the external reader. Vias extend through the module tape MT for connecting the chip CM to the appropriate contact pads CP on the face-up side of the module tape MT.

The top metal layer, on the "face up" side may comprise Cu/Ni/Au, having a total thickness of approximately 36 μm. The bottom metal layer (metallization) may comprise Cu/Ni/

Au, having a total thickness of approximately 38 μm, patterned to have areas (bond pads BP) for receiving wire bonds from the chip CM and the module antenna MA.

Such a module tape MT may be referred to as "double-sided", meaning that it has metallization on both the top and bottom surfaces thereof. Conductive vias may be provided through the module tape MT, extending from portions (such as bond pads BP) of the metallization on the bottom surface to corresponding portions (such as contact pads CP) of the metallization on the top surface to establish electrical connections therebetween.

The chip CM may be connected, as illustrated, by wire bonds wb to vias associated with the contact pads CP disposed on the top surface of the module tape MT. Ends (a, b) of the module antenna MA may be connected to interconnect traces in the bottom metallization. The chip CM may also be connected by wire bonds wb to these traces to effect connection of the module antenna MA with the chip CM. For the wire bonds wb, one end of a bond wire may ultrasonically bonded (ball bond) to a chip terminal (CT) or pad on the chip CM, the other end of the bond wire may be ultrasonically bonded (wedge bond) to the bond pad or interconnect trace on the bottom metallization.

The module antenna MA is shown having several turns of wire, such as in a 3×8 configuration (3 layers, each layer having 8 turns), and having two ends (a, b). The ends (a, b) may be thermo compression (TC) bonded to exposed surfaces on the bottom metal layer. The module antenna MA may be attached to the module tape MT with Nitrile (support film 132, FIG. 1C), which may also used to attach the antenna module AM to a card body CB. The Nitrile may cover the module antenna (i.e., the antenna is under the nitrile layer, not above it) and may also be attached to the back side of the module tape MT.

FIG. 19B illustrates an antenna module AM having a double-sided module tape (MT), with openings (rather than vias) through the module tape MT for connecting the chip (via wire bonds) directly (without intervening vias), to the underside of corresponding contact pads CP on the face-up side of the module tape MT, such as using wire bonding techniques.

In FIGS. 19A and 19B, the module antenna MA may be connected to traces in the metal layer LB on the underside of the module tape MT, and selected terminals of the chip CM may be wire bonded to those traces on the bottom metallization LB.

FIG. 19C illustrates an antenna module AM having a double-sided module tape (MT) with vias and openings. The openings in the module tape MT allow for the connection of the ends (a, b) of the module antenna MA to the undersides of contact pads CP (or other areas of top metallization). The bottom metallization BM may be removed from under the module antenna MA since it is not needed for interconnecting the module antenna MA with the chip CM. Conductive vias are provided through the module tape MT for connecting the chip CM to contact pads CP. Here it is shown that rather than wire-bonding the chip CM to the vias (as in FIG. 7A), the chip CM may be flip-chip (ball) bonded to selected traces in the bottom metal layer MB which are associated with those vias. Underfiller may be provided under (on top, as viewed) of the chip CM to support it on and secure it to the module tape MT.

FIG. 19D illustrates exemplary contact pad layout/assignments relevant to FIGS. 19A-19C. The wire ends (a, b) of the module antenna MA may be connected to LA and LB on the underside of the module tape MT.

It may be advantageous to remove metal, such as by laser ablation (or laser percussion drilling) from the contact pads CP of the antenna module AM to improve the electromagnetic coupling (read distance) with a external contact reader (FIG. 1). This removal of metal from the contact pads (CP) can take various forms, such as a providing a plurality of perforations through selected ones of the contact pads, modifying the size of selected ones of the contact pads, or increasing the size of a gap between selected ones of the contact pads CP, or the like. Refer to FIG. 18C.

Single-Sided Module Tapes

FIG. 19E is a cross-sectional view of an antenna module AM having a single-sided module tape MT. Metallization is provided on only the top surface (face-up side) of the module tape MT, and patterned to have contact pads CP in the manner described hereinabove. Openings "h" are provided through the module tape (MT) to accommodate connecting the chip CM to selected ones of the contact pads. The ends (a, b) of the module antenna MA may also be connected to the underside of contact pads (such as C4, C8) so as to ultimately be connected with the chip CM.

FIG. 19F is a cross-sectional view of an antenna module (AM) having a single-sided tape. In this embodiment, plated through holes PTH are provided through the module tape MT. The chip CM and ends (a, b) of the module antenna MA may be bonded to bottom ends of the plated through holes, as illustrated. Generally, the plated through holes PTH serve essentially the same function as the vias previously discussed, for example with respect to FIGS. 19A, 19C.

FIG. 19G illustrates exemplary contact pad layout/assignments for the single-sided tape of FIG. 19E and FIG. 19F. In order to use single sided tape, all connections (wire bonds and antenna wire connections) need to be connected to the backside of the contact pads CP on the face up side of the tape. In the case of the module antenna MA, the wire ends (a, b) of the antenna could be connected to contact pads C4 and C8, as well as the respective wire bonds from the chip CM.

Regarding the embodiments (FIGS. 19B, 19E) described above, showing connecting the chip CM to contact pads CP through openings in the module tape MT, the bond wire for making these wire bonds wb may be 80 μm wire. The openings through the module tape MT may have a cross-dimension (such as diameter) of 2000 μm (2 mm). The openings through the module tape MT for connecting the ends (a, b) of the module antenna MA to the underside of top metallization (FIG. 19C) may similarly have a cross-dimension (such as diameter) of 2000 μm (2 mm).

According to some embodiments (examples) of the invention, a module tape (MT) for a smart card (SC) may comprise: a module tape (MT) having a top surface and a bottom surface; metallization on the top surface, patterned to form at least one of contact pads (CP) for a contact interface (ISO-7816) and at least one connection bridge (CBR); and openings (h) extending through the module tape (MT) from the bottom surface thereof to the top surface thereof for accommodating connecting at least one of a module antenna (MA) and a chip (CM) to the underside of selected ones of the contact pads and connection bridges. In a "single-sided" tape, there may be metallization only on the top surface of the module tape (MT), the bottom surface may not have metallization.

Contact Bridges

US 20130146670 (2013; Grieshofer; "Infineon") discloses a chip card contact array arrangement, comprising: a carrier; a plurality of contact arrays which are arranged on a first side of the carrier; an electrically conductive structure which is arranged on a second side of the carrier, which is arranged opposite the first side of the carrier; a first plated-through hole and a second plated-through hole; wherein the first plated-through hole is coupled to the electrically conductive structure; a connecting structure which is arranged on the first side of the carrier, wherein the connecting structure connects the first plated-through hole to the second plated-through hole; and the connecting structure having a longitudinal extent which runs parallel to a direction in which a contact-connection device on a reading device is moved relative to the plurality of contacts.

FIG. 20 (corresponding with FIG. 3 of Infineon) shows a cross-sectional view of a chip card module, and is discussed in further detail hereinbelow. Generally, the chip card module 300 has a carrier 302 which has a front 316 and back 318. The back 318 holds the turns 306 of the coil, which are arranged concentrically around a region which contains the chip 304. The contact bridge 312 arranged on the front 316 runs from an outer region of the front 316 of the chip card module 300 toward the center or toward an inner region 316 of the chip card module 300. The inner region of the front 316 may be arranged essentially above the region on the back 318 of the chip card module 300 which contains the chip 304. The outer turn 306 of the coil is electrically connected to one end of the contact bridge 312 by means of the first bushing 306. The other end of the contact bridge 312 is connected to the chip 304 by means of the second bushing 310. In addition, a contact array 314 is visible on the front 316 of the chip card contact array arrangement 300.

FIG. 20A (corresponding with FIG. 4B of Infineon) shows an embodiment of a contact array arrangement 420 which may be arranged on the front of the back of the chip card contact array arrangement 400. The contact array arrangement 420 has six separate contact arrays 410, the connection and arrangement thereof being able to be based on ISO/IEC standard 7816-2. The contact bridge 412 is arranged between the second end of the first bushing 404 and the second end of the second bushing 414 and is electrically connected to these. In addition, the contact bridge 412 may be arranged in the direction of sliding, i.e. in the direction which may correspond to the direction in which the chip card, which may hold the chip card contact array arrangement, is pushed or inserted into a reading device. In FIG. 4B, the circumstance described would correspond to a relative movement, which takes place vertically in FIG. 4B. As a result, it is possible to prevent the contact bridge 412 from undergoing mechanical wear along its small dimension, that is to say its width, when the chip card is pushed into a reading device, which can have a positive effect on the life of the contact bridge 412 and hence the operability of the chip card contact array arrangement. In addition, border structures 416 are arranged around the contact arrays 410, some of which are respectively connected to one of the adjoining contact arrays 410.

FIG. 20B (corresponding with FIG. 4C of Infineon) shows the back of the chip card contact array arrangement. The superimposed view clearly reveals that the contact bridge 412 arranged on the front of the chip card module is used in order, in interaction with the first bushing 404 and the second bushing 414, to provide an electrically conductive connection between the end of the outer turn of the turns 402 of the coil and the region 406 which contains the chip (not shown in the figures).

Connection Bridges

FIG. 21 illustrates the concept of providing a connection bridge CBR, generally. Metallization on one side (front; top, as viewed) of the module tape MT may be patterned to have contact pads CP (one shown) and a connection bridge CBR (one shown). For purposes of this discussion, the module tape MT may be single-sided tape having metallization on only one side thereof, as illustrated. The concepts presented herein may also be applicable to double-sided tapes having metallization on both sides thereof.

An RFID chip CM component is provided on the other (back; bottom as viewed) side of the module tape MT. A module antenna MA component is also provided on the other side of the module tape MT (on the same side as the RFID chip CM).

The module antenna MA comprises a wire having two ends a and b, may be wound on a dam structure (DS; or winding core WC), as described hereinabove (compare FIG. 3). Generally, the two ends of the module antenna MA need to be connected with corresponding two terminals LA and LB of the RFID chip.

The dam structure DS may be located on the opposite side of the module tape MT from the connection bridge CBR, and may be aligned under the connection bridge CBR. The dam structure DS (or winding core WC) has an interior portion (to the right, as viewed) and an exterior portion (to the left, as viewed). The module antenna MA is wound on the exterior of the dam structure DS. The RFID chip CM is disposed on the module tape MT in the interior of the dam structure DS.

The connection bridge CBR extends from a first position above the exterior portion of the dam structure DS to a second position above the interior portion of the dam structure DS. A first opening 20 ("h") may be provided through the module tape MT at the first position. A second opening 22 ("h") may be provided through the module tape MT at the second position. A first portion 30 of the connection bridge CBR is disposed over the first opening 20 A second end portion 32 of the connection bridge CBR is disposed over the second opening 22.

A first end a of the module antenna MA may be wire-bonded, through the first opening 20 to the underside of the first portion 30 of the connection bridge CBR, and that a first terminal LA of the RFID chip CM may be wire-bonded, through the second opening 22 to the underside of the second portion 32 of the connection bridge CBR.

The connection bridge CBR provides a conductive path which extends from a position which is exterior to the dam structure DS to a position which is interior to the dam structure DS. This facilitates connecting a component (such as the module antenna MA) which is disposed external to the dam structure DS to a component (such as the RFID chip CM) which is disposed internal to the dam structure DS. The connection bridge CBR serves as an interconnect between an end of the module antenna MA component and a terminal of the RFID chip CM component.

According to an embodiment of the invention, at least one of the contact pads (CP) may be modified to establish at least one connection (including two or more connections) between components on the other, opposite (back) side of the module tape MT, such as the module antenna (MA) component and the RFID chip (CM) component.

As described in some of the following examples, the connection bridge(s) CBR may be formed in various manners, including but not limited to:
 (FIG. 21A) as a part (or portion) of a given connection pad
 (FIG. 21B, 21C) having a portion disposed external to (along an outer edge of) the pattern of connection pads
 (FIG. 21B, 21C) having a portion extending between two adjacent connection pads FIG. 21A shows two connection bridges CBR-1 and CBR-2 formed in what otherwise may have been a connection pad, such as C6 (unassigned, not used). A dam structure DS disposed on the opposite side of the module tape MT is shown in dashed lines. An RFID chip CM disposed on the opposite side of the module tape MT is shown in dashed lines.

The connection bridges CBR-1 and CBR-2 may be formed as tracks, such as two sinusoidal tracks, which may be chemically etched or laser etched out of contact pad C6, with both tracks running along each side of the original contact pad C6. Alternatively, the tracks could run parallel, right and left, with the original contact pad remaining in the center. It may be noted that both connection bridges CBR-1 and CBR-2 are elongated, and extend substantially parallel to the insertion direction (from right to left, as viewed, see arrow)

The connection pad C6 of a single-sided chip carrier tape could be modified to create the two connection bridges for the wire ends of a module antenna to LA and LB of the RFID chip CM.

The connection bridges may be "dog bone" shaped, having wider areas at its two ends for accommodating holes through the module tape (MT). There may be a gap between the connection bridge (area) and the remainder of the contact pad (CP) to electrically isolate the connection bridge from the contact pad (CP).

The two connection bridges CBR-1 and CBR-2 may be formed so as to leave a portion, such as a middle portion of the contact pad C6 intact. Alternatively, the two connection bridges CBR-1 and CBR-2 may subsume (use up) all of the contact pad C6, leaving nothing behind.

It may be noted that the C6 contact pad, which is not used, may be used for connection bridges, or eliminated entirely, or replaced with ferrite. However, if it were removed entirely, this may adversely affect the aesthetics of the module, and may also visibly expose the chip CM and connections behind the module tape MT.

The wire ends of the module antenna can be connected to the interconnection bridges by means of a solder process, laser welding, TC bonding, inner lead bonding or using conductive glue. Alternatively, nanoparticles or nanowires with a low melting temperature could be used to facilitate the physical interconnection between the insulated copper wires of the module antenna and the underside metallization layer. To avoid dents appearing on the face-up side of the contact pads during bonding of the wire ends of the module antenna to the reverse side, the chip carrier tape can be partially heated and supported by a ceramic plate. To reduce the spacing between each bridge and the original contact pad, in this instance C6, the separation line can be laser etched.

Figure 21B:
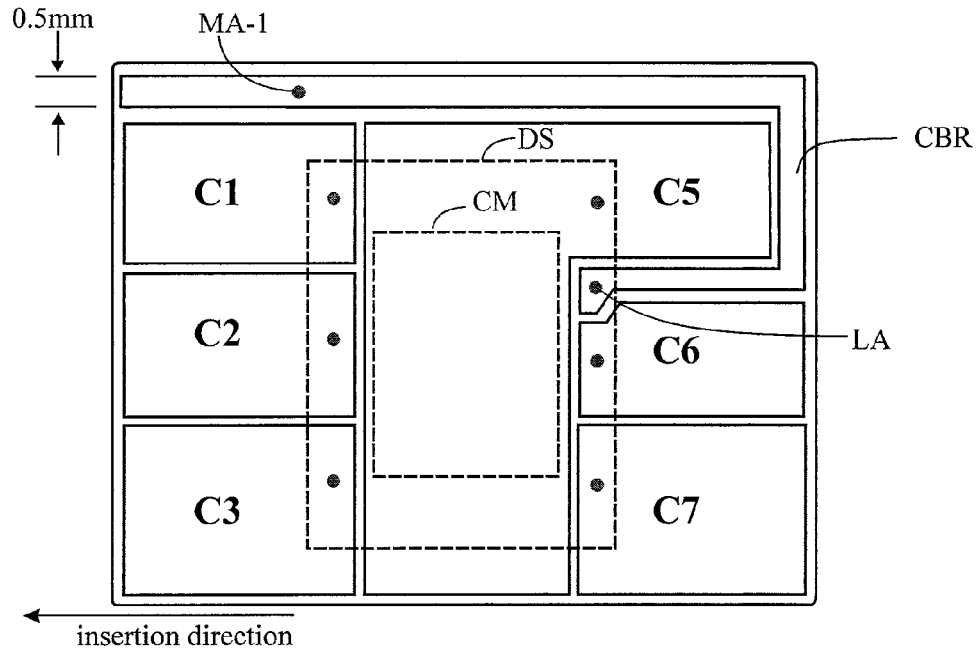

FIG. 21B illustrates a connection bridge CBR extending
  from external to the contact pad pattern (above C1 and C5, as viewed), where is may be connected to an end MA-1 of the module antenna MA (on the opposite side of the module tape MT), which is external to the dam structure (DS)
  around a corner of the contact pad pattern,
  continuing to extend external to the contact pad pattern (to the right of C5, as viewed),
  then heading inward into the contact pad pattern, between adjacent contact pads (C5 and C6, as viewed) so as to be above a position where it may be connected with a terminal (LA) of the RFID chip CM, which is internal to the dam structure (DS).

The portion of the connection bridge CBR heading inward between contact pads C5 and C6 may be formed from the contact pad C6, as described above with respect to FIG. 21A.

It may be noted that the connection bridge CBR is elongated, having a top portion which extends substantially parallel to the insertion direction (from right to left, as viewed, see arrow), a middle portion which extends substantially perpendicular to the insertion direction (from top to bottom, as viewed), and a bottom portion which extends substantially parallel to the insertion direction.

Figure 21C:
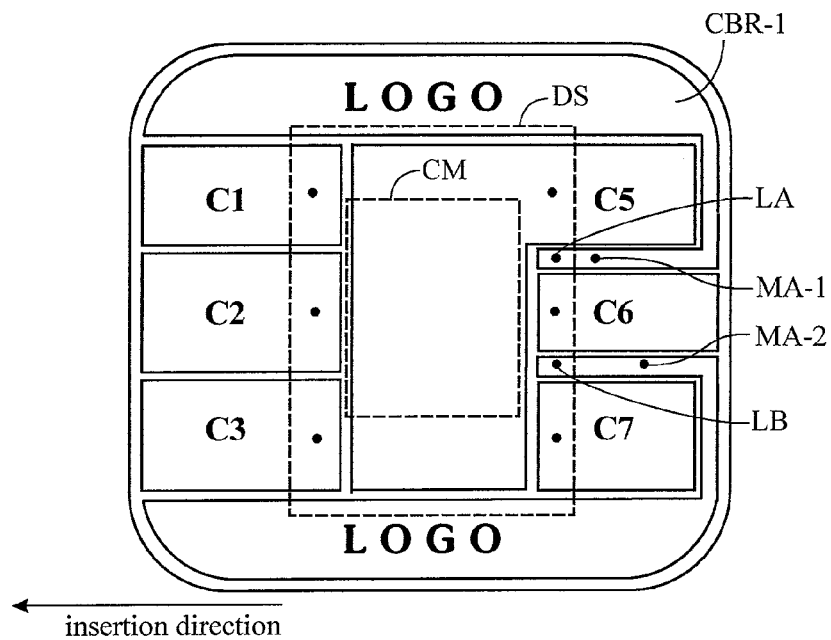

FIG. 21C illustrates a contact pad pattern having additional conductive areas disposed outside of (above and below, as viewed) the pattern of contact pads C1-C6. This arrangement is similar to the arrangement shown in FIG. 21B, but has two connection bridges rather than one.

A first connection bridge CBR-1 is elongated, having a top portion which extends substantially parallel to the insertion direction (from right to left, as viewed, see arrow), a middle portion which extends substantially perpendicular to the insertion direction (from top to bottom, as viewed), and a bottom portion which extends substantially parallel to the insertion direction.

A second connection bridge CBR-2 is elongated, having a bottom portion which extends substantially parallel to the insertion direction (from right to left, as viewed, see arrow), a middle portion which extends substantially perpendicular to the insertion direction (from top to bottom, as viewed), and a top portion which extends substantially parallel to the insertion direction.

Figure 21D:
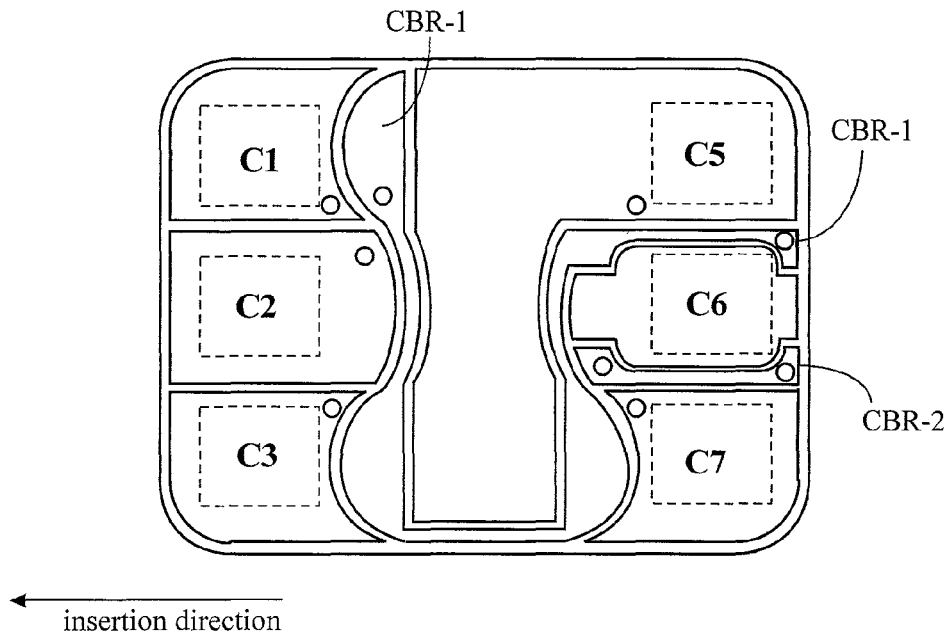

FIG. 21D illustrates another configuration of contact pads (CP), with connection bridges (CBR). For clarity, the location of the required contact pads as per ISO/IEC 7816-2 are illustrated in dashed lines.

A first connection bridge CBR-1 is shown extending adjacent the C1, C2 and C3 contact pads perpendicular the card insertion direction, then extending parallel the insertion direction along the bottom of the module and up adjacent to the C7 and C6 contact pads. CBR-1 then extends between C5 and C6 parallel the insertion direction and terminates at the right hand side of the module as illustrated. A large proportion of the area typically reserved for the C5 "L-shaped" contact pad can be used for the connection bridge CBR-1.

A second connection bridge CBR-2 is shown extending parallel the card insertion direction between C6 and C7 contact pads. Also shown open circles are potential hole positions in the module tape MT that can be used to make electrical connections to the chip CM or antenna module MA via wire bonds or other methods.

FIG. 21D thus shows a given layout that could use the CBRs for making connections between the LA and LB terminals on the chip CM and the antenna module AM. The shape and location of the CBRs shown in FIG. 21D are purely illustrative and can be altered to improve the wear properties and robustness of the connection bridges CBRs.

Figure 21E:
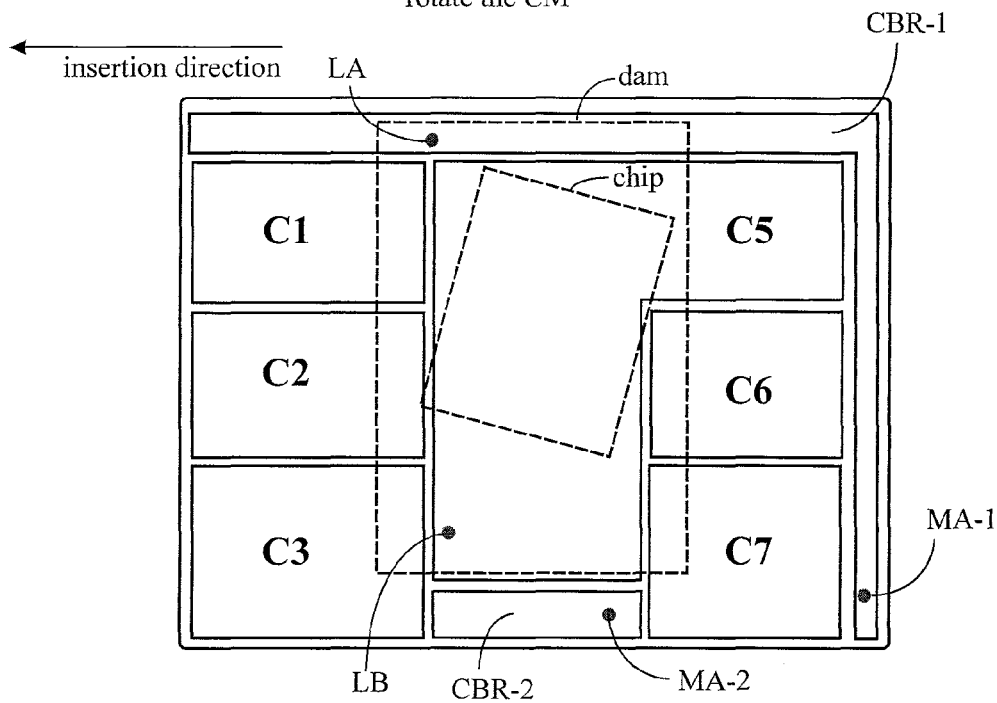

FIG. 21E illustrates that the chip CM may be rotated (turned slightly, such as approximately) 30° to facilitate wire bond connections to the relevant contact pad. Wire bonding is limited to a particular maximum loop length. The rotation can shorten the distance from a given chip bond pad to module tape connection pad.

A first connection bridge CBR-1 extends above (as viewed in the figure) the contact pads C1 and C5, and to the right (as viewed) of contact pads C5, C6, C7. The first connection bridge CBR-1 may provide a connection between a pad (not shown, on the underside of the module tape MT) within the dam structure DS, for antenna connection LA on the chip CM and a pad (not shown, also on the underside of the module tape MT) for a first end MA-1 of the module antenna MA.

A second connection bridge CBR-2 may be formed at the bottom (as viewed in the figure) of (or as a bottom portion of) the contact pad C5. The second connection bridge CBR-2 may provide a connection between a pad (not shown, on the underside of the module tape MT) within the dam structure DS, for antenna connection LB on the chip CM and a pad (not shown, also on the underside of the module tape MT) for a second end MA-2 of the module antenna MA.

FIGS. 21, 21A, 21B, 21C, 21D, 21E have shown various embodiments of contact pad sides of a module tape MT, such as a single-sided tape (but could also be a double-sided tape) wherein the foil for the contact pads CPs has been etched (or otherwise processed) to have one or more electrical connection bridges. The figures have shown relevant portions of a module tape MT with a chip CM mounted on the underside (back side) and contact pads CP disposed on the top (front) side. A module antenna MA may be wire wound on a dam structure DS (or winding core WC), as disclosed herein. The two wire ends a and b of the module antenna MA may be connected through openings 20, 22 in the module tape MT to the back side(s) of one or more connection bridges CBR. The relevant terminals LA and LB of the chip CM may also be connected to the connection bridges CBR.

Some Contrasts with Infineon (US 20130146670)

Some contrasts may be drawn between at least some of the connection bridge(s) disclosed herein (FIGS. 21, 21A-21E) and the contact bridge (312) shown in US 20130146670 (Infineon), among which are that:

the module tape MT disclosed herein may be a single-sided tape. Infineon's tape (302) is double-sided tape, using an etched module antenna (306)

Infineon relies upon plated through holes (vias) to effect connections between one side of the carrier (module tape)

the module antenna MA disclosed herein may be a wire-wound coil having two wire ends. The ends are wire-bonded to the backside of the connection bridges (or contact pads) through holes 20, 22 extending through the module tape MT. No vias are required, and the module tape MT may be a single-sided tape.

the winding core WC (e.g.) of the module antenna MA may additionally function as a dam for encapsulating the chip CM and its connections. The chip CM may be flip-chip mounted or wire bonded, and some of the chip's contacts may be wire bonded to the undersides of the appropriate contact pads.

Infineon's contact bridge (412) is arranged centrally in a free space between two contact arrays (410). The connection bridges (CBR) disclosed herein may have various other alignments, including extending around the exterior of the contact pad array and subsuming significant portions of a given contact pad, such as (but not limited to C6). The connection bridges (CBR) disclosed herein may also (alternatively or additionally) extend through the central area of the module typically used by the C5 contact pad.

the elongates contact bridges CBR disclosed herein may extend other than parallel to the insertion direction, including substantially perpendicular to the insertion direction. Infineon discusses "the connecting structure having a longitudinal extent which runs parallel to a direction in which a contact-connection device on a reading device is moved relative to the plurality of contacts" (Abstract) Also, "This can minimize the risk of appropriate contacts on the reading device sliding over the contact bridge 506 transversely with respect to the longitudinal extent thereof and causing material removal at right angles to the longitudinal extent of the contact bridge 506, that is to say along the width, which may be in the form of the more delicate dimension." (paragraph [0045]).

According to some embodiments (examples) of the invention, a dual interface antenna module (AM) may comprise: a chip carrier tape (MT); a contact pad array (CP) which is arrange on the face-up side of the chip carrier tape; and a module antenna (MA) which is arranged and mounted on the face-down side of the chip carrier tape; an RFID chip (CM) which is bonded to the chip carrier tape; and may be characterized in that: the chip carrier tape is a single-sided tape with only one side having a metallization layer; and at least one connection bridge (CBR) on the face-up side of the chip carrier tape being characterized by one or more of: (FIG. 21A) the connection bridge comprising a portion of a given connection pad; (FIG. 21B, 21C) the connection bridge has a portion disposed external to, along an outer edge of the pattern of connection pads; and (FIG. 21B, 21C) the connection bridge has a portion extending between two adjacent connection pads. The conductive layer on only one side of the tape may be patterned to have contact pads (CP) for interfacing with a contact reader in a contact mode (ISO 7816-2); and at least one of the contact pads (CP) may be patterned to serve as a connection bridge (CBR) for at least one component on an opposite side of the module tape (MT). At least one hole or opening (h, 20, 22) may extend through the module tape (MT) to a backside of the connection bridge.

According to some embodiments (examples) of the invention, a method of connecting at least one component of a dual interface (DI) antenna module (AM) to another component thereof, may comprise: providing at least one hole or opening (h, 20, 22) through a module tape (MT) so that a portion of the underside of a contact pad (CP) is exposed; and connecting the component to the underside of the contact pad. The at least one component may comprise an RFID chip (CM) or a module antenna (MA). The components may be wire bonded, through the at least one hole to the underside of the at least one hole contact pads. The at least one contact pad may be patterned to have at least one connection bridge. A selected one of the contact pads (CP) may be patterned to have two connection bridges.

According to some embodiments (examples) of the invention, a method of connecting a module antenna (MA) with a chip (CM), may comprise: providing metallization on a first (front) side of a module tape (MT), wherein the metallization comprises at least a pattern of contact pads (CP); disposing the chip (CM) on a second (back) side of the module tape (MT); and disposing the module antenna (MA) on the second side of the module tape (MT); wherein the metallization further comprises at least one connection bridge (CBR), and the chip module (CM) is connected to the connection bridge; and connecting an end of the module antenna (MA) though an opening in the module tape (MT) to the at least one connection bridges; and may be characterized by one or more of: at least a portion of the at least one connection bridge extends around an exterior of at least one of the contact pads; at least a portion of the at least one connection bridge is formed from a portion of at least one of the contact pads; and at least a portion of the at least one connection bridge extends between adjacent connection pads.

Ferrite and Metal Layers in the Card Body (CB)

U.S. Ser. No. 12/545,825 filed Aug. 22, 2009 (US 20090315320, Dec. 24, 2009) discloses secure inlays for secure documents such as a passport comprising an inlay substrate may have laser ablated recesses within which a chip module is installed. Channels for an antenna wire may be formed in a surface of the substrate. Instead of using wire, the channels may be filled with a flowable, conductive material. Patches homogenous with the substrate layer may be used to protect and seal the chip and interconnection area. The inlay substrate may include two layers, and the antenna wire may be between the two layers. A moisture-curing polyurethane hot melt adhesive may be used to laminate a cover layer and the additional inlay substrate layers. The adhesive layer may include metal nanoscale powder and ink for electro-magnetic shielding. Additional security elements may include material that is optically changeable by an electro-magnetic field. Ferrite-containing layers may be incorporated in the inlay substrate.

FIG. 22 illustrates a secure document which may be an inlay 2200 suitable for use as a passport cover. The inlay 2200 comprises a multiple-layer inlay substrate 2208 and a cover layer 2204 cold laminated (adhesively attached, joined) to the inlay substrate 2208 with a layer 2214 of adhesive such as 50 µm, which may be applied by roller coater. It should be understood that at least some of the techniques disclosed herein may also be applicable to smart cards having a card body rather than an inlay substrate. Both smart cards and passport covers may have multiple layers, laminated together, recesses, and the like, as described herein.

The cover layer 2204 is generally a planar sheet or layer of flexible, durable, often "textile-type" material, such as PVC, coated offset board, with or without optical bleacher or acrylic coated cotton. The inlay substrate 2208 (both layers 2208a and 2208b) is generally a planar layer or sheet of flexible, durable, typically "plastic-type" material, such as Teslin™, PVC, Polycarbonate (PC), polyethylene (PE) PET (doped PE), PETE (derivative of PE), and the like. The material of the inlay substrate may be referred to as "synthetic paper". The inlay substrate, or a bottom layer thereof (particularly when the antenna is embedded on a top surface of the top layer), can also be conductive, such as a ferrite-coated or ferrite-containing substrate to reflect or absorb electromagnetic energy. This is indicated by the particles (dots) in the bottom inlay substrate layer 2208b.

A hinge gap 2206 is shown, and may simply be a gap, approximately 1 mm wide, between a left (as viewed) portion of the inlay substrate 2208 and a right (as viewed) portion of the inlay substrate 2208. The left portion of the inlay 2200 corresponds to the front of the passport cover, and the right portion of the inlay 2200 corresponds to the back portion of the passport cover. The hinge gap 2206 may not completely separate the back portion of the inlay substrate from the front portion, they may still be joined by a "web". Typically, the gap is punched or cut after adhesive coating and pre-press lamination (to smooth the surface)

The cover layer 2204 is generally a planar sheet or layer of flexible, durable, often "textile-type" material, such as PVC, coated offset board, with or without optical bleacher or acrylic coated cotton.

The inlay substrate 2208 (both layers 2208a and 2208b) is generally a planar layer or sheet of flexible, durable, typically "plastic-type" material, such as Teslin™, PVC, Polycarbonate (PC), polyethylene (PE) PET (doped PE), PETE (derivative of PE), and the like. The material of the inlay substrate may be referred to as "synthetic paper".

The inlay substrate 2208, or a bottom layer thereof (particularly when the antenna is embedded on a top surface of the top layer), can also be conductive, such as a ferrite-coated or ferrite-containing substrate to reflect or absorb electromagnetic energy. This is indicated by the particles (dots) in the bottom inlay substrate layer 2208b.

An antenna wire 2220 may be mounted to a top surface of the inlay substrate 2208, and an RFID chip (CM) 2210 may be disposed in a recess 2216 extending into the inlay substrate 2208 from a top surface thereof. The antenna wire 2220 may comprise 4 or 5 turns of wire, such as approximately 80 µm diameter (thick) wire. Ends of the antenna wire 2220 are connected to terminals of the chip (CM) 2210.

The recess 2216 may be a window-type recess extending completely through the inlay substrate 2208 to the bottom surface thereof. of the inlay substrate.

The chip (CM) 2210 may be a leadframe-type chip module comprising a chip mounted on a leadframe 2218 and encapsulated by a mold mass (MM) 2212. The leadframe 2218 may be approximately 80 µm thick and 8 mm wide. The mold mass 2212 may be approximately 240 µm thick and 5 mm wide. The chip (CM) 2210 may have an overall size (width dimensions) of 5.1×8.1 mm and an overall thickness of 320 µm. The width of the recess 2216 should be sufficient to accommodate the chip module (including leadframe 2218), with some clearance.

The inlay substrate 2208 may comprise two or more layers 2208a and 2208b which are laminated (adhesively attached, joined) one another with a layer (or layers) 2209 of adhesive such as 50-80 µm, which may be applied by a roller coater. In the main hereinafter, a two-layer example of an inlay substrate 2208 will be described, comprising an upper (topmost) layer 2208a and a lower (bottommost) layer 2208b.

The recess 2216 for the chip module 2210 extends into the inlay substrate 2208 from the top surface of the topmost layer 2208a, through the topmost layer 2208a, and at least partially into the bottommost layer 2208b. The recess 2216 extends fully through the entire inlay substrate 208, including fully through the bottommost layer 2208a, exiting the inlay substrate 2208 at the bottom of the bottommost layer 2208b.

The recess 2216 may be "stepped" so that it has a larger width dimension opening at the top surface of the inlay substrate 2208 than at the bottom surface of the inlay substrate 2208. For example, a top portion of the recess 2216, for accommodating the leadframe 2218 may measure 5.3 mm×8.1 mm, and a bottom portion of the recess 2216 for accommodating the mold mass 2212 may measure 5.1 mm×5.1 mm. The stepped recess 2216 may be formed by a first opening having a first width dimension in the topmost layer 2208a, second opening having a second width dimension in the next adjacent (which is the bottommost) layer 2208b. When the layers 2208a and 2208b are assembled with one another, the openings in the layers 2208a and 2208b are aligned (such as concentric) with one another. The first width dimension is different than the second width dimension. The first width dimension, for accommodating the leadframe, is shown greater than the second width dimension, for accommodating the mold mass (MM) 2212.

The openings of the recess 2216 in the layers 2208a and 2208b may be any appropriate shape, such as rectangular for a rectangular chip module or circular for a circular (round) chip module (CM). The openings may be formed by a mechanical punch operation. The chip module 2210 may be disposed in the recess 2216 in such a way that the leadframe 2218 is nearly flush with the upper surface of the top substrate layer 2208a and the mold mass of the chip module is nearly flush with a bottom side of the bottom substrate layer 2208b. However, note that the end portions of the antenna wire 2220 are connected (bonded) to the top surface of the leadframe 2218 (opposite the chip and mold mass which are on the bottom surface of the leadframe 2218. Also note that the diameter of the antenna wire 2220 is decreased where it is bonded to the leadframe 2218. For example, the 80 µm wire may be compressed to approximately 40 µm during thermocompression bonding. The antenna wire 2220 may be embedded (disposed) in a top surface of the topmost substrate layer 2208a, and is connected with a top surface of the leadframe 2218.

In the finished inlay substrate 2208, which may be considered an "interim product", all of the components (chip CM 2210 and antenna 2220) mounted in or to the inlay substrate 2208 should not project beyond the surface of the inlay substrate 2208.

According to some embodiments (examples) of the invention, a card body (CB) for a smart card (SC, 2200) may comprise at least two layers of a synthetic material and a recess extending through a top of the two layers and at least into a bottom of the two layers; and may be characterized by at least one of: a metallized layer (2202); a compensating loop (CL) having a gap; a compensating loop (CL) without a gap; metal foil (MF); metal foil (MF) having an opening at a location of an antenna module (AM); and ferrite (FE) in the card body. The recess may extend through the bottom layer. An antenna module (AM) may be disposed in the recess. An antenna wire may be disposed between the at least two layers, or on a top surface of the top layer. Ferrite particles may be disposed in the bottom layer.

According to some embodiments (examples) of the invention, a method of making a secure document comprising an inlay substrate may comprise: providing the inlay substrate as at least two layers of a synthetic material, such as Teslin™, laminated to one another with a layer of adhesive; and providing a recess for a chip module in the substrate; and may be characterized by at least one of: providing a metallized layer (2202); providing a compensating loop (CL) having a gap; providing a compensating loop (CL) without a gap; providing a metal foil (MF); providing a metal foil (MF) having an opening at a location of an antenna module (AM); and providing a ferrite element (FE) in the card body. The recess may extend through a top of the two layers and at least into a bottom of the two layers. Ferrite particles may be disposed in at least one of the layers. An antenna wire may be disposed on one of the layers or between the at least two layers.

Metallized Surfaces

Some smartcards, including dual interface (DI) smartcards, have a metal (or metallized) top layer, or "face plate", substantially the size of the card body. Having a metal layer is technically disingenuous in that a it may significantly reduce coupling between the card and an external contactless reader. Nevertheless, the feature may be important for vanity purposes.

An exemplary stackup of layers for a metallized card may comprise the following layers. The layers are numbered for reference purposes only, not to indicate a particular sequence. The sequence may be as indicated, or the layers may be rearranged. Some layers may be omitted. Some layers may be applicable to either non-metallized smartcards or metallized smartcards. Some of the layers may comprise more than one layer. Some layers may be combined with other layers.

| | |
|---|---|
| Layer 1 | printed sheet, overlay anti-scratch, etc |
| Layer 2 | separate metal layer or metallized foil |
| Layer 3 | booster antenna BA with coupler coil CC |
| Layer 4 | card body CB |
| Layer 5 | compensation frame (back side of card body) on metallized or non-metallized |
| Layer 6 | printed sheet, underlay anti-scratch, magnetic stripe, etc |

An RFID chip (CM) may be disposed in a window "W" (opening) extending into the smartcard, from the front (Layer 1), through the metallized foil (Layer 2) and into the card body (Layer 4). The chip (CM) may have contact pads (CP) on its front surface for interfacing with an external contact reader. The chip (CM) may be a dual interface (DI) antenna module (AM) having a module antenna (MA) for interfacing, via the booster antenna (BA) with coupler coil (CC), with an external contactless reader. The antenna module (AM) may fit within the inner area of the coupler coil (CC).

FIG. 22A is a partial diagrammatic perspective view of a smart card with metallization showing an exemplary stackup (sequence of layers) for a metallized smart card 200, having the following layers, structures and components. Exemplary dimensions may be presented. All dimensions are approximate. Thickness refers to vertical dimension in the figure.

A top layer 2202 may be a metal (or metallized) layer 2202, such as 250 μm thick stainless steel, and may be referred to as a "face plate". Compare "Layer 1". This top layer 202 may be as large as the overall smart card, such as approximately 50 mm×80 mm.

A layer 2203 of adhesive, such as 40 μm thick of polyurethane

A layer 2204 of ferrite material, such as 60 μm thick sheet of soft (flexible) ferrite A layer 2205 of adhesive, such as 40 μm thick of polyurethane A layer 2208 of plastic material, such as 50-100 μm thick PVC, which may function as a spacer (separating layers and components below from those above)

A layer 2210 of plastic material, such as 150-200 μm thick PVC, which may function as the card body (CB). Compare "Layer 4".

Wire 2212, such as 112 μm diameter wire, forming the booster antenna (BA) with coupler coil (CC). Only one wire cross-section is shown, for illustrative clarity.

A layer 2214 of plastic material, such as 150 μm thick PVC, which may include printing, magnetic stripe, etc.

A layer 2216 of plastic material, such as 50 μm thick PVC, which may serve as an overlay The overall thickness of the smart card 200 (layers 2202, 2203, 2204, 2208, 2210, 2214, 2216) may be approximately 810 μm (0.81 mm).

A window opening 2220 ("W") may extend into the smart card from the face plate 202, through intervening layers, into the card body layer 2210. A dual interface (DI) antenna module (AM), with module antenna (MA) may be disposed in the window opening 2220. The window opening may extend completely through the layer, in which case the antenna module (AM) would be supported by the underlying layer.

The coupler coil (CC) of the booster antenna (BA) may surround the window opening 2220 so as to be closely coupled with the module antenna (MA) of the antenna module (AM). Alternatively, the coupler coil (CC) may be disposed in the card body (CB) so as to be underneath the module antenna (MA) of the antenna module (AM).

The antenna module (AM) may measure approximately 12×13 mm (and approximately 0.6 mm thick). The window opening 2220 ("W") in the face plate 2202 may be approximately the same size as the antenna module (AM)—i.e., approximately 12×13 mm. In this "baseline" configuration, the chip activation distance may be approximately 15 mm. (Chip activation distance is similar to read distance, and represents the maximum distance at which the chip module may be activated (for reading) by an external reader. As a general proposition, more is better, 15 mm is not very good, 20 mm or 25 mm would be better. The chip activation distance in a metallized smart card is handicapped by attenuation of the electromagnetic field associated with the booster antenna attributable to the metallic face plate 202 (Layer 1).

The window opening 2220 in the face plate 2202 may be made to be significantly larger than the antenna module (AM) so as to offset shielding and enhance coupling, thereby increasing the activation distance.

The ferrite layer 2204 may also improve coupling by reducing attenuation of coupling by the face plate 2202, helping to concentrate the electromagnetic field between the booster antenna BA and the module antenna MA of the antenna module AM. It may be desirable that the ferrite layer 2204 be as close as possible to the underside of the face plate 2202. Rather than having a separate ferrite layer 2204 (and adhesive layer 2203), ferrite particles or powder may be mixed with an adhesive and sprayed or coated onto the underside of the face plate 202, thereby eliminating the intervening adhesive layer 203. Alternatively, rather than being in the form of a separate layer 2204, the ferrite material may be particles (including nanoparticles) of ferrite embedded in an underlying layer, such as the spacer layer 2208 or the card body layer 2210 (in some configurations, the spacer layer 2208 may be omitted).

The spacer layer 2208 may also improve coupling by reducing attenuation of coupling by the face plate 2202, simply by keeping the face plate 2202 as far away as practical (within the confines of the form factor for smart cards) from the booster antenna 2212.

Note in FIG. 22A that the antenna module AM goes through an opening in one layer 2208 and thereafter at least partially into an underlying layer 2210, such as in the manner described with respect to FIG. 22.

A coupling loop (CL) (or "compensating loop", or "compensation frame", or variants thereof) may be disposed between some of the layers, for example between the card body layer 2210 and the underlying print layer 2214.

Compensating Loops in the Card Body (CB)

FIG. 22B shows that a conductive "compensating loop" CL may be disposed in a layer, such as behind the booster antenna BA (Layer 3), extending around the periphery of the card body CB. The compensating loop CL may be an open loop having two free ends, and a gap ("gap") therebetween, and is discontinuous. The compensation loop CL may be made of copper cladding, can be printed on a support layer, etc. FIG. 22C shows that the compensating loop CL may be "closed", having no gap and no free ends, or a continuous ring of material.

The compensating loop CL may comprise ferrite material, and may be referred to as a "frame". The compensating loop CL on the reverse side of the booster antenna BA (away from the antenna module AM) may help with the stabilization of the resonance frequency. The compensating loop CL may be used in addition to the booster antenna BA. The booster antenna BA may be embedded into one side of an inlay substrate while the compensation frame may be inkjet printed or adhesively attached to the opposite side of the inlay substrate. The compensation loop CL can be mounted using a subtractive (etching away of material) or additive (depositing material) process.

Metal Foil Layer(s)

Metal foils, metallic coatings, segments of metal foil or metal particles may be deposited on or embedded in the inlay (or card body CB) to alter the electrical characteristics of the RFID device or smartcard. A metal foil layer in the card body construction may helps to meet the ISO and EMV communication standards for RFID devices or smart cards in terms of read write distance, baud rate, Q-factor bandwidth, etc. The metal foil can be any pure metal such as aluminum or copper or an alloy. The metal foils, metallic coatings, segments of metal foil or metal particles should have a thickness less than the skin depth of the metal or material being used in order to prevent the formation of eddy currents in the metal or metallic structure that will attenuate the RF electromagnetic field. The use of thicknesses substantially less than the skin depth of the metal or material being used will increase the electrical resistance of the structure to alternating current flows (impedance) thereby preventing unwanted or excessive attenuation of the RF electromagnetic field. Other electrical conductors such as metal nanoparticles, metal nanowires or carbon-based conductors like graphite or exfoliated graphite can be used to construct electrically conductive networks that are hereby included under the definition of a metal foil or metallic structure.

The booster antenna (BA) is normally constructed from a track of wire embedded in an inlay substrate (or card body CB) comprising one or more layers of a material such as Polyvinyl Chloride (PVC), Polycarbonate (PC), Polyethylene (PE), Poly(ethylene terephthalate) (PET), Polyetherurethane, PET-G (Polyethylene Terephalate Glycol-modified), Polyester Copolymer film, Teslin™, paper, synthetic paper and the like. Alternatively, the booster antenna (BA) can be formed on the inlay substrate by chemically or laser etching a metal coating previously deposited on the substrate. A particular design of booster antenna (BA) with coupler coil (CC), having a certain geometry and number of coil windings, will exhibit specific electrical characteristics in terms of resonance frequency and impedance.

The metallic/metallized foil in the card stackup may exhibit "capacitive coupling" with the booster antenna (BA) to broaden the bandwidth of the Gaussian curve to include the side bands and to reduce the concentration of the electromagnetic flux at the position of the coupler coil CC (i.e. to avoid overpowering the RFID chip). This may improve the communication of signals carried between the RFID device (secure document or smartcard) and the reader on the sub-carrier frequencies (the sub-carrier frequencies is typically +/−848 kHz at 12.712 MHz and 14.408 MHz for a device operating at 13.56 MHz, as per ISO/IES 14443-2).

The metal foil or metallic structure can advantageously alter (such as lower) the quality factor (Q) of the booster antenna (BA). The metal foil or metallic structure can also have a capacitive effect in the circuit. The presence of the metal foil or metallic structure in the card design can alter the electrical power delivered to the IC chip (CM). Some or all of these effects may enhance the performance of the RFID device or smartcard, improving the coupling between the antenna module AM and the coupler coil CC of the booster antenna BA. The communication between the RFID device or smartcard and the reader can thus be improved.

The metal foil MF together with the booster antenna BA generates capacitance in the resonant circuit which may result in a broadening of the resonance curve and which may improve signal communication on the sub-carrier frequencies, typically at 12.712 MHz and 14.408 MHz (i.e. +/−848 kHz for a device operating at 13.56 MHz).

A metal foil, metal coating or metal particles can be implemented in the RFID device or smartcard in a number of ways as described hereunder. A very thin continuous metal foil can be deposited directly on top of the booster inlay (card body CB), behind the booster inlay or within the booster inlay structure. The metal foil can be supported on a plastic substrate, such as Poly(ethylene terephthalate) (PET), before being incorporated into the booster antenna structure.

FIG. 22D-G shows methods of applying conductive material in the card body CB, which may reduce the Quality factor (Q) of the coupler coil CC to include sidebands and improve coupling between the coupler coil CC and the module antenna MA.

FIG. 22D illustrates a booster antenna (BA) placed on a transparent PVC substrate that has been laminated to a second PVC layer bearing a metal foil coating. The metal foil may have a thickness typically of the order of tens of nanometers (for example 15 nm). The thickness of the metal foil dictates the effect on the electrical properties of the RFID device or smartcard. The metal foil can deposited anywhere within the body of the card and may have a size matching the full area of the card body CB, or only a portion thereof. The foil can also be used to overlap only the booster antenna or parts of the booster antenna. Multiple areas of foils can be deposited within the card body to alter the performance effect. Additionally, multiple layers of foils can be deposited within a card body. The metal foil can be disposed on the PCV substrate without the intermediary of the second PVC layer.

As an alternative to a continuous metal foil, a perforated (or otherwise segmented or discontinuous) metal foil can be used. The perforations may allow the electromagnetic flux from the RFID reader to substantially penetrate the card body (CB). The perforated foil can be deposited anywhere within the card body, as described above. The thickness of a perforated foil may be greater than the thin continuous foils described above—for example, greater than 15 nm. (A continuous metal foil may have a thickness less than 15 nm.)

As an alternative to a continuous metal foil, a metal mesh can be used. The mesh can be deposited anywhere within the card body as described above. The metal mesh can also be constructed of a porous network Metal particles of various sizes and shapes (including spheres and flakes) can be deposited on the surface of the booster antenna (BA) or an additional inlay layer within the card body. The metal particles can be formed a range of materials including metal alloys and can be deposited within the material used to form the inlay or other layers within the card body. The metal particles can also be derived from a conventional metallic finish on the surface of the card.

The metal foil MF or metallic structure can cover the full area of the RFID device or smartcard as illustrated in FIG. 22D or can partially cover the area leaving selectively exposed regions.

Figure 22E:
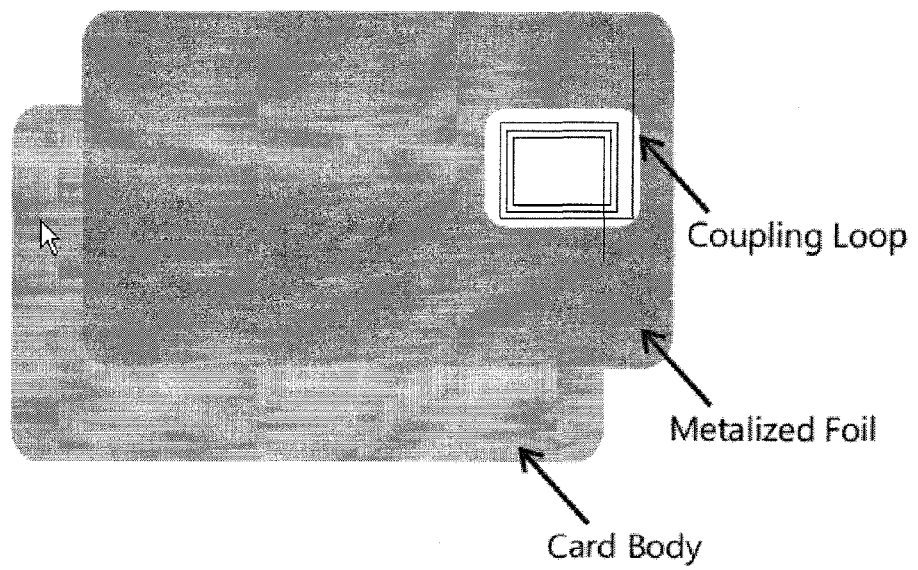

FIG. 22E illustrates an embodiment of the invention where the area of the coupling coil (or coupling loop) is left free of the metal foil. The metal foil MF or metallic structure partially covers the smartcard area, leaving exposed metal-free region at the coupling loop of the booster antenna (BA). This may substantially reduce (or prevent) attenuation of the inductive coupling between the coupler coil CC and the module antenna MA (not shown). This is illustrative of a metal foil or metallic structure partially covering the smartcard area, leaving an exposed metal-free region at the location of the coupling coil CC of the booster antenna (BA). The recess of (opening in) the metallized foil MF at the location of the chip module (underneath the coupling loop) may help to reduce the quality (Q) of the booster antenna without having destructive effects on the coupling between the booster antenna BA and the antenna module AM.

Figure 22F:
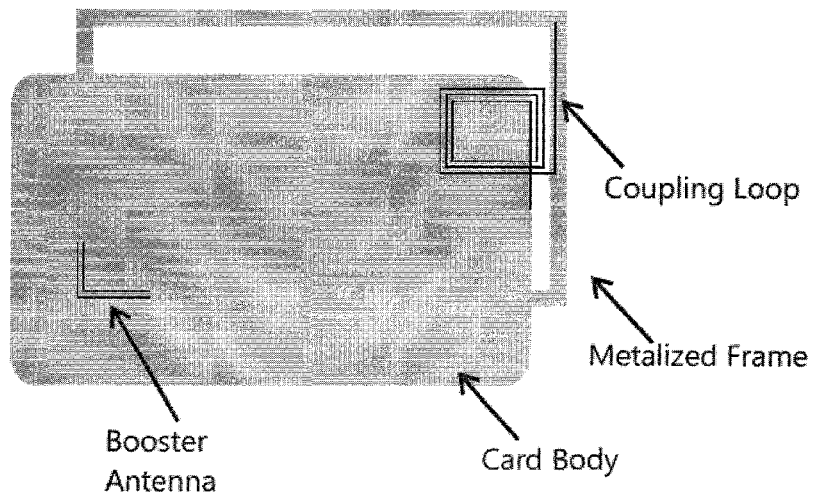

FIG. 22F illustrates a continuous metal loop or loop of a metallic structure is disposed on top of or below the booster antenna BA, and may cover part of the booster antenna BA. Compare FIG. 22C.

Figure 22G:
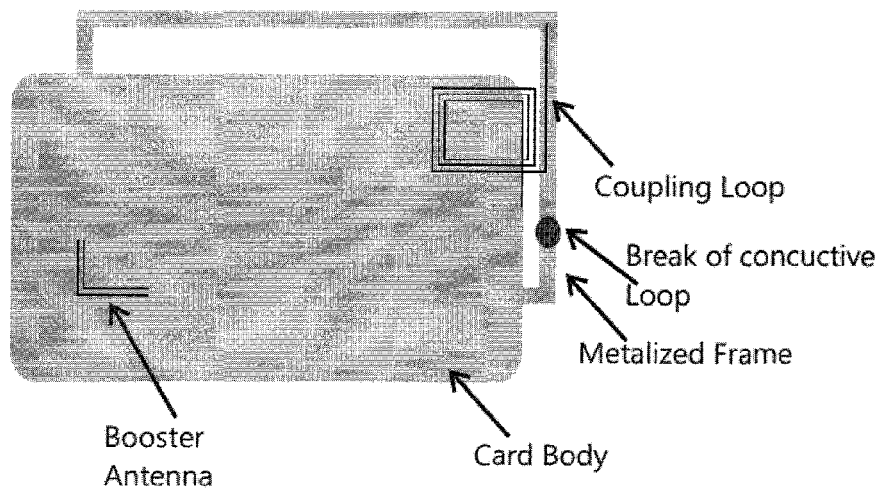

FIG. 22G illustrates a discontinuous (broken) metal loop or loop of a metallic structure is placed on top of or below the booster antenna, and may cover part of the booster antenna BA. In this case, the ends of the open loop may be left open or connected to a resistive load. Alternatively, a resistor can be formed by narrowing a section of the metal loop or metallic structure in order to locally reduce the cross sectional area of the loop.

The metal foils may comprise a conductive material (such as aluminum on PVC), having a sheet resistance which is very low, on the order of only a few Ohms, which normally should block the electromagnetic field (such as between the booster antenna BA and an external reader, or between the booster antenna BA and the antenna module AM), but a mitigating factor may be the thickness of the aluminum (or other material), being thin enough to allow the electromagnetic field to pass through.

Metal foils or substrate materials having metallized coatings may be used in the production of the booster antenna (BA) for RFID devices or smartcards. The metal can be any pure metal such as aluminum or copper or an alloy. Other electrical conductors such as metal nanoparticles, metal nanowires or carbon-based conductors like graphite or exfoliated graphite may also be used.

The booster antenna (BA) is normally constructed from a track of wire embedded in an inlay substrate comprising one or more layers of a material such as Polyvinyl Chloride (PVC), Polycarbonate (PC), Polyethylene (PE), Poly(ethylene terephthalate) (PET), Polyetherurethane, PET-G (Polyethylene Terephalate Glycol-modified), Polyester Copolymer film, Teslin™, paper, synthetic paper and the like. Alternatively the booster antenna (BA) can be formed on the inlay substrate by chemically or laser etching a metal coating previously deposited on the substrate. A particular design of booster antenna (BA) with coupler coil (CC), having a certain geometry and number of coil windings, will exhibit specific electrical characteristics in terms of say resonance frequency and impedance. Metal foils, metallic coatings, segments of metal foil or metal particles may be deposited on or embedded in the inlay substrate or card body to alter the electrical characteristics of the RFID device or smartcard.

The effect of the metal or metallic structures can be to dampen the booster antenna (BA) resulting in a widening of the resonance curve of the booster antenna (BA) and lowering the quality factor (Q). The metal or metallic structure can also have a capacitive effect in the circuit.

These effects can enhance the performance of the RFID device or smartcard. The communication between the RFID device or smartcard and the reader can thus be improved.

The metal foil, metal coating or metal particles can be implemented in the device in a number of ways, for example, but not limited to:

(a) A very thin metal continuous metal foil can be deposited on the booster inlay or within the booster inlay. The metal can thin (less than 10 micron in thickness for example) or extremely thin (or the order of nanometers). The metal foil can deposited anywhere within the body of the card and may have size matching the full area of the card of part of the card. The foil can also be used to overlap only the booster antenna or parts of the booster antenna.

(b) A perforated metal foil can be used. The perforations allow the electromagnetic flux from the RFID reader to largely penetrate the card. The perforated foil can be deposited anywhere within the card as described in 1 above.

(c) A metal mesh can be used. The mesh can be deposited anywhere within the card as described in (a).

Metal particles of various sizes and shapes (including spheres and flakes) can be deposited on the surface of the booster antenna (BA) or an additional inlay within the card body. The metal particles can be formed a range of materials including metal alloys and can be deposited within the material used to form the inlay or other layers within the card body. The metal particles can also be derived from a conventional metallic finish on the surface of the card.

According to some embodiments (examples) of the invention, a card body (CB) for a smart card (SC) may comprise: a metal foil (MF) layer incorporated into the card body (CB); and may be characterized in that: the metal foil (MF) comprises a material selected from the group consisting of pure metals, alloys, aluminum, copper, metal nanoparticles, metal nanowires, carbon-based conductors, graphite, and exfoliated graphite; and the metal foil may be characterized by one or more of: the metal foil comprises a very thin continuous layer deposited on the card body (CB); the metal foil has a size matching an area of the card body (CB), or only a portion thereof; the metal foil overlaps only the booster antenna (BA) or portions or components of the booster antenna; the metal foil comprises multiple areas of foils which are deposited on or in the card body (CB); the metal foil is perforated, segmented or discontinuous; the metal foil is continuous, and has a thickness less than 15 nm; the metal foil is discontinuous, and has a thickness greater than 15 nm; the metal foil comprises a mesh; the metal foil comprises metal particles of various sizes and shapes; the metal foil partially covers the smartcard area, leaving exposed metal-free region at a coupling coil (CC) of the booster antenna (BA); the metal foil reduces the quality (Q) of the booster antenna without having destructive effects on the coupling between the booster antenna (BA) and the antenna module (AM); the metal foil comprises (FIG. 22F) a continuous loop; the metal foil comprises (FIG. 22G) a discontinuous loop; the metal foil comprises a resistor formed by narrowing a section of a metal loop; and the metal foil comprises a conductive material having a sheet resistance on the order of only a few Ohms. The metal foil may be characterized by at least one of: the metal foil is continuous, and has a thickness of less than 10 μm; the metal foil is perforated; the metal foil comprises a mesh; and the metal foil comprises metal particles.

on the Use of Ferrite, Generally

Ferrite layers may be laminated together, and in combination with a copper compensating loop CL on the reverse side of a booster antenna BA may stabilize the resonance frequency of the booster antenna BA. The track may be broken (have a gap) at some position.

Lamination and temperature may be used to sinter ferrite particles together to be a continuous path. Laminating ferrite particles under temperature and very high pressure to produce a thin card material film such as PC PVC PETG to produce a ferrite inlay with antenna. The inlay may consist of several layers of ferrite. The applied temperature and pressure may cause the particles to sinter and form an insulating layer of ferrite.

Depositing ferrite nanoparticles or powder onto an inlay substrate to bend the magnetic flux lines and to compensate for the effect of shielding caused by metallization of the printed layer(s) in a smart card body or any metal layer in close proximity to an RFID antenna in card body; and forming a pre-laminated inlay with a booster antenna or transponder with one or several underlying layers of ferrite which have been laminated together with the RFID components to form a composite inlay layer Ferrite nanoparticles or powder can be applied to a substrate layer by means of wet or dry spraying. In the case of wet spraying the ferrite is suspended in a liquid phase dispersion which is prepared through sonication of the particles in a solvent or aqueous/surfactant liquid. The particles may also have a steric wrap to support the suspension of the particles in the liquid. The mean crystal particle size of the ferrite spheres can be determined by filtering and by the degree of sonication over time. (Sonication is the act of applying sound, usually ultrasound energy to agitate particles in a sample.)

The sintering of the nano-sized ferrite particles occurs during hot lamination of the synthetic layers which make up the inlay. The lamination process includes heating and cooling under high pressure. Several layers of ferrite coated substrates or foils can be used to enhance the ferromagnetic properties. Unlike bulk ferrite granules, nanoparticles have a much lower sintering temperature, matching the glass transition temperature of the synthetic substrate. Additional heat treatment after lamination may be required.

Ferrite in the Antenna Module (AM)

Ferrite material may be incorporated in the antenna module (AM) such as between the contact pads (CP) and the module antenna (MA).

FIG. 23A illustrates an exemplary dual interface (DIF) smartcard SC wherein a DIF chip module (CM) 148 is mounted to an interconnection substrate (MT) 2342 having contact pads (CP) 2344 for a contact interface on one surface (top, as shown) thereof. A coil antenna (MA) 2352 is provided for contactless mode, and is connected to the chip module CM via the substrate MT. The module antenna MA is typically on an opposite side (bottom, as shown) of the chip module CM than the contact pads CP. Together, the substrate MT, chip module CM, contact pads CP and coil antenna MA (and ferrite element 2356, described below) may be referred to as "Antenna Module" (AM).

The Antenna Module (AM) is mounted to a card body (CB) 2360 having a card antenna (CA) 2362. In the contactless mode, the module antenna (MA) 2352 interacts with the card antenna (CA) 2362 which, in turn interacts with the antenna (not shown) of an external reader (not shown). Some particulars may include . . . .

- the antenna module and module antenna are relatively small, such as 10 mm×10 mm
- the card body and card antenna are relatively large, such as 50 mm×80 mm
- the module antenna may be substantially directly over a portion of the card antenna (as shown in the figure), the remainder of the card antenna may be distant from the chip module and module antenna.
- the card antenna may be made with conductive tracks or the like, in other words other than by embedding wire, which is the simplest "conventional" technique.

The contact pads CP on the top side of the DIF module are metallic, and therefore may attenuate RF signals passing between the module antenna MA and the card antenna CA. In order to alleviate the attenuation, and to enhance coupling between the module antenna and the card antenna (and ultimately between the chip module and an external reader), a ferrite element (FE) 156 may be disposed (interposed, inserted) between the chip module and the module antenna—or, in other words, between the contact pads (CP) 2344 and the module antenna (MA) 2352.

The ferrite element FE may cover an area which is at least 50% of the area defined by the chip and antenna, or by the contact pads and represents a passive magnetic element that may increase electromagnetic coupling between the module antenna MA and the card antenna CA, providing for example at least a +3 dB increase in signal strength (for signals passing between the module antenna MA and the card antenna CA, in either direction) and a consequent increase in the effective distance between the smartcard 140 and an external contactless card reader (FIG. 1), for example increasing read/write (and energy harvesting) capability from approximately 3-5 cm to approximately 6-10 cm.

The ferrite element 2356 may be a separate layer of material, such from TDK or Kitagawa (see http://www.kitagawa.de/index.php?id=8&L=1). The ferrite element 2356 may be sprayed onto the bottom surface of the chip module prior to installing the module antenna. The ferrite element 156 may be continuous (or contiguous, except for openings permitting connecting the antenna module through the ferrite element to the chip module), or may be discontinuous (for example, a grid or screen). As illustrated, an opening 2358 in the ferrite element/layer 2356 may be provided for the chip module CM to be mounted to the substrate 2342. The ferrite element 2356 may have a smooth surface, or may be rippled, or formed with a pattern of "corner reflectors" for enhancing coupling between the module antenna MA and the card antenna CA. The ferrite element 2356 may comprise nanostructures such as nanoparticles, nanowires or nanotubes. The ferrite (or other) element 2356 may be located other than between the module antenna MA and the chip module CM (contact pads CP), so long as the desired effect is achieved. Materials other than ferrite may be used for the "ferrite element". Any material, such as materials with high electromagnetic permeability, increasing the coupling (efficiency of energy transfer) between the module antenna MA and the card antenna CA may be substituted for ferrite.

The antenna module AM may be implanted in a card body CB which may comprise a die attached and wire bonded to an epoxy glass tape and the connections encapsulated by a dam filled with a transparent UV-casting compound (epoxy resin) having a thickness above the tape of approximately 400 µm. The shape of the "Dam & Fill" area protecting the silicon die is round, having approximately a diameter of 6 mm. A ferrite element FE is mounted over the surface of the dam and surrounding area to act as a shield against the attenuation of the electromagnetic field. The wire module antenna MA is mounted onto the ferrite layer and the wire ends are connected by means of thermo compression bonding to the terminal areas on the epoxy glass tape.

In an alternative construction, the antenna module AM may comprise a chip CM having its own antenna (such as in U.S. Pat. No. 6,373,447), either directly coupled with the card antenna CA (without a module antenna MA) or coupled with the module antenna (AM) which is coupled with the card antenna.

FIG. 23B shows a DI smartcard formed using the antenna module of FIG. 23A, on a card body (CB) having a card antenna (CA).

Channels can be formed in a substrate such as the card body CB for accepting a wire (or conductive material) laid therein. (for example, U.S. Pat. No. 7,028,910—Schlumberger). A recess can be formed for accepting the antenna module AM. Channels and recesses can be formed in a substrate using laser ablation.

FIGS. 23C, 23D illustrate a module tape MT. Foil on this underside of the module tape MT may be patterned to have interconnects and bond pads (BP). The chip CM may be mounted to the underside of the module tape MT and connected such as with wire bonds to selected ones of the bond pads. Conductive vias may be formed through the module tape MT to connect the chip CM to the contact pads (CP) on the face-up top side of the module tape MT. A module antenna MA may be mounted to the underside of the module tape MT with its ends (a, b) connected to bond pads (BP), thereby connecting the module antenna MA with the chip CM. Globtop GT (a conformal coating of resin) may be applied to protect the chip CM and its wire bonds, the module antenna MA acting as a dam for the glob-top. Alternatively, the module antenna MA can be mounted onto the mold mass (globtop) of the antenna module AM as a flat antenna structure. Any of the module antenna MA techniques described above may be used. A ferrite layer FL may be provided, with holes for interconnects (such as wire bonds to the chip CM) to be made therethrough. FIG. 23C illustrates (right side only) that an opening may be provided through the ferrite layer FL to accommodate the chip CM.

"Flyer" Coil Winding

US 20130062419 discloses techniques for flyer winding of coils which may serve as module antennas MAs of antenna modules AMs, and represents one of various suitable coil winding techniques that may be used to form the module antennas MAs.

FIG. 24 illustrates a plurality (approximately fifteen) of module antennas MA, such as the type shown in FIG. 6B (ends extending outward from WC) being wound on winding cores WC, on a 35 mm chip carrier tape (module tape MT). The winding cores WC may be disposed in two rows, two winding cores WC conveniently fitting side-by-side across the width of the 35 mm carrier tape. The 35 mm chip carrier tape may advance along a stage, stopping to have a number (such as two) of modules antennas MA wound at a time. A plurality (such as fifteen) of pairs of retractable "fixation" pins extend from the stage, adjacent the 35 mm carrier tape, on both sides thereof, each pair of pins being associated with each of the (fifteen) winding cores WC. A lesser number (fewer), such as two, of nozzles may be provided for supplying and winding the wire for the module antenna MA around a like number (such as two) of wire cores WC.

Generally, to form a given module antenna MA, the nozzle may first wrap a first end of the wire around a first of the pair of pins, securing (anchoring, "fixing") the first end of the wire to the first pin. The nozzle then moves towards the winding core WC, a first end portion of the wire extending (passing) over (across) a first of two bond pads BP on the module tape MT. Then the nozzle "flies" (orbits) around the winding core WC, a number (such as twenty) of times, winding the wire around the winding core WC—hence, the nomenclature "flyer" winding technique. After completing the designated number (such as twenty) of turns, the nozzle heads away from the winding core WC, a second end portion of the wire passing over a second of the two bond pads for the module antenna MA, to secure (tie off) the second end of the wire on the second of the pair of pins. Then the end portions of the wire passing over the two bond pads BP for the module antenna MA may be bonded to the respective bond pads.

It may be convenient to first form a plurality of module antennas MA, before bonding the end portions of the module antennas BP. Note in the figure that several/(six) module antennas MA have already been formed, with their two end portions extending over bond pads BP and tied off to a corresponding pairs of pins. Then, in a subsequent step, the end portions of the module antennas MA can be bonded (such as using a thermode) to the respective bond pads BP. After completing formation of the module antennas MA, residual portions (between the bond pads BP and associated pins) of the ends of the wire may be cut, the pins retracted, and "waste" wire removed such a with a suction system.

The formation of the module antenna MAs and bonding of their end portions to respective bond pads BP may be performed prior to inserting the chip CM onto module tape MT. By completing these steps before wire bonding of the chip CM (see, for example, FIG. 4D), the wire bonds to the chip CM will not disturbed during bonding of the ends of the module antenna MA.

The flyer winding technique illustrated in FIG. 24 is suitable for winding a module antenna MA on the dam structure DS of FIG. 3, as well as on the winding core WC of FIG. 4. Other techniques, such as radial winding, may also be suitable.

The following patent relating to flyer winding are incorporated by reference herein:

U.S. Pat. No. 5,261,615 (1993, Gustafson); U.S. Pat. No. 5,393,001 (1995, Gustafson); U.S. Pat. No. 5,572,410 (1996, Gustafson); U.S. Pat. No. 5,606,488 (1997, Gustafson); U.S. Pat. No. 5,649,352 (1997, Gustafson)

FIG. 24A shows some additional detail and/or variation(s) on the technique described above. A row of four antenna modules (AMs) being formed are shown disposed along one side of a 35 mm carrier tape. A plurality of tubular, open-ended support structures (WC, DS) have been placed at a corresponding plurality of sites for forming a corresponding plurality of antenna modules AMs. A plurality of retractable fixation pins for the wire ends are integrated into the shuttle (stage). A pair of these pins (labeled #a, #b) is located adjacent the carrier tape at each corresponding site for an antenna module. An exemplary method of forming a sequence of module antennas MAs at sites for antenna modules AMs may comprise some or all of the following steps, in generally (but not limited to) the following sequence . . . .

The wire may be clamped by a clamping mechanism.

The wire may then be guided by the nozzle past a first pin 1a of a first pair (1a, 1b) of retractable fixation pins associated with a first (shown at the right) of the antenna modules AMs.

The winding nozzle (or "coil winding nozzle" CWN) may be controlled by an x-y-z servo system (not shown)

The wire may then be guided past a first opening in the shuttle to a first of the winding cores WC associated with the first antenna module AM The openings in the shuttle may facilitate disconnection of the wire during bonding (occurs later)

The nozzle then moves (orbits) around the winding core WC, forming a predetermined number (such as 20) of turns of wire for the module antenna MA The nozzle is then guided outwards, past the edge of the 35 mm carrier tape, passing over a second opening in the shuttle, to the second 1b of the first pair of retractable pins associated with the first antenna module Then, rather than tying the wire off on the second pin 1b, the nozzle guides the wire partially (such as approximately 90 degrees) around the second pin 1b towards a first pin 2a of a next pair of pins (2a, 2b) associated with a next (second from the right) of the antenna modules. This partial wrap of the wire may be sufficient to anchor (secure) the wire to the pin 2a.

Then, the nozzle guides the wire around the pin 2a towards the wire core of the second (from the right) antenna module, passing over another opening in the shuttle.

The nozzle then moves (orbits) around the second winding core WC, forming a predetermined number (such as 20) of turns of wire for the module antenna MA.

The above steps (nozzle guided outward over an opening in the shuttle to a second pin of a pair of retractable pins, to a first pin of a next pair of retractile pins, wrapping partially around (securing the wire) and being guided inward over an opening in the shuttle to a next winding core, etc.) continues until a last winding core has been wound with a module antenna MA. Then the wire can be tied off (by the nozzle) around the second pin (4b) of the last pair of retractable pins (4a, 4b).

In FIG. 24A, the nozzle is shown exiting the third (from the right) winding core, headed towards the second of the pair of pins 3a, 3b associated with that antenna module site.

The end portions of the wire passing over respective bond pads BP may then be bonded, as described above with respect to FIG. 2C.

In a last step, the wire can be cut, pins retracted, and residual wire removed.

Another "Flyer Winding" Technique

According to an embodiment of the invention, a plurality (sequence) of antenna modules AMs (or sites for antenna modules) are provided, one after the other, on a continuous tape (such as 35 mm). Two antenna connection pads (ACPs) are provided per module (or site), and these two pads may be on the same side of the antenna module AM, external to the winding core WC (compare FIG. 6B, above). This orientation of the antenna connection pads ACPs (or BPs) facilitates flyer coil winding, as described in greater detail hereinbelow, without the need for pins as were shown in FIGS. 24, 24A. Generally, the coil winding nozzle (CWN) may place a continuous track of wire across the modules (or sites for modules) with start and end stretches (segments, portions) of coil wire placed over the bond pads (BP, ACP). The coil winding nozzle moves from one module (or module site) to the next after each module antenna (MA) is formed. The antenna connection pads ACPs (or BPs) may be shorted out during processing, such as for electroplating, for example using traces or clips extending between which may later be removed.

FIG. 25 is a plan view of a technique for forming module antennas (MAs), such as flyer coil winding of a module antenna (MA) around a winding core support structure (WCSS) using a coil winding nozzle (CWN), according to an embodiment of the invention. One row of antenna modules (or, sites/locations on a module tape for antenna modules) is shown.

Generally, to form a given module antenna (MA), the coil winding nozzle (CWN) may first wrap an end of the coil wire around an external pin, securing (anchoring, "fixing") the end of the coil wire to the external pin. By movement of the chip carrier tape (MT) (or the coil winding nozzle (CWN) or both), the coil winding nozzle (CWN) is positioned towards a dam structure (DS) of the first site in a row of module sites, an end portion of the coil wire extending (passing) over (across) a first of two antenna connection pads ACP, or bond pads BP on the module tape (MT).

Then, the coil winding nozzle (CWN) "flies" (orbits) around the dam structure (DS), a number (such as fifteen) of times, winding the wire around the dam structure (DS) of the first module position—hence, the nomenclature "flyer" winding technique. After completing the designated number (such as fifteen) of turns, the coil winding nozzle (CWN) heads away from the dam structure (DS) of the first module position, a second end portion of the coil wire passing over a second of the two bond pads ACP (BP) for the module antenna (MA). The coil winding nozzle (CWN) then proceeds towards the next dam structure (DS) of the second module site by the incremental movement of the tape (or movement of the coil winding nozzle (CWN) or both). The dots on the antenna connection pads ACPs indicate that the wire may be bonded to the ACPs, such as after a number (plurality, sequence) of module antennas MAs are wound.

The dashed line (in FIG. 25) shows the path of the coil winding nozzle (CWN), from left-to-right (as viewed), sequentially forming coils for module antennas at a sequence of module sites (from left-to-right, as viewed). The sites have dam structures (DS) or winding cores (WC) or other support structures (SS) in place, around which the coils for the module antennas may be wound, and the chip (CM) may or may not be installed yet.

The end portions of the coil wire pass over the two antenna connection pads ACP, or bond pads BP for the first module antenna (MA) and may be bonded to the respective antenna connection pad ACP or bond pad BP at a later stage in the process. By a further incremental movement of the tape (or movement of the coil winding nozzle (CWN) or both), the coil wire may be drawn over the a first antenna connection pad ACP or bond pad BP of a next (second) antenna module (site), and after winding the coil wire around the dam structure (DS) of the second antenna module, the coil wire may be drawn over a second antenna connection pad ACP or bond pad BP of the second antenna module site. This process may be repeated for each antenna module (site) in a row: upon completion of a module antenna (MA), the coil wire may be drawn from one position (site) in a row to the next position by the step movement of the tape. In addition, the coil wire may be drawn and placed over the antenna connection pad ACP or bond pad BP positions on the module tape, for later interconnecting of the wire ends (WE) of each module antenna (MA) to the module tape (MT). After interconnecting the wire ends (WE) of each module antenna (MA), the remaining wires spanning across one position to the next position may be cut and removed using a suction system.

FIG. 25A illustrates a single antenna module (or site for an antenna module). Note that the antenna connection pads ACPs, which are located at the bottom left (as viewed) and bottom right (as viewed) corners of the site for the antenna module, may extend above (as viewed) and below (as viewed) the bottom edge (as viewed) of the dam structure (DS). The antenna connection pads (ACPs), for electrical connection of the chip (CM) to the module antenna (MA), may comprise two approximately rectangular 3.5 mm×1 mm terminals at the upper and lower left corners of dam structure DS (or SS, or WC). It may be noted that the wire for the module antenna coil may cross over itself in the process of winding each coil, therefore the wire for the coil of the module antenna may be insulated wire, and may be self-bonding wire.

The module tape (MT) may be designed such that the antenna connection pads (ACPs) are aligned along axes parallel the tape edges. The two antenna connection pads (ACP) for a given module antenna (MA) may both be disposed on one side edge of the antenna module (AM)—which, for a row of antenna modules (AM) may also be along one edge of the module tape (MT). Conventionally, the antenna connection pads (ACP) would be located on opposite sides of the antenna module (AM), but with the six contact module there is not sufficient space to do this. The two antenna connection pads (ACP) may be disposed on the same side (rather than opposite sides) thereof.

A continuous length of wire may form the module antennas (MAs) for all of the antenna modules (AMs) in a given row of sites on the module tape (MT). (There may be one row of sites across the top half of the tape, and a second row of sites across the bottom half of the tape.) This continuity of coil windings can extend across an indefinite series of antenna modules (AMs) on the module tape (MT). This is facilitated by the linear alignment of the antenna connection pads (ACPs) along axes parallel the tape edges. The wire overlaps the antenna contact pads (ACPs), ready for thermo-compression (or equivalent) bonding and excess wire trimming. In the case of support structures (SS) employing a lid (LD) or cover plate (CP; e.g., FIGS. 11, 11A), the lid or cover plate may either be left in place or removed after winding the coil of the module antenna (MA). If a tool (PT; e.g., FIG. 11C) were used, the tool may be removed after coil winding.

In summary, coils for module antennas (MAs) may be wound upon support structures (SS, DS, WC) on a module tape (MT), each support structure associated with a given antenna module (AM), and progressing (moving, going) from one antenna module site to another (subsequent support structure/antenna module site) on the module tape, with all the coils remaining attached (by the wire) until the antenna modules (AMs) are separated (singulated from one another).

Remote Coil Winding

In the flyer winding techniques described above, the coil for the module antenna MA is wound, in situ, on a support structure (SS, DS, WC) on the module tape MT.

FIG. 26 illustrates a machine and a technique for coil winding. Generally, a coil for a module antenna (MAs) is wound on a coil winding form CWF, then the coil is transferred to the module tape MT at sites for antenna modules (AM). This may be done without support structures (SS, or dam structures DS, or winding cores WS). The resulting coils (module antennas MA) may be "air-core" coils. Self-bonding wire may be used, and the coil winding forms CWFs may be heated (or heat applied externally) to bind the turns of a coil together. Glue may be dispensed at sites for antenna modules to secure the coils (MA) to the module tape MT.

A plurality of coil winding forms (CWFs) may be arranged in sequence on a conveying mechanism, such as a wheel W (as illustrated), and presented sequentially to a remotely-located coil winding mechanism CWM (having a winding head) that winds coils on the coil winding forms CWFs. This may be in a manner similar to the in situ coil winding techniques described above, but is performed "remote" from the module tape MT.

Eight (8) coil winding forms CWF, labeled "1"-"8" are shown on wheel which can be rotated (angularly incremented) to present each of the coil winding forms, sequentially, to the coil winding mechanism which is located above the wheel (as illustrated). After completing winding of a coil on given coil winding form, the wheel W may be rotated, such as 45° to present the next CWF to the CWM. The module antennas MAs thus produced (remotely), are linked to each other by wire, rather than being separated from each other. Also, a MA thus produced remains supported by the respective CWF upon which it is wound, until the moment before it is transferred to the module tape MT.

In the figure, CWFs #1, #2, #3, #4 have already had coils for module antennas MAs wound upon them, CWF #5 is having a coil for a module antenna MA wound upon it, and CWFs #6, #7, #8 are queued up to have coils for modules MAs wound upon them. Note that the wheel W is positioned so that CWF #1 is directly above a given antenna module AM (or, more aptly, a site on a module tape MT for an antenna module) that is ready to receive a coil for module antenna MA. Five antenna module sites 1, 2, 3, 4, 5 are illustrated on a linear conveyor to be positioned under the a given CWF (in this illustration, CWF #1) that has had a coil for a module antenna MA wound upon it. With the wheel and the conveyor thus positioned, the module antenna MA on the relevant CWF (CWF #1) is ready to be transferred to the AM. Transfer of the coil from the coil winding form CWF to the module tape MT may be achieved by retracting the coil winding form CWF, thereby releasing the coil (MA), or by another means suitable for ejecting the coils. It can be noted that the several coils (MA) may remain connected with one another (by a wire) after being transferred to the module tape MT, thereafter to be separated (or singulated) from one another.

As was shown above (FIG. 24), the module antennas MAs may remain interconnected with one another during the process of manufacturing several antenna modules AMs, later to be singulated (separated) from one another.

According to some embodiments (examples) of the invention, a method of winding coils for antenna modules (AM) may comprise: providing a plurality of coil winding forms (CWFs); winding coils for module antennas (MAs) on the coil winding forms; and transferring the module antennas to positions on a module tape (MT) corresponding to antenna modules. The coil winding forms may be disposed on a wheel, and a position of the wheel may be incremented to present the coil winding forms sequentially to a coil winding mechanism. The coils may remain interconnected with one another during the process of manufacturing several antenna modules AMs, later to be singulated from one another.

While the invention(s) has/have been described with respect to a limited number of embodiments, these should not be construed as limitations on the scope of the invention(s), but rather as examples of some of the embodiments. Those skilled in the art may envision other possible variations, modifications, and implementations that are also within the scope of the invention(s), and claims, based on the disclosure(s) set forth herein.

What is claimed is:

1. A module tape (MT) for an RFID antenna module (AM) comprising:
    a substrate (MT); and
    a support structure (SS, DS, WC) disposed on a surface of the substrate and comprising a tubular body portion (B) having two opposite open ends, one of which is disposed against the surface of the substrate, the other of which is a free end;
    characterized by:
    a planar element (LD, CP, PT) selected from the group consisting of a flange (F), a lid (LD, CP) and a tool (PT) disposed upon the free end of the support structure for constraining winding of the module antenna (MA) on the support structure;
    wherein:
    the planar element is in the form of a disc or ring having an outer diameter which is greater than an outer diameter of the tubular body portion (B).

2. The module tape of claim 1, wherein:
    at least one of the planar element and the tubular body portion comprise ferrite.

3. A method of making an antenna module (AM) interim product comprising:
    providing a module tape (MT); and
    providing support structure (SS, DS, WC) having a tubular body portion (B) on a surface of the module tape, the tubular body portion having an end on the surface of the module tape and a free end;
    characterized by:
    disposing a planar element (LD, CP, PT) against the free end of the body portion;
    wherein the planar element is in the form of a ring, and further comprising:
    with the planar element (LD, CP, PT) in place on the tubular body portion (B), filling an interior area of the body portion (B) with encapsulant (GT).

4. The method of claim 3, wherein:
    the support structure (SS, DS, WC) is formed on the module tape (MT) by an additive process.

* * * * *